US010926452B2

(12) United States Patent
Patterson et al.

(10) Patent No.: US 10,926,452 B2
(45) Date of Patent: Feb. 23, 2021

(54) DOUBLE-SIDED IMPRINTING

(71) Applicant: Magic Leap, Inc., Plantation, FL (US)

(72) Inventors: Roy Patterson, Hutto, TX (US); Charles Scott Carden, Austin, TX (US); Satish Sadam, Round Rock, TX (US); Ryan Christiansen, Austin, TX (US); Matthew S. Shafran, Fletcher, NC (US); Christopher John Fleckenstein, Round Rock, TX (US); Vikramjit Singh, Pflugerville, TX (US); Michael Nevin Miller, Austin, TX (US); Kang Luo, Austin, TX (US)

(73) Assignee: Magic Leap, Inc., Plantation, FL (US)

( * ) Notice: Subject to any disclaimer, the term of this patent is extended or adjusted under 35 U.S.C. 154(b) by 204 days.

(21) Appl. No.: 15/990,155

(22) Filed: May 25, 2018

(65) Prior Publication Data

US 2018/0339437 A1 Nov. 29, 2018

Related U.S. Application Data

(60) Provisional application No. 62/511,172, filed on May 25, 2017.

(51) Int. Cl.
*B29C 59/04* (2006.01)
*B29C 43/22* (2006.01)
(Continued)

(52) U.S. Cl.
CPC ............ *B29C 59/04* (2013.01); *B29C 43/222* (2013.01); *B29C 43/28* (2013.01); *B29C 43/305* (2013.01);
(Continued)

(58) Field of Classification Search
None
See application file for complete search history.

(56) References Cited

U.S. PATENT DOCUMENTS 3,563,827 A * 2/1971 Zylinski .................. B32B 27/00 156/209
3,738,895 A * 6/1973 Paymal .................. B29C 44/30 156/443
(Continued)

FOREIGN PATENT DOCUMENTS

JP 2017030160 2/2017

OTHER PUBLICATIONS

Masahiko Ogino et al Fabrication of 200-nm Dot Pattern on 15-m-Long Polymer Sheet Using Sheet Nanoimprint Method (2013). Jpn. J. Appl. Phys. 52 035201. Retrieved online Apr. 22, 2020 https://iopscience.iop.org/article/10.7567/JJAP.52.035201/pdf. (Year: 2013).*

(Continued)

*Primary Examiner* — Joseph S Del Sole
*Assistant Examiner* — Manley L Cummins, IV
(74) *Attorney, Agent, or Firm* — Fish & Richardson P.C.

(57) ABSTRACT

Systems, apparatus, and methods for double-sided imprinting are provided. An example system includes first rollers for moving a first web including a first template having a first imprinting feature, second rollers for moving a second web including a second template having a second imprinting feature, dispensers for dispensing resist, a locating system for locating reference marks on the first and second webs for aligning the first and second templates, a light source for curing the resist, such that a cured first resist has a first imprinted feature corresponding to the first imprinting feature on one side of the substrate and a cured second resist has a second imprinted feature corresponding to the second imprinting feature on the other side of the substrate, and a (Continued)

moving system for feeding in the substrate between the first and second templates and unloading the double-imprinted substrate from the first and second webs.

25 Claims, 38 Drawing Sheets

(51) Int. Cl.

| | |
|---|---|
| ***B29C 43/28*** | (2006.01) |
| ***B29C 43/30*** | (2006.01) |
| ***B29C 43/34*** | (2006.01) |
| ***B29C 43/48*** | (2006.01) |
| ***B29C 43/50*** | (2006.01) |
| ***B29C 43/52*** | (2006.01) |
| ***B29C 43/58*** | (2006.01) |
| ***G03F 7/00*** | (2006.01) |

(52) U.S. Cl.
CPC .............. *B29C 43/34* (2013.01); *B29C 43/48* (2013.01); *B29C 43/50* (2013.01); *B29C 43/52* (2013.01); *B29C 43/58* (2013.01); *G03F 7/0002* (2013.01); *B29C 2043/3433* (2013.01)

(56) References Cited

U.S. PATENT DOCUMENTS

| | | | | | |
|---|---|---|---|---|---|
| 4,110,152 | A * | 8/1978 | Dunning | B29C 59/04 | 156/553 |
| 5,057,175 | A * | 10/1991 | Ashton | B29C 43/228 | 156/202 |
| 5,259,926 | A * | 11/1993 | Kuwabara | B29C 43/003 | 216/49 |
| 2001/0032703 | A1* | 10/2001 | Paulson | B29C 39/148 | 156/304.6 |
| 2002/0117060 | A1* | 8/2002 | Steuer | B41F 19/02 | 101/9 |
| 2003/0051794 | A1* | 3/2003 | Suda | B60C 9/02 | 156/123 |
| 2003/0056885 | A1* | 3/2003 | Wright | B44C 1/24 | 156/209 |
| 2003/0102591 | A1* | 6/2003 | Thielman | B29C 43/26 | 264/166 |
| 2003/0111767 | A1* | 6/2003 | Gorman | B29C 59/002 | 264/284 |
| 2004/0130057 | A1* | 7/2004 | Mehrabi | B29C 59/02 | 264/171.13 |
| 2004/0183223 | A1* | 9/2004 | Knauf | B05D 1/265 | 264/129 |
| 2005/0087283 | A1* | 4/2005 | Begemann | B29C 67/246 | 156/78 |
| 2006/0210714 | A1 | 9/2006 | Huizinga et al. | | |
| 2008/0251964 | A1* | 10/2008 | Pricone | B29C 39/148 | 264/172.19 |
| 2009/0014116 | A1* | 1/2009 | Takada | B29C 48/9155 | 156/209 |
| 2009/0046362 | A1* | 2/2009 | Guo | G03F 7/0002 | 359/485.05 |
| 2009/0087506 | A1* | 4/2009 | Hasegawa | B82Y 40/00 | 425/34.2 |
| 2009/0120570 | A1* | 5/2009 | Johnard | B29D 99/0057 | 156/277 |
| 2009/0166914 | A1* | 7/2009 | Ogino | G03F 7/0002 | 264/175 |
| 2012/0301569 | A1* | 11/2012 | Hasegawa | B29C 37/0067 | 425/385 |
| 2013/0214452 | A1* | 8/2013 | Choi | G03F 7/0002 | 264/293 |
| 2015/0346490 | A1 | 12/2015 | Tekolste et al. | | |

OTHER PUBLICATIONS

Kooy et al., A review of roll-to-roll nanoimprint lithography, Nanoscale Research Letters 2014, 9:320. Retrieved online on Apr. 22, 2020 http://www.nanoscalereslett.com/content/9/1/320 (Year: 2014).*
U.S. Appl. No. 62/447,608, filed Jan. 18, 2017, Manipulating Optical Phase Variations in Diffractive Structures, Samarth Bhargava et al.
International Search Report and Written Opinion for International Application No. PCT/US2018/034754, dated Aug. 10, 2018, 13 pages.
Extended European Search Report in Application No. 18806461.2, dated Jun. 26, 2020, 5 pages.

* cited by examiner

DOUBLE-SIDED IMPRINTING

CROSS-REFERENCE TO RELATED APPLICATION

This application claims the benefit of the filing date of U.S. Provisional Application No. 62/511,172, filed on May 25, 2017. The contents of U.S. Application No. 62/511,172 are incorporated herein by reference in their entirety.

TECHNICAL FIELD

This disclosure relates generally to imprinting technology, particularly for double-sided imprinting.

BACKGROUND

When developing a process and/or a tool for transitioning from creating single sided imprints on a substrate to imprints on both sides from templates, there are a lot of challenges to overcome. The challenges can include: positioning and aligning the substrate and the templates, locating reference features to assist in the alignment, creating the imprints without air entrapment and defects, and holding the substrate without damage.

SUMMARY

The present disclosure describes methods, devices, and systems for double-sided imprinting, which have addressed the challenges mentioned above.

One aspect of the present disclosure features a double-sided imprinting method including: drawing a first web along first rollers and drawing a second web along second rollers, the first web comprising a first template and the second web comprising a second template; aligning reference marks on the first web and the second web, such that the first template and the second template are aligned with each other; drawing the first web along the first rollers in a first direction to expose the first template to a first dispenser and drawing the second web along the second rollers in a second direction to expose the second template to a second dispenser; dispensing first resist on the first template by the first dispenser and dispensing second resist on the second template by the second dispenser; drawing the first web along the first rollers in a direction reverse to the first direction and drawing the second web along the second rollers in a direction reverse to the second direction, such that the first template with the first resist and the second template with the second resist face to each other; inserting a substrate between the first template with the first resist and the second template with the second resist; curing the first resist and the second resist, such that the cured first resist has a first imprinted feature associated with the first template on a first side of the substrate and the cured second resist has a second imprinted feature associated with the second template on a second side of the substrate; and unloading the substrate with the first imprinted feature on the first side and the second imprinted feature on the second side.

In some implementations, the method further includes: after the aligning, clamping the first web and the second web at a location adjacent to the reference marks, such that the clamped first web and second web are moved with the first template and the second template aligned with each other; and after the curing, unclamping the first web and the second web, such that the substrate with the cured first resist and second resist is capable of passing through a gap between the first web and the second web. Clamping the first web and the second web can include actuating a chuck with a clamp, such that the chuck is onto the first web and the clamp is onto the second web. The chuck can include a vacuum chuck configured to chuck onto the first web with vacuum. In some examples, the chuck is configured to be moveable along a rail parallel to an axis defined by the first rollers, and the chuck and the clamp are moved together with the first web and the second web after the clamping. The chuck can be positioned on a pair of guides, and each of the guides can be movable on a respective rail connected to a frame. Aligning reference marks on the first web and the second web can include adjusting relative positions of the guides on the respective rails in at least one of x, y, or theta direction.

The first rollers and the second rollers can be arranged such that, after the inserting, the substrate is moved together with the first template and the second template, and the first resist is pressed onto the first side of the substrate and filled into a first imprinting feature on the first template and the second resist is pressed onto the second side of the substrate and filled into a second imprinting feature on the second template.

The method can further include: moving a first squeegee roller on the first web to push the first template into the first resist, such that the first resist fills into a first imprinting feature on the first template; and moving a second squeegee roller on the second web to push the second template into the second resist, such that the second resist fills into a second imprinting feature on the second template. The first squeegee roller and the second squeegee roller can be positioned opposite to each other during moving together the first squeegee and the second squeegee.

In some cases, aligning reference marks on the first web and the second web includes aligning a first reference mark on the first web with a second reference mark on the second web and aligning a third reference mark on the first web with a fourth reference mark on the second web. The first reference mark and the third reference mark can define a range where the substrate is configured to be imprinted with the first template. In some cases, aligning reference marks on the first web and the second web includes moving a z-roller of the first rollers in at least one of x, y, or theta direction. In some cases, aligning reference marks on the first web and the second web includes locating the reference marks by using at least one of a camera system or a laser system.

The first direction can be counter-clockwise direction, and the second direction can be clockwise direction. In some examples, the first rollers include at least one air turn roller configured to float the first web by air pressure. In some examples, the first rollers include at least one air turn roller configured to chuck the first web by vacuum.

In some examples, the first rollers include two first z-rollers arranged in a vertical direction, and the second rollers include two second z-rollers arranged in the vertical direction. Dispensing first resist on the first template by the first dispenser can include dispensing the first resist on the first template when the first template is in a horizontal direction, and dispensing second resist on the second template by the second dispenser can include dispensing the second resist on the second template when the second template is in the horizontal direction.

In some examples, inserting the substrate includes inserting the substrate by a first holder along an inserting direction. In some cases, unloading the substrate includes moving the substrate with the first and second imprinted features along a direction reverse to the inserting direction and unloading the substrate with the first and second imprinted features by the first holder. In some cases, unloading the substrate includes moving the substrate with the first and second imprinted features along the inserting direction and unloading the substrate with the first and second imprinted features by a second, different holder. The method can further include measuring first tension of the first web by a first tension sensor and measuring second tension of the second web by a second tension sensor. The method can further include controlling at least one of temperature or cleanness of a chamber enclosing at least the first template and the second template.

The method can include: before drawing the first template into an imprinting region and when the first web is static, locating a first reference mark on the first web using a detecting system positioned upstream one of the first rollers. The method can include: locating a first reference mark on the first web with a reference mark on the substrate; aligning the first reference mark on the first web with the reference mark on the substrate; and after the alignment, clamping the first reference mark to move the first web such that the first template is moved to an imprinting start position in synchronization with an imprinting start position of the substrate. The method can further include: aligning reference marks on the first web and the second web includes: measuring an angle of the first web by one or more sensors arranged on an edge of the first web; and repositioning the substrate based on the measured angle of the first web.

Another aspect of the present disclosure features a system for double-sided imprinting, including: first rollers for moving a first web including a first template; second rollers for moving a second web including a second template; an alignment system configured to align reference marks on the first web and the second web such that the first template and the second template are aligned with each other; a first dispenser configured to dispense first resist on the first template; a second dispenser configured to dispense second resist on the second template; a loading system configured to insert a substrate between the first template and the second template; and a light source configured to cure the first resist and the second resist, such that the cured first resist has a first imprinted feature associated with the first template on a first side of the substrate and the cured second resist has a second imprinted feature associated with the second template on a second side of the substrate. In operation, the first web is drawn along the first rollers in a first direction to expose the first template to the first dispenser and the second web is drawn along the second rollers in a second direction to expose the second template to the second dispenser, and then, the first web is drawn along the first rollers in a direction reverse to the first direction and the second web is drawn along the second rollers in a direction reverse to the second direction, such that the first template with the first resist and the second template with the second resist face to each other.

In some implementations, the system further includes an unloading system configured to unload the substrate with the first imprinted feature on the first side and the second imprinted feature on the second side. In some cases, the loading system is configured to unload the substrate when the substrate with the first and second imprinted feature is reversely moved back to the loading system.

In some implementations, the system further includes a clamping system configured to: clamp the first web and the second web at a location adjacent to the reference marks, such that the clamped first web and second web are moved with the first template and the second template aligned with each other; and unclamp the first web and the second web, such that the substrate with the cured first resist and second resist is capable of passing through a gap between the first web and the second web. The clamping system can include: a chuck configured to chuck the first web; and a clamp configured to clamp the second web when actuated with the chuck. The chuck can include a vacuum chuck configured to chuck onto the first web with vacuum. The chuck can be configured to be moveable along a rail parallel to an axis defined by the first rollers, and the chuck and the clamp can be moved together with the first web and the second web after clamping the first web and the second web. In some examples, the chuck is positioned on a pair of guides, and each of the guides is movable on a respective rail connected to a frame, and the alignment system is configured to align the reference marks on the first web and the second web by adjusting a relative position of the guides on the respective rails in at least one of x, y, or theta direction.

The first rollers and the second rollers can be arranged such that the substrate is moved together with the first template and the second template, and the first resist is pressed onto the first side of the substrate and filled into a first imprinting feature on the first template and the second resist is pressed onto the second side of the substrate and filled into a second imprinting feature on the second template. The alignment system can be configured to align the reference marks on the first web and the second web by moving a z-roller of the first rollers in at least one of x, y, or theta direction. The system can further include a locating system configured to locate the reference marks on the first web and the second web for alignment, and the locating system can include at least one of a camera system or a laser system.

The first direction can be counter-clockwise direction, and the second direction can be clockwise direction. In some examples, the first rollers include at least one air turn roller configured to float the first web by air pressure. In some examples, the first rollers include at least one air turn roller configured to chuck the first web by vacuum. In some examples, the first rollers include two first z-rollers arranged in a vertical direction, and the second rollers include two second z-rollers arranged in the vertical direction, and the first dispenser can be configured to dispense the first resist on the first template when the first template is in a horizontal direction, and the second dispenser is configured to dispense the second resist on the second template when the second template is in the horizontal direction.

The system can further include first and second tension sensors configured to measure tension of the first web and the second web, respectively. The system can further include a chamber configured to enclose the first template and the second template and a controller configured to control at least one of temperature or cleanness of the chamber.

A third aspect of the present disclosure features a double-sided imprinting method including: drawing a first web along first rollers, the first web comprising a first template having a first imprinting feature; dispensing first resist on the first template; loading a substrate onto the first template, such that a first side of the substrate is in contact with the first resist on the first template; clamping the substrate onto the first template, such that the substrate is movable together with the first template; dispensing second resist on a second side of the substrate; aligning a first reference mark on the first web with a second reference mark on a second web that includes a second template having a second imprinting feature, such that the second imprinting feature is aligned with the first imprinting feature; after the aligning, drawing the first web along the first rollers and drawing the second web along second rollers simultaneously at a same rate; curing the first resist and the second resist, such that the cured first resist has a first imprinted feature corresponding to the first imprinting feature on the first side of the substrate and the cured second resist has a second imprinted feature corresponding to the second imprinting feature on the second side of the substrate; and unloading the substrate with the first imprinted feature on the first side and the second imprinted feature on the second side.

The method can further include waiting until the first resist spreads into the first imprinting feature of the first template. The first imprinting feature can include a grating feature, and the grating feature can be configured such that the first resist uniformly fills into the grating feature.

The first reference mark can be positioned ahead of the first imprinting feature on the first web along a direction of drawing the first web, and the second reference mark can be positioned ahead of the second imprinting feature on the second web along the direction. In some examples, the first template includes one or more pre-pattered through holes, and clamping the substrate onto the first web includes holding with vacuum the substrate by a vacuum chuck through the one or more pre-patterned through holes.

In some implementations, the first rollers include two first z-rollers arranged in a horizontal direction, and the second rollers include two second z-rollers arranged in the horizontal direction. The two first z-rollers can define a first moving range for the first web and the two second z-rollers can define a second moving range for the second web, and the first moving range can be larger than the second moving range and can enclose the second moving range. In some cases, the first rollers and the second rollers are arranged to define a vertical distance between the first template and the second template, and the vertical distance can be defined such that the second resist is pressed onto the second side of the substrate and filled into the second imprinting feature on the second template.

The method can further include: before the curing, moving a squeegee roller onto the second web to push the second template into the second resist, such that the second resist fills into the second imprinting feature. The method can further include: after the aligning, moving the second rollers together with the second web to be in contact with the second resist on the second side of the substrate, such that the second template is pressed into the second resist and the second resist fills into the second imprinting feature.

In some examples, unloading the substrate includes: pulling the second web away from one of the second rollers to separate from the substrate; and unclamping the substrate and taking from the first web the substrate.

A fourth aspect of the present disclosure features a system for double-sided imprinting, including: first rollers for moving a first web including a first template having a first imprinting feature; second rollers for moving a second web including a second template having a second imprinting feature; a first dispenser configured to dispense first resist on the first template; a loading system configured to load a substrate onto the first template, such that a first side of the substrate is in contact with the first resist on the first template; a clamping system configured to clamp the substrate onto the first web, such that the substrate is movable together with the first web; a second dispenser configured to dispense second resist on a second side of the substrate; a locating system configured to locate a first reference mark on the first web with a second reference mark on the second web for aligning the first reference mark with the second reference mark; a light source configured to cure the first resist and the second resist, such that the cured first resist has a first imprinted feature corresponding to the first imprinting feature on the first side of the substrate and the cured second resist has a second imprinted feature corresponding to the second imprinting feature on the second side of the substrate; and an unloading system configured to unload the substrate with the first imprinted feature on the first side and the second imprinted feature on the second side. After the first reference mark and the second reference mark are aligned with each other, the first web and the second web are drawn simultaneously at a same rate.

The first imprinting feature of the first template can include a grating feature, and the grating feature can be configured such that the first resist uniformly fills into the grating feature. The first reference mark can be positioned ahead of the first imprinting feature on the first web along a direction of drawing the first web, and the second reference mark is positioned ahead of the second imprinting feature on the second web along the direction. The first template can include one or more pre-pattered through holes, and the clamping system comprises a vacuum chuck configured to hold with vacuum the substrate through the one or more pre-patterned through holes.

In some implementations, the first rollers include two first z-rollers arranged in a horizontal direction, and the second rollers include two second z-rollers arranged in the horizontal direction. The two first z-rollers can define a first moving range for the first web and the two second z-rollers can define a second moving range for the second web, the first moving range being larger than the second moving range and enclosing the second moving range. The first rollers and the second rollers can be arranged to define a vertical distance between the first template and the second template, and the vertical distance can be defined such that the second resist is pressed onto the second side of the substrate and filled into the second imprinting feature on the second template.

The first dispenser, the loading system, the second dispenser, the locating system, the light source, and the unloading system can be arranged sequentially along a direction of drawing the first web along the first rollers. The system can further include a squeegee roller configured to apply pressure onto the second web to push the second template into the second resist, such that the second resist fills into the second imprinting feature of the second template.

The first rollers can include at least one air turn roller configured to float the first web by air pressure. The second rollers can be configured to be movable together with the second web to be in contact with the second resist on the second side of the substrate after the aligning, such that the second template is pressed into the second resist and the second resist fills into the second imprinting feature. In some examples, the loading system can include an equipment front end module (EFEM), and the unloading system can include a second EFEM. In some examples, the locating system includes at least one of a camera system or a laser system. The system can further an alignment system configured to align the first reference mark on the first web with the second reference mark on the second web.

A fifth aspect of the present disclosure features a double-sided imprinting method including: drawing a first web along first rollers and drawing a second web along second rollers until a first template of the first web and a second template of the second web are brought together into an imprinting zone; aligning reference marks for the first template and the second template; dispensing first resist on a first side of a substrate and a second resist on a second side of the substrate; feeding the substrate into the imprinting zone between the first template and the second template; pressing the first template and the second template onto the substrate, such that the first resist fills into a first imprinting feature of the first template on the first side of the substrate and the second resist fills into a second imprinting feature of the second template on the second side of the substrate; curing the first resist and the second resist, such that the cured first resist has a first imprinted feature corresponding to the first imprinting feature on the first side of the substrate and the cured second resist has a second imprinted feature corresponding to the second imprinting feature on the second side of the substrate; and unloading the substrate with the first imprinted feature on the first side and the imprinted feature on the second side.

In some cases, pressing the first template and the second template onto the substrate can include applying a first press dome on the first template. In some cases, pressing the first template and the second template onto the substrate can include applying a second press dome on the second template.

In some implementations, pressing the first template and the second template onto the substrate includes: moving a first squeegee roller onto the first web to push the first template into the first resist, such that the first resist fills into the first imprinting feature on the first template; and moving a second squeegee roller onto the second web to push the second template into the second resist, such that the second resist fills into the second imprinting feature on the second template. The first squeegee roller and the second squeegee roller can be positioned opposite to each other during moving the first squeegee and the second squeegee together.

The method can further include: bringing the first press dome into contact with the first template and bringing the second press dome into contact with the second template; and making a correction for alignment of the first template and the second template. The second press dome can include a glass dome or an annular ring vacuum chuck. The first press dome can include a glass dome or an annular ring vacuum chuck. Unloading the substrate can include: pulling the first web away from one of the first rollers and pulling the second web away from one of the second rollers to separate the first template and the second template from the substrate.

In some cases, the substrate is rigid, and feeding the substrate includes presenting the substrate by gripping an edge of the substrate using a holder. In some cases, the substrate is flexible, and feeding the substrate includes drawing the substrate from a roll of blank substrates. The method can further include: after the substrate is separated from the first template, applying a first protective film onto the cured first resist on the first side of the substrate; and after the substrate is separated from the second template, applying a second protective film onto the cured second resist on the second side of the substrate. The method can further include rolling the substrate with the cured first resist on the first side and the cured second resist on the second side over a roller.

A sixth aspect of the present disclosure features a double-sided imprinting method including: drawing a first web along a first roller and a second roller, the first web comprising a first template having a first imprinting feature; drawing a second web along a third roller and a fourth roller, the second web comprising a second template having a second imprinting feature, the first roller and the third roller being positioned opposite to each other and defining a nip; aligning reference marks for the first template and the second template; dispensing first resist on one of a first side of the substrate and the first template; dispensing second resist on one of a second side of the substrate and the second template; simultaneously drawing the first template and the second template into the nip and feeding the substrate into the nip with the first imprinting feature facing the first side of the substrate and the second imprinting feature facing the second side of the substrate, such that the first resist is pressed by the first roller into the first imprinting feature on the first side of the substrate and the second resist is pressed by the third roller into the second imprinting feature on the second side of the substrate; curing the first resist and the second resist, such that the cured first resist has a first imprinted feature corresponding to the first imprinting feature on the first side of the substrate and the cured second resist has a second imprinted feature corresponding to the second imprinting feature on the second side of the substrate; and unloading the substrate with the first imprinted feature on the first side and the second imprinted feature on the second side.

In some cases, unloading the substrate includes pulling the first web away from the second roller and the second web away from the fourth roller to separate the first template and the second template from the substrate. In some cases, unloading the substrate includes reversely drawing the first web from the first roller and the second web from the third roller and retracting the substrate to separate the first template and the second template from the substrate.

A seventh aspect of the present disclosure features a system for double-sided imprinting, including: first rollers configured to move a first web including a first template having a first imprinting feature; second rollers configured to move a second web including a second template having a second imprinting feature; one or more dispensers configured to dispense resist; a locating system configured to locate reference marks on the first web and the second web for aligning the first template and the second template; a light source configured to cure the resist, such that a cured first resist has a first imprinted feature corresponding to the first imprinting feature on a first side of the substrate and a cured second resist has a second imprinted feature corresponding to the second imprinting feature on a second side of the substrate; and a moving system configured to feed in the substrate between the first template and the second template and unload the substrate with the first imprinted feature on the first side and the second imprinted feature on the second side. The dispensers can be configured to dispense the first resist on one of the first side of a substrate and the first template and the second resist on one of the second side of the substrate and the second template.

In some implementations, one of the first rollers and one of the second rollers are positioned opposite to each other and define a nip, and the moving system is configured to feed the substrate into the nip when the first template and the second template are drawn into the nip with the first imprinting feature facing the first side of the substrate and the second imprinting feature facing the second side of the substrate, such that the first resist is pressed by the first roller into the first imprinting feature on the first side of the substrate and the second resist is pressed by the third roller into the second imprinting feature on the second side of the substrate.

In some cases, the first web is pulled away from another one of the first rollers and the second web is pulled away from another one of the second rollers that is positioned opposite to the one of the first rollers, such that the substrate is separated from the first template and the second template. In some cases, the moving system is configured to retract the substrate to separate from the first template and the second template when the subs first web and the second web are reversely drawn away from the one of the first rollers and the one of the second rollers, respectively.

In some implementations, the system further includes a pressing system configured to press the first template and the second template onto the substrate, such that the first resist fills into the first imprinting feature of the first template on the first side of the substrate and the second resist fills into the second imprinting feature of the second template on the second side of the substrate.

In some examples, the pressing system includes a first press dome configured to be applied on the first template. The first press dome can include a glass dome or an annular ring vacuum chuck. In some examples, the pressing system includes a second press dome configured to be applied on the second template. The second press dome can include a glass dome or an annular ring vacuum chuck. The system can further include a correction system configured to make a correction for alignment of the first template and the second template when the first press dome is pressed onto contact with the first template and the second press dome is pressed onto contact with the second template.

In some implementations, the system includes a first squeegee roller configured to be moved onto the first web to push the first template into the first resist, such that the first resist fills into the first imprinting feature on the first template; and a second squeegee roller configured to be moved onto the second web to push the second template into the second resist, such that the second resist fills into the second imprinting feature on the second template. The first squeegee roller and the second squeegee roller can be positioned opposite to each other during moving the first squeegee and the second squeegee together.

In some cases, the moving system includes a holder configured to grip an edge of the substrate. In some cases, the system includes a roller of blank substrates, and the moving system is configured to rotate the roller to feed the substrate.

In some implementations, the system further includes a first roller of first protective film configured to be applied onto the cured first resist on the first side of the substrate and a second roller of second protective film configured to be applied on the cured second resist on the second side of the substrate. The system can further include a roller configured to be rotated to receive the substrate with the cured first resist on the first side and the cured second resist on the second side.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIGS. 12A-1 to 12I show schematic diagrams of example procedures of using the tool of FIG. 11A for double-sided imprinting.

DETAILED DESCRIPTION

For double-sided imprinting, a positional alignment of an imprinted feature from one side to another side is of critical importance in manufacture of some devices. In some implementations, the alignment of a top side template to a pattern on the bottom side of the substrate requires finding reference marks on both the template and the substrate and then uses a high resolution positioning system to register the template and substrate with respect to each other. After the alignment, the template can be carefully pressed against the substrate as not to create pockets of entrapped air and ensure the detail features of the template is completely filled. Once an illumination light, e.g., ultraviolet (UV) light, cures a resist, e.g., a UV curable resist, between the template and substrate, the template can be separated and the pattern can stand on both sides of the substrate.

The imprinting process involves bringing the substrate with UV curable resist in contact with the template web as the template web is moving underneath a roller. The rolling action can cause the UV resist to fill the spaces in the template and push out all the air. At this point the UV resist is cured, and the template is separated from the substrate underneath a roller as the web path turns and moves away from the linear motion of the substrate on the vacuum chuck.

As the template is carried by a flexible, moving web, it is difficult to determine the template's position with a high degree of accuracy. The web is able to move side to side by small amounts as the web advances over the rollers in the tool. The web can be advanced by rollers connected to motors. These rollers have variations in diameters and the rotary encoders have limited resolutions. The web is also flexible, so tension variations cause the web and template to stretch as well as move in the vertical direction.

In some implementations, the web is advanced into a zone where the template is available for imprinting on the substrate and a camera system is used to locate registration marks on the template. Once the positions of the reference marks are found, the template can be used to create the imprint on the substrate without moving the web. In this way, the move after locating the substrate can be eliminated, which ensures a greater positional accuracy of the template and better alignment to the imprint on the opposite side of the substrate. In some implementations, imprint features are transferred to a substrate without relying on advancement of a web over a leading roller.

Figure 6A:
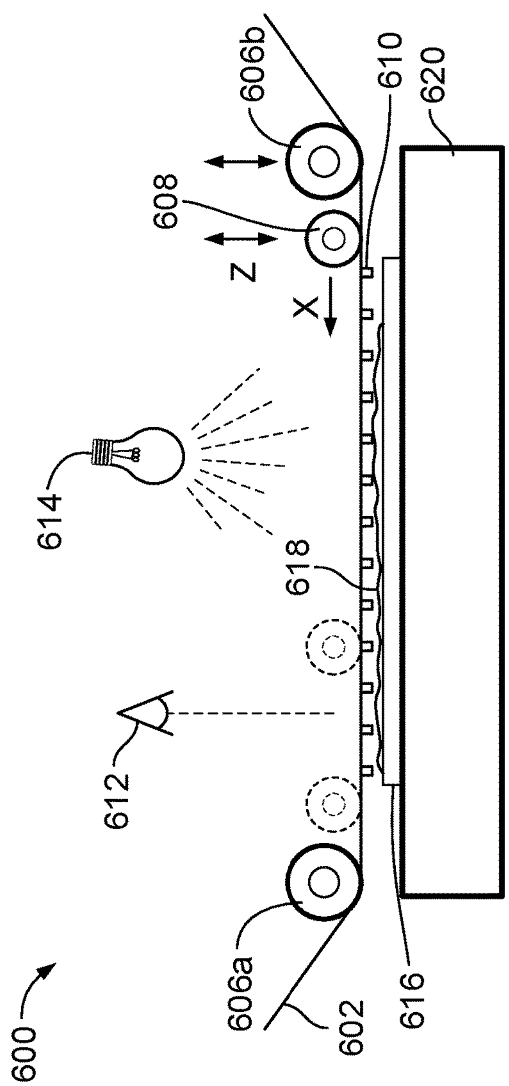
FIG. 6A shows a schematic diagram of an example of using a squeegee roller during imprinting.
Figure 6B:
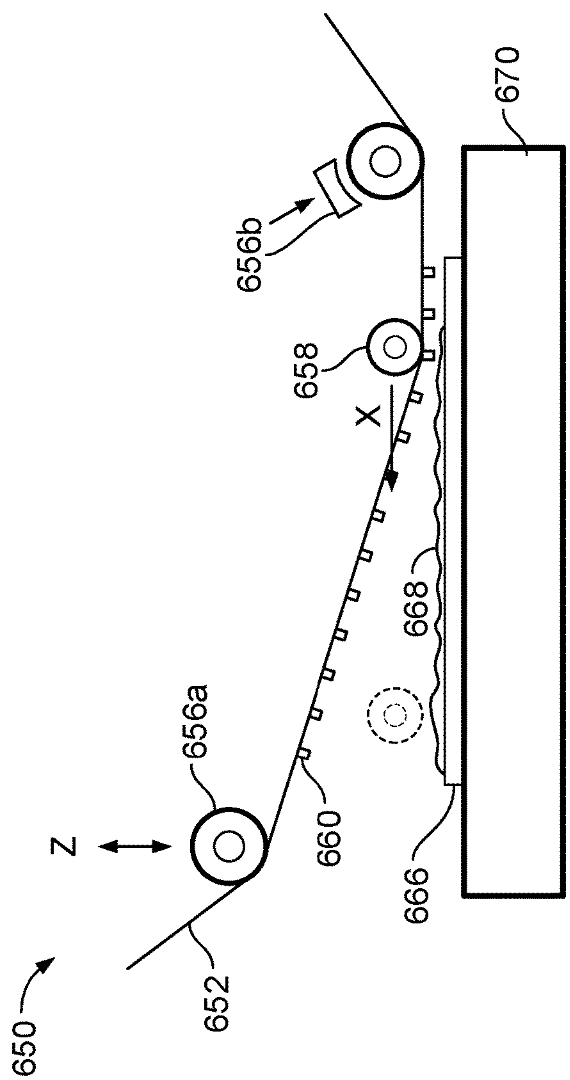
FIG. 6B shows a schematic diagram of another example of using a squeegee roller during imprinting.
Figure 7A:
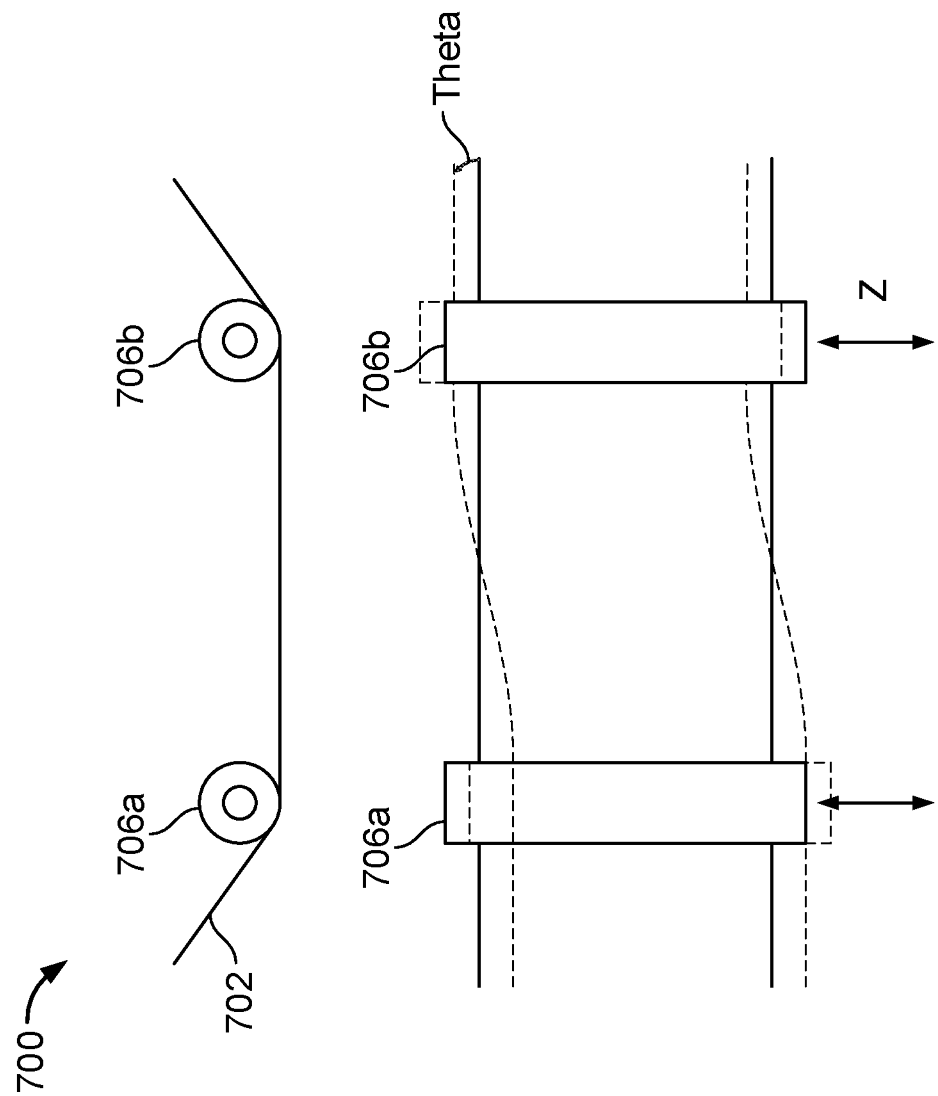
FIG. 7A shows a schematic diagram of an example of implementing a theta adjustment method.
Figure 7B:
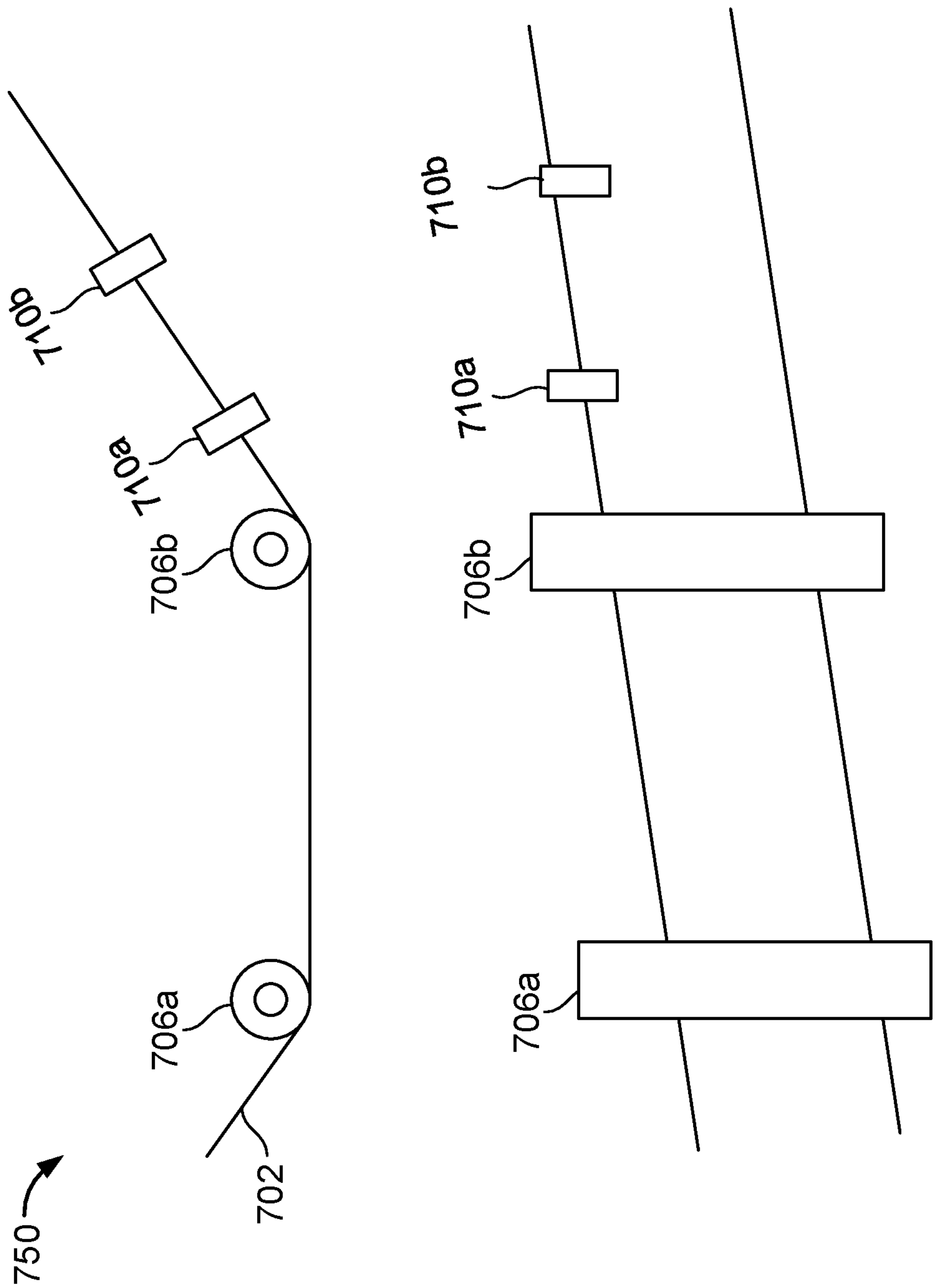
FIG. 7B shows a schematic diagram of an example of implementing a web angle measurement method.
Figure 8:
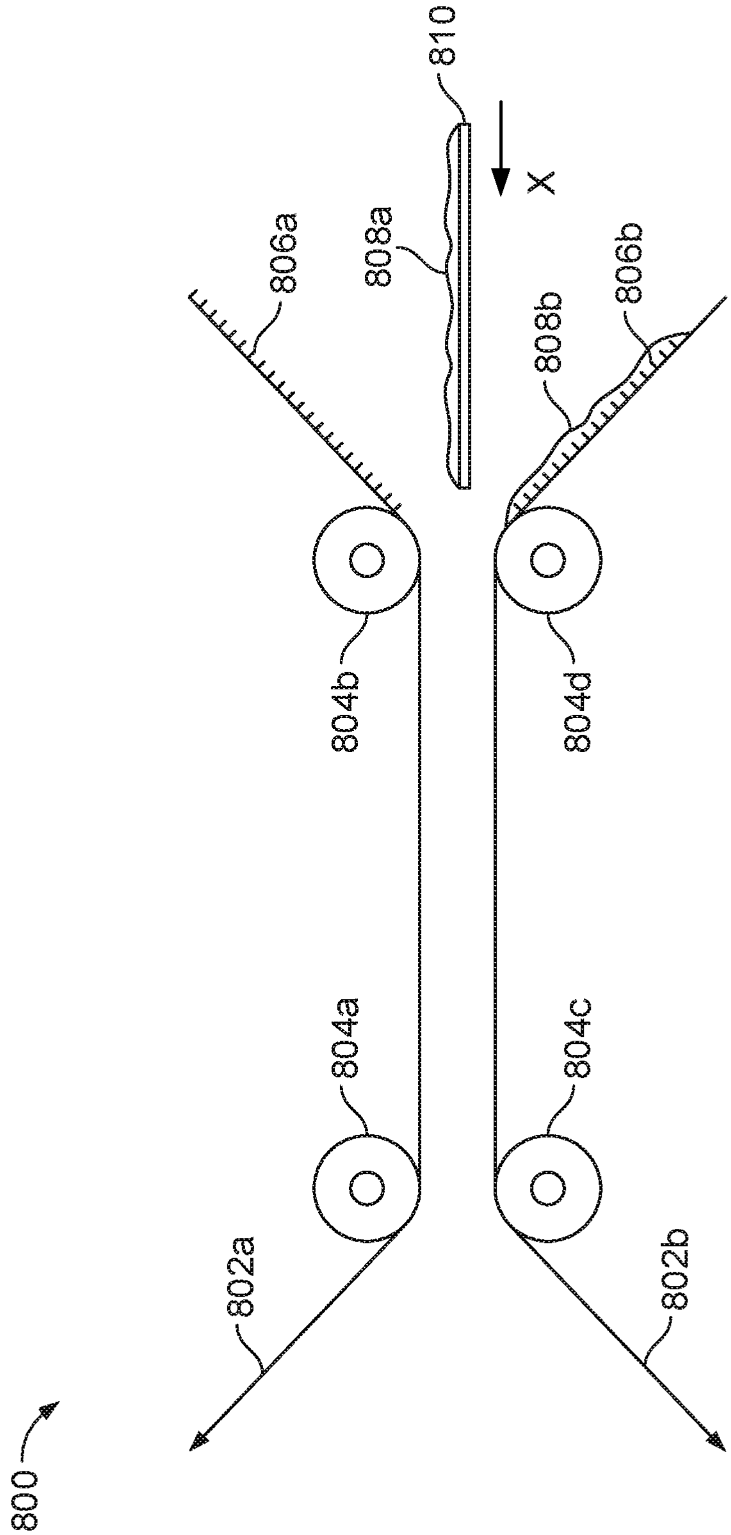
FIG. 8 shows a schematic diagram of an example system of making a double-sided imprint on a substrate.
Figure 9:
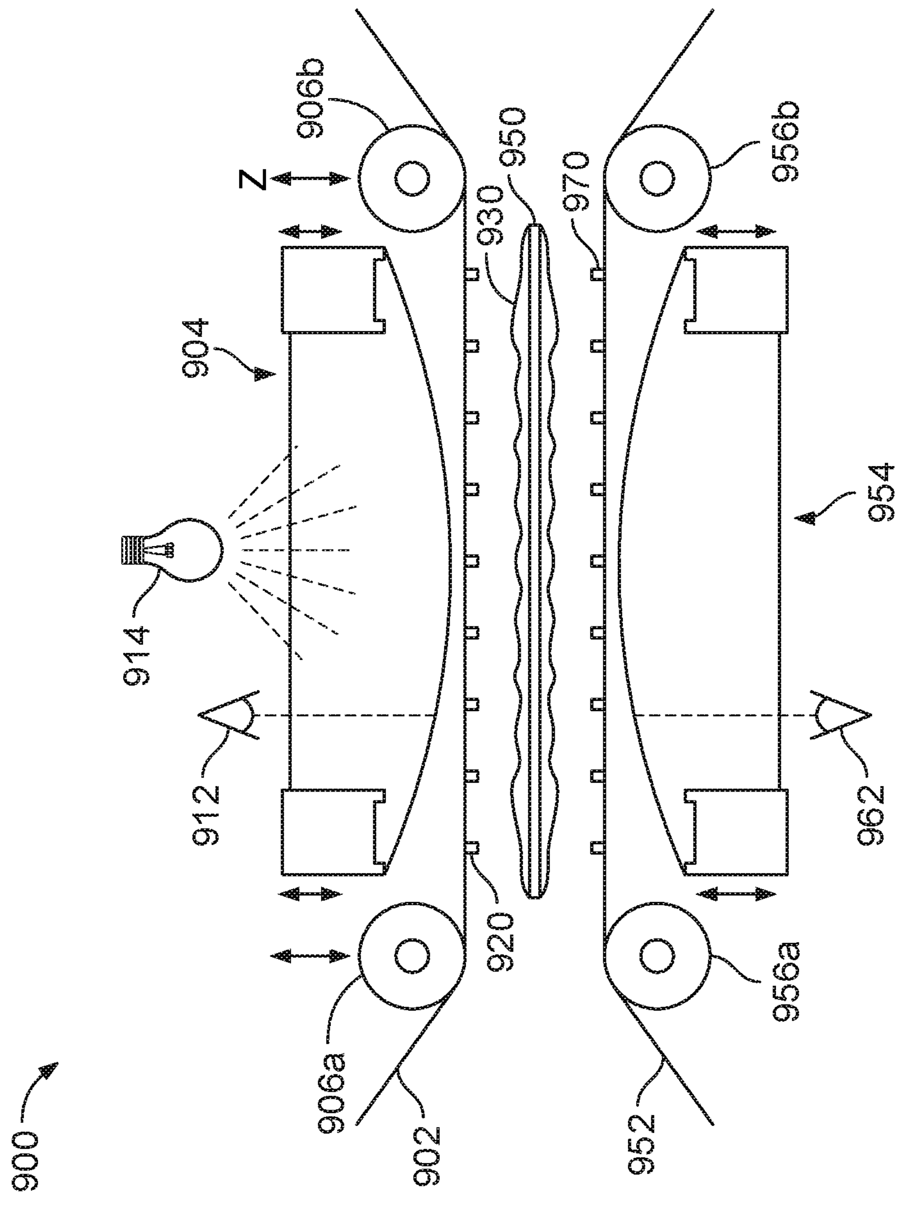
FIG. 9 shows a schematic diagram of another example system of forming imprint on both sides of a substrate at once.
Figure 10:
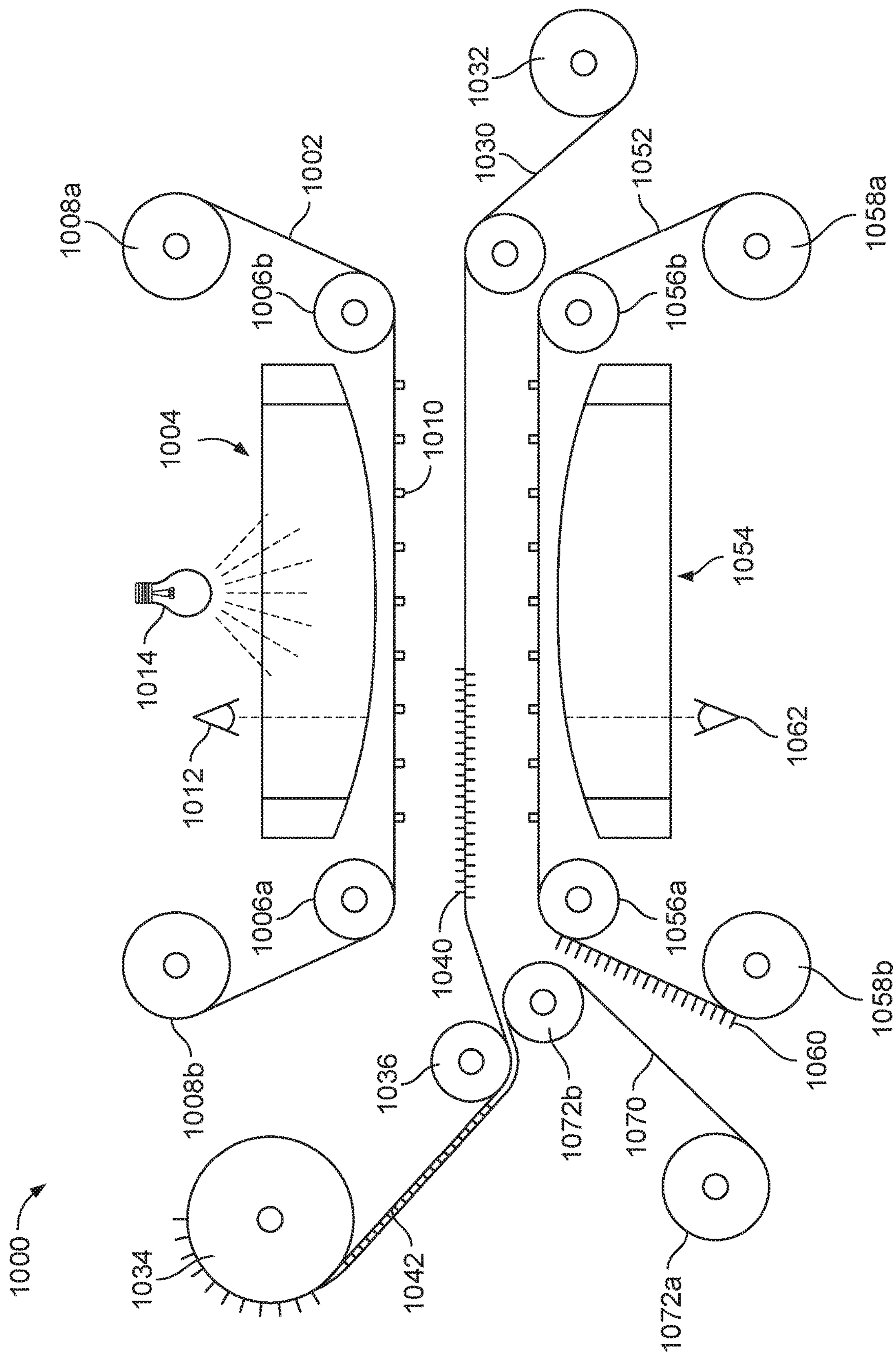
FIG. 10 shows a schematic diagram of an example system of using low-cost, flexible substrates in a roll format with double glass dome imprinting.
Figure 13A:
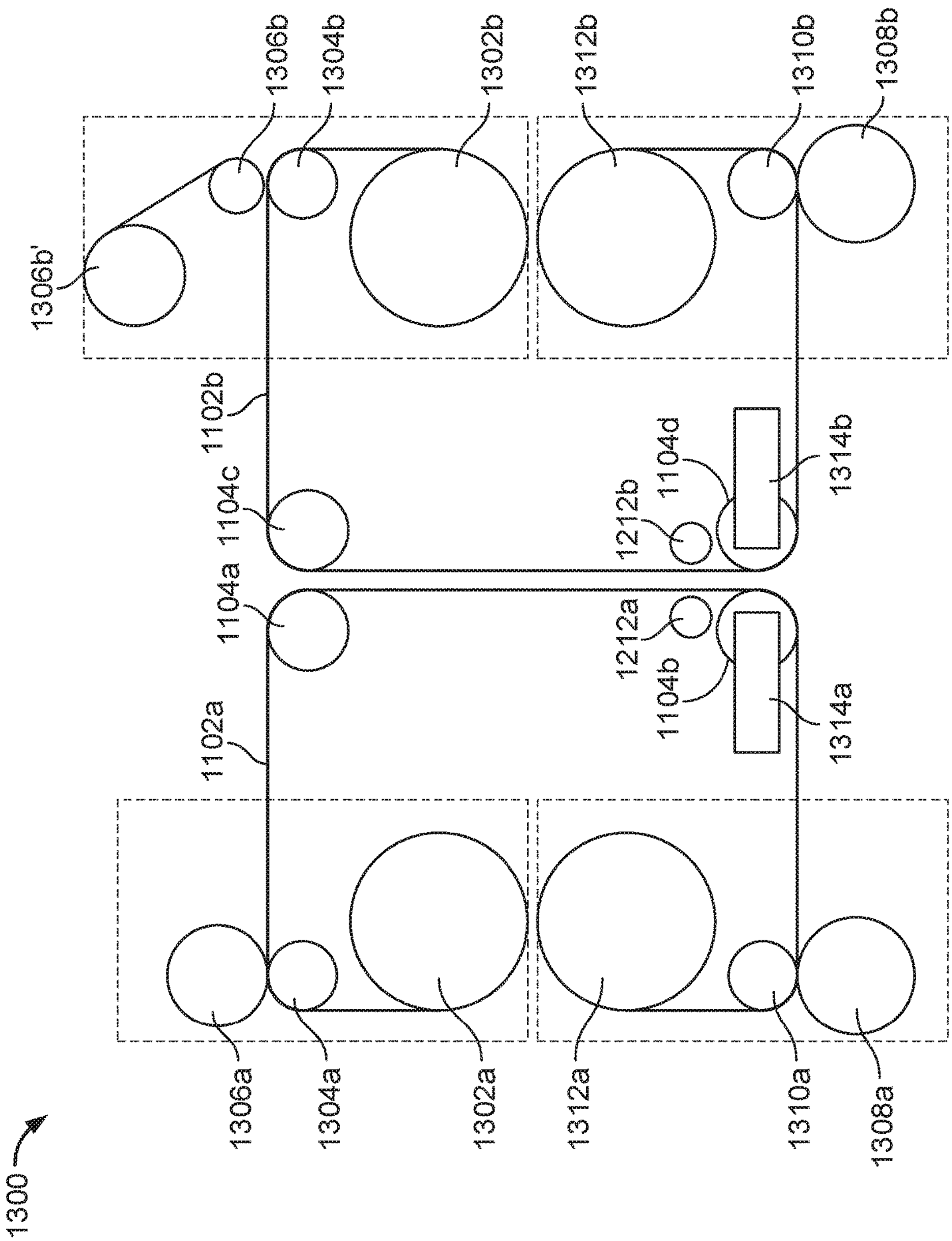
FIGS. 13A-13F show schematic diagrams of example feature configurations of the tool of FIG. 11A for double-sided imprinting.
Figure 13B:
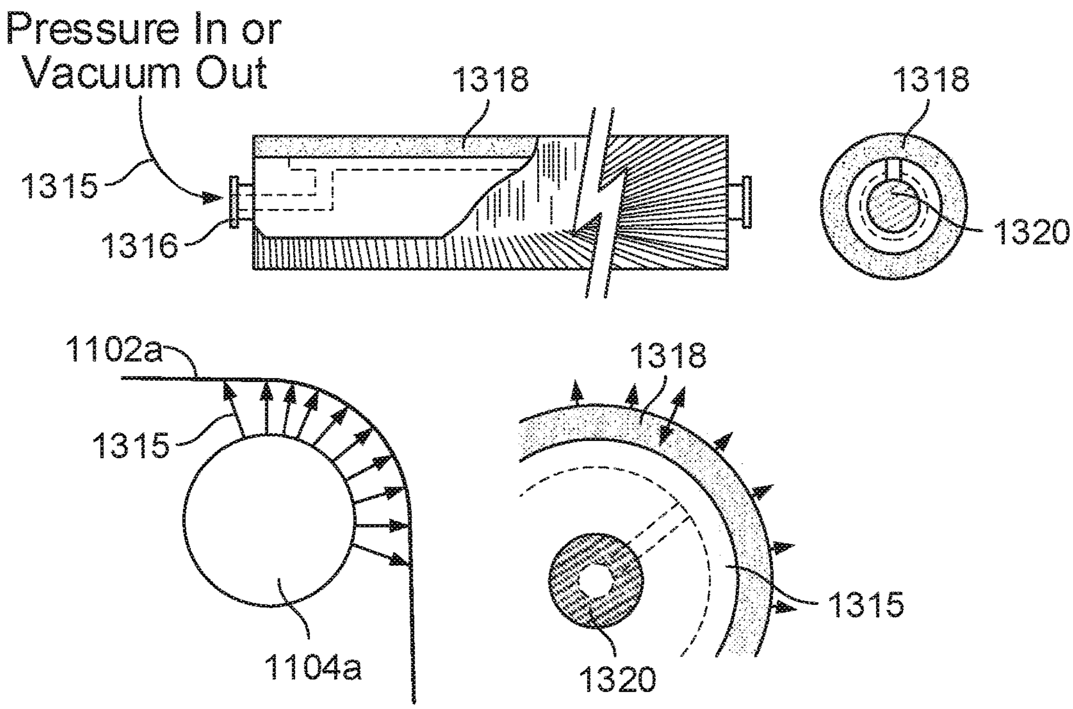
Figure 13C:
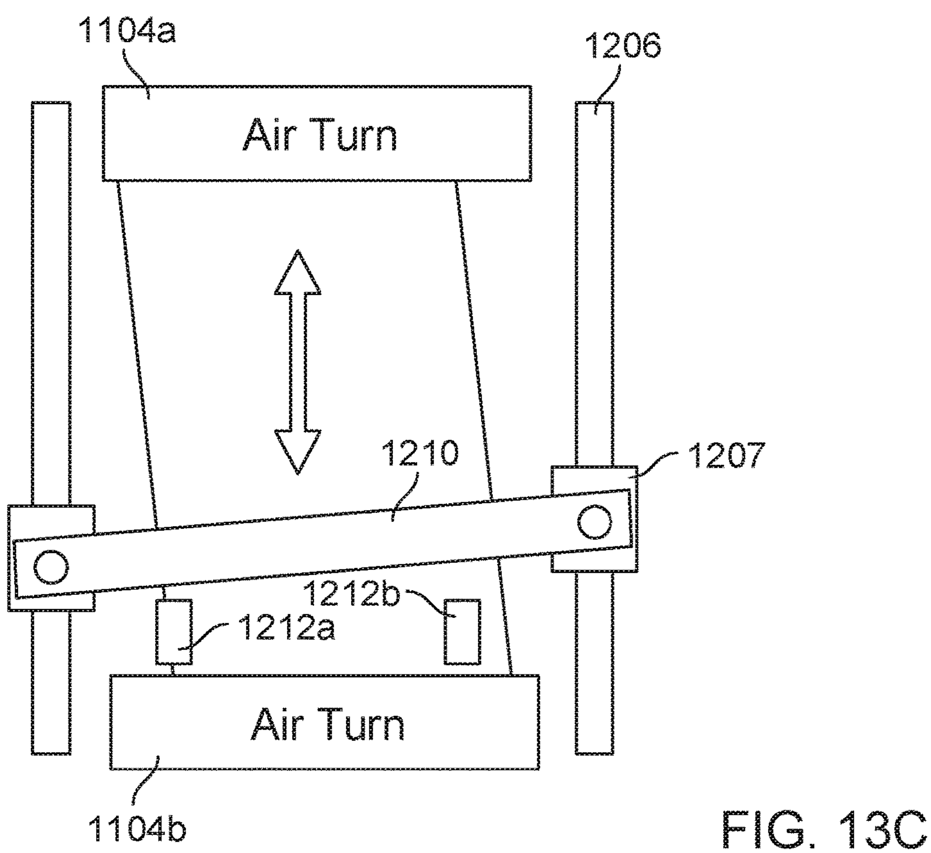

The present disclosure describes methods, devices, and systems for double-sided imprinting, which have addressed the challenges mentioned above. FIGS. 1 to 4B show example template chucking methods. FIGS. 5A to 5H show examples of locating reference marks on templates and substrates for side-to-side imprint alignment. FIGS. 6A-6B show example squeegee rollers for pushing a template into a resist along a substrate during imprinting. FIGS. 7A-7B shows examples of theta adjustment for correcting angular misalignment of rollers and wed angle measurement. FIGS. 8-10 show example implementations of double-sided imprinting. FIGS. 11A to 13F show example tools for aligned-double-sided imprints with associated procedures and configurations. FIGS. 14 to 15H show an example tool for simultaneous double-sided imprints with associated procedures. FIGS. 16 to 19 show example processes of fabricating double-sided imprints on a substrate, e.g., using the devices, systems, or tools described above.

These technologies described in the present disclosure can be applied to fabricating any suitable micro or nanostructures or any double side patterning structures, e.g., diffraction gratings on single side or both sides of any suitable substrates (e.g., rigid or flexible materials). In one example, the technologies can be utilized to fabricate a diffractive optical element (DOE) for an eyepiece as described in a U.S. patent application Ser. No. 14/726,424, entitled "Methods and systems for generating virtual content display with a virtual or augmented reality apparatus" and filed on May 29, 2015 herewith, whose content is hereby incorporated by reference in its entirety. The DOE can have one or more layers, and each layer can include an orthogonal pupil expansion (OPE) diffractive element and an exit pupil expansion (EPE) diffractive element. In some cases, the OPE diffractive element and the EPE diffractive element can be fabricated on opposite sides of a waveguide substrate. In some cases, the OPE diffractive element and the EPE diffractive element can be fabricated on one side of a waveguide substrate and other components can be fabricated on the other side of the waveguide substrate. In another example, the technologies can be utilized to fabricate a diffraction grating on one side of a substrate with a varying structure on the other side of the substrate, as described in FIG. 7E of a U.S. provisional patent application 62/447,608, entitled "Manipulating optical phase variations in diffractive structures" and filed on Jan. 18, 2017 herewith, whose content is hereby incorporated by reference in its entirety.

Examples Template Chucking Methods

I. Direct Annular Template Chucking with Web Dome

As a template is carried by a flexible, moving web, it is difficult to determine a position of the template with a high degree of accuracy. The flexible template (e.g., coated resist template—CRT) is able to move side to side by small amounts as the web advances over rollers in an imprinting tool. When the template is advanced by the rollers connected to motors, motion error accumulates since these rollers have variations in their diameters and rotary encoders have limited resolutions. The web is also flexible, so tension variations cause the web and the template to stretch as well as move in a vertical direction. In some implementations, an annular ring grabs the template with vacuum, and thus the web is able to be moved with a set of precision stages to align it to a reference mark on the substrate while the web is being guided through an optical feedback up to a point of contact.

Figure 1:
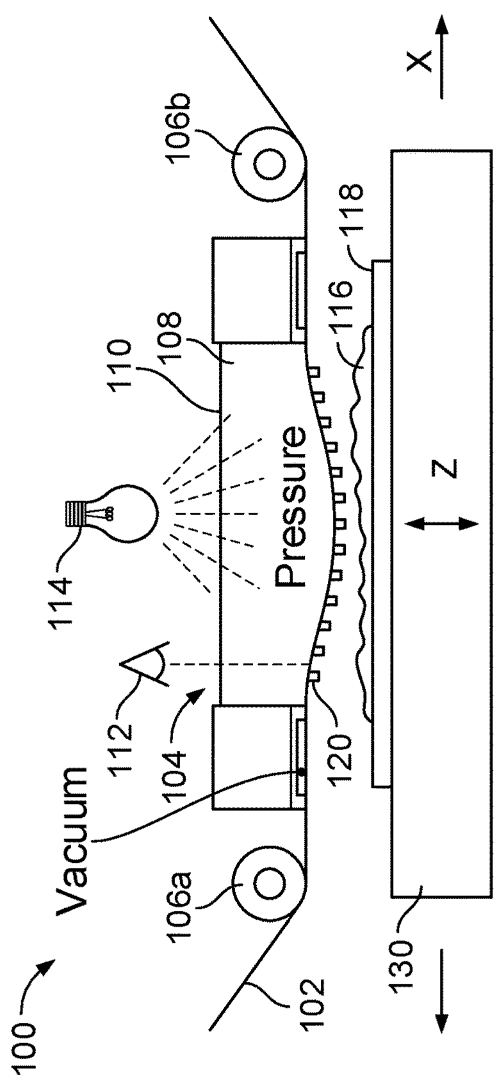
FIG. 1 shows a schematic diagram of an example imprinting tool with a direct annular template chucking with a web dome.

FIG. 1 shows an example imprinting tool 100 with a direct annular template chucking with a web dome. A web 102 is drawn against an annular ring vacuum chuck 104 that is located above the web 102 and between z-rollers 106*a*, 106*b* in the imprinting tool 100. The ring vacuum chuck 104 has a cavity 108 inside the vacuum region that can be covered and sealed with a glass window 110. The glass window 110 allows for a vision system 112 to accurately locate reference marks on a template 120 on the web 102, a UV curing light 114 to harden a UV resist 116, and pressure or vacuum to be applied to the web 102 in the region inside the ring vacuum chuck 104.

When pressure is applied to the region inside the annular ring vacuum chuck 104, the web 102 with the template 120 can bow outward like a balloon with the area in the center of the ring pushed down slightly toward a substrate 118 on a stage 130 that can be moved vertically (e.g., along Z direction) and horizontally (e.g., along X direction). As the template 120 and the substrate 118 come together for imprinting (either by moving the template 120 down or the substrate 118 up) the center portion of the template 120 can touch the substrate 118 first in a small circular area, and as the template 120 and the substrate 118 are brought closer, the contact area will continue to increase as air is pushed out of the way and the resist fills in details within the template 120. At this point, the resist 116 is hardened by light 114, the ring vacuum chuck 104 releases the template 120, and the stage 130 and the web 102 are advanced together until separation occurs at the z-roller 106*a* or 106*b*.

Holding of a flexible template, e.g., the template 120, with an annular ring vacuum chuck, e.g., the ring vacuum chuck 104, provides several advantages. First, this technique secures the template for accurate positioning. Second, if the template is a clear, material, the technique allows for a vision system to see through to alignment marks on the substrate below and perform a precision alignment. This technique also allows pressure to be applied to the back of the template to bow the template so when contact is made with the substrate, the touch point can be at the center and air can be forced out between the template and the substrate. The clear template allows for a UV cure step to harden the features. For separation of the template from the features, the vacuum is released and the web with the substrate are driven forward and separation occurs at a roller as the path of the web leaves the linear path of the substrate.

II. Indirect Template Chucking with Glass Dome

Figure 2:
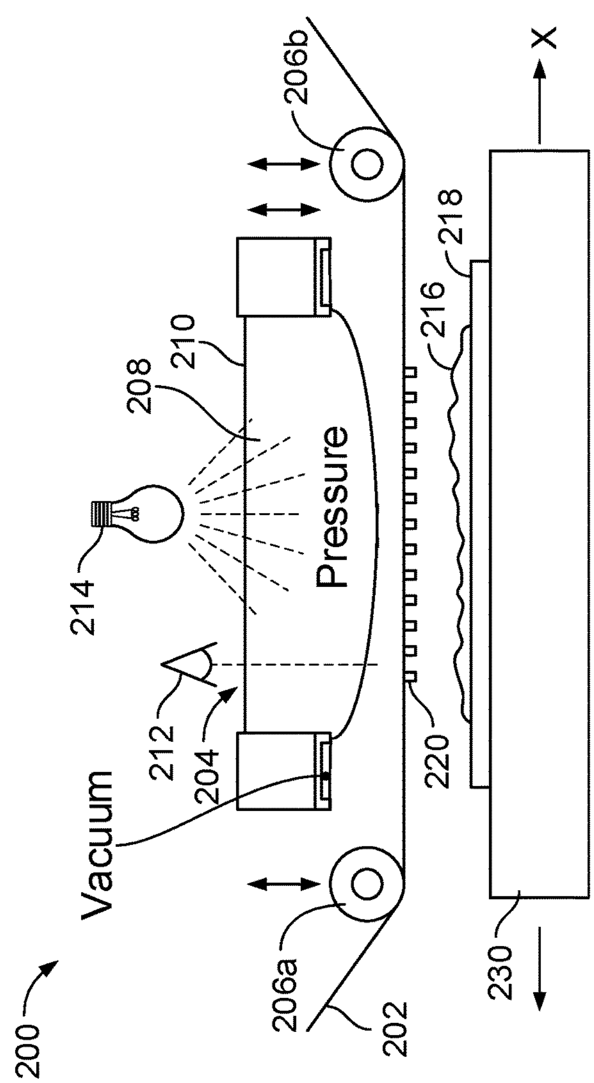
FIG. 2 shows a schematic diagram of an example imprinting tool with an indirect template chucking with a glass dome.

FIG. 2 shows an example imprinting tool 200 with an indirect template chucking with a glass dome. Imprinting forces can be applied with a separate pressurized dome assembly 204 that can be lowered into a backside of a web 202 above a template 220. The glass dome 204 can include a thin piece of transparent glass 210 that takes a dome shape when a closed volume 208 behind the glass 210 is pressurized. The glass back surface allows for optical template reference mark location by a vision system 212 and UV curing by a UV light 214. Once the dome shaped glass 204 is lowered into the back of the web 202, the friction between them can lock the web 202 in place. At this point, the vision system 212, e.g., cameras, can find reference marks on the template 220 and on a substrate 218 below. A stage assembly 230 that holds the substrate can move the reference marks into alignment with an optical feedback, e.g., horizontally along X direction.

After the alignment, the substrate 218 is brought out from under the template 220 and UV curable resist 216 is applied, then the substrate 218 is brought back to the aligned position for the imprinting. As the dome 204 and the template 220 are moved, e.g., vertically, into the substrate 218, the template 220 will first contact the substrate 218 in the center and the contact patch will grow outward, pushing air out of the way. At this point, the imprint can be cured with UV, then the dome 204 can be raised and separated from the backside of the flexible template 220. The web 202 can be advanced together with the substrate 218 on the vacuum chuck 204 and the template 220 can separate from the substrate 218 at z-rollers 206*a* or 206*b*.

III. Template Vacuum Chucking & Air/Vacuum Bar Chucking

Figure 3A:
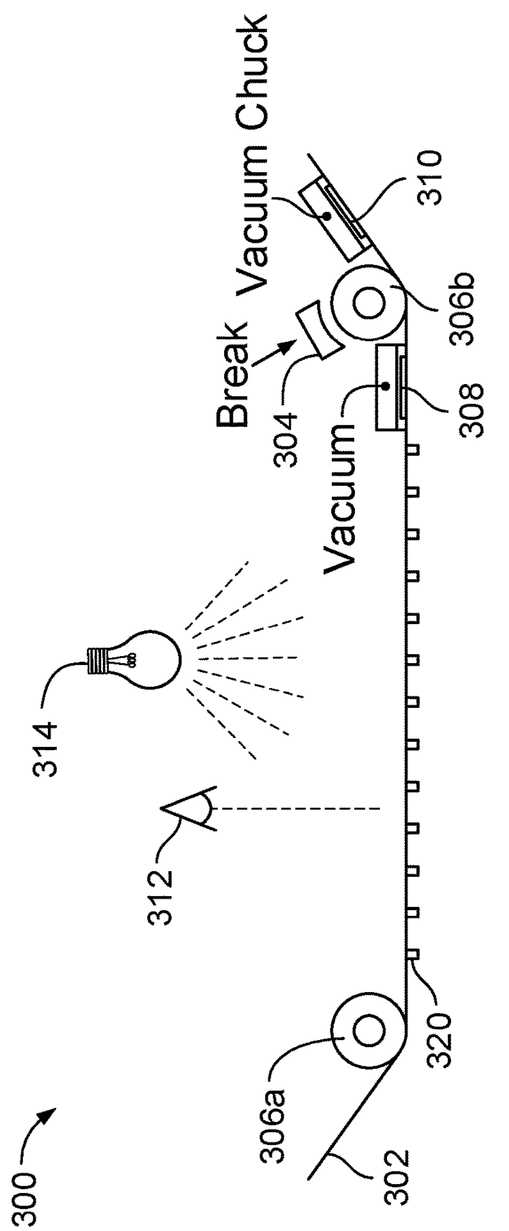
FIG. 3A shows a schematic diagram of an example template vacuum chucking.

FIG. 3A shows a schematic diagram of an example template vacuum chucking 300. A web 302 is drawn along two z-rollers 306*a*, 306*b*. The web 302 can be chucked with vacuum by vacuum chucks 308, 310 in certain locations around a template region including a template 320 to prevent the web 302 from slipping around the z-rollers 306*a*, 306*b* or to keep tension variations from inducing errors in a position of the web 302. As illustrated in FIG. 3A, the two vacuum chucks 308, 310 can be arranged before and after the high friction z-roller 306*b* respectively. The vacuum chuck 308 is adjacent but away from the template 320. The web 302 can be stopped by locking the high friction z-roller 306*a* and/or 306*b* with brakes 304 and maintaining tension with drive motors upstream and downstream of an imprinting zone. A vision system 312 can directly locate reference marks on the template 320 on the web 302. A UV curing light 314 can also directly harden a UV resist on the template 320.

Figure 3B:
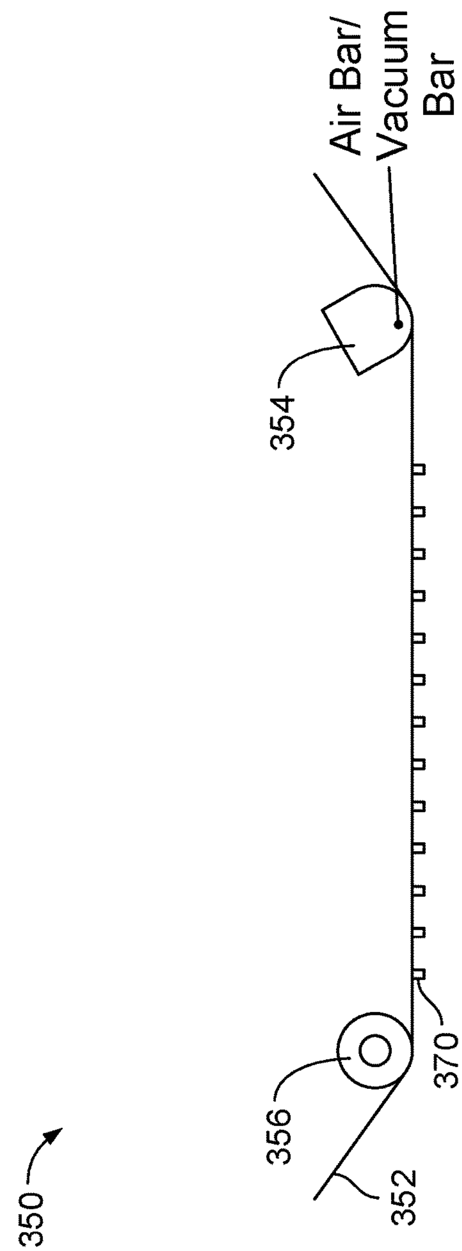
FIG. 3B shows a schematic diagram of an example air/vacuum bar chucking.

FIG. 3B shows a schematic diagram of an example air/vacuum bar chucking 350. An air bearing turn bar 354 is used in FIG. 3B in place of a leading z-roller, e.g., the z-roller 406*b* in FIG. 3A. A web 352 is drawn along the air bearing turn bar 354 and a z-roller 356. In some cases, the air bearing turn bar 354 can have its air pressure switch to vacuum and can act to clamp the web 352 after the web 352 is stopped in a region where template reference marks for a template 370 can be accurately located. As discussed in FIG. 13B with further details, the air bearing turn bar 354 can float the web 352 and do not put any lateral or angular constraint on the web 352.

IV. Glass Dome Template Backing Plate with Substrate Pressure Dome

A critical technical challenge to imprint on both sides of a substrate by imprinting one side at a time is the holding of the substrate for the imprint without damaging the patterns on the backside. If a pattern on the backside comes into contact with the vacuum chuck or wafer handling end effector, damage can occur from three or more modes: a first damage mode could be a scratch of the imprinted pattern; a second damage mode could happen if any debris falls on the vacuum chuck that is transferred to the substrate; a third damage mode can be for the vacuum chuck to be contaminated with uncured resist that somehow gets transferred to the substrate and cured as a defect. In some cases, a double sided process where the substrate is gripped by a robot along the edge can eliminate most of these defect issues, but the robot can add complication.

In some implementations, a vacuum chuck is created with pockets to relieve areas for the imprinted patterns. This can help relieve the issue of scratching and may not prevent other defect modes.

Figure 4A:
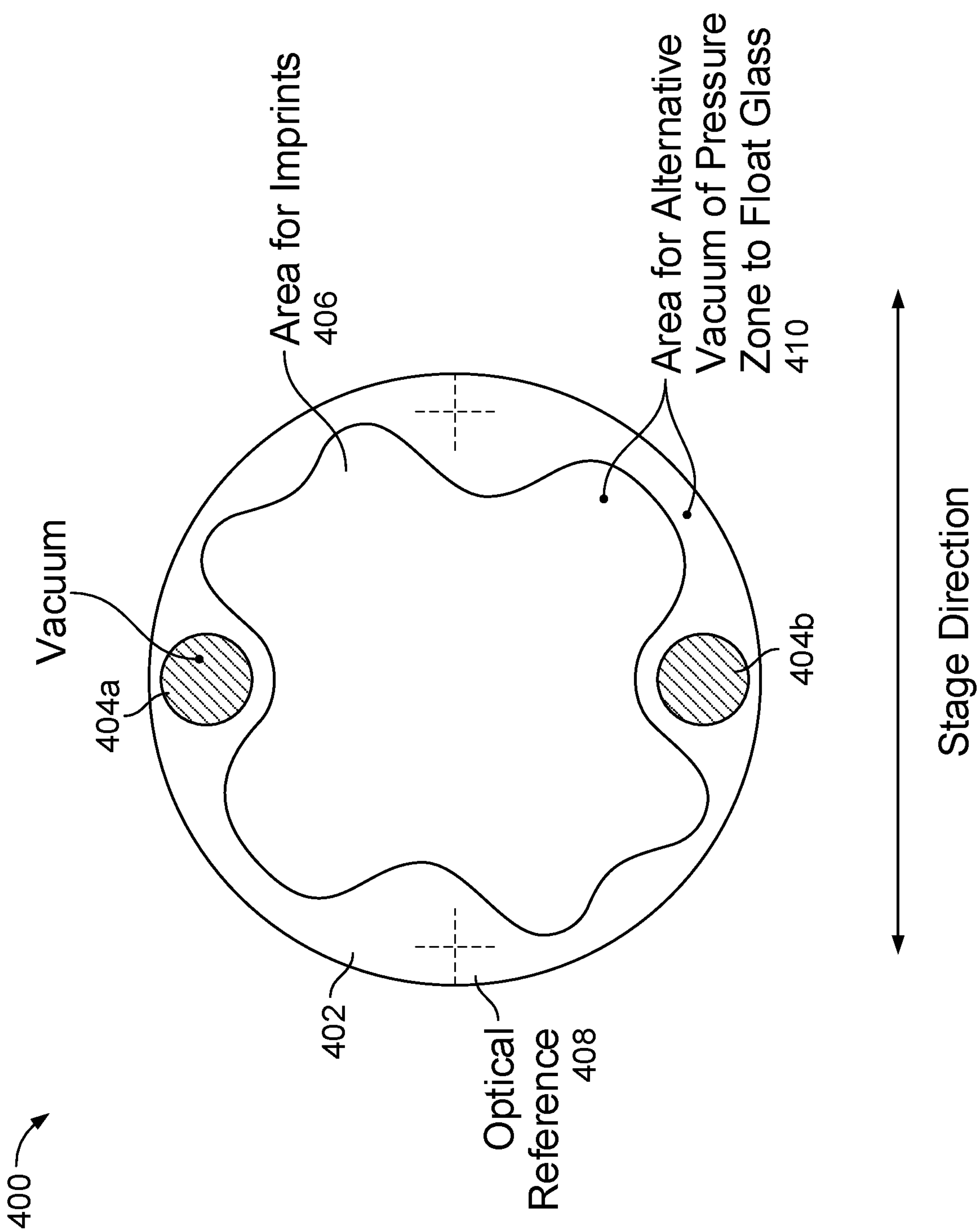
FIG. 4A shows a schematic diagram of example alternating regions of pressure and vacuum.

FIG. 4A shows a schematic diagram of example alternating regions 400 of pressure and vacuum. As illustrated, a substrate 402 is held with vacuum by a vacuum chuck in two small regions 404*a*, 404*b* around a perimeter of the substrate 402. Area 406 for imprinting is surrounded by the perimeter and in the center of the substrate 402. Optical reference marks 408 are around the perimeter and outside of the area 406. The substrate 402 has a tight array of vacuum and pressure zones 410 so as to minimize distortion of the substrate 402 while keeping the substrate 402 from touching the vacuum chuck. This wafer chucking can eliminate scratching and particle contamination. In some cases, this wafer chucking has local elastic distortions while chucking under the pressure and vacuum regions. The amplitude of the distortions can be exacerbated by a reduction in substrate thickness. However, these distorted areas may be flattened out during the imprinting process.

Figure 4B:
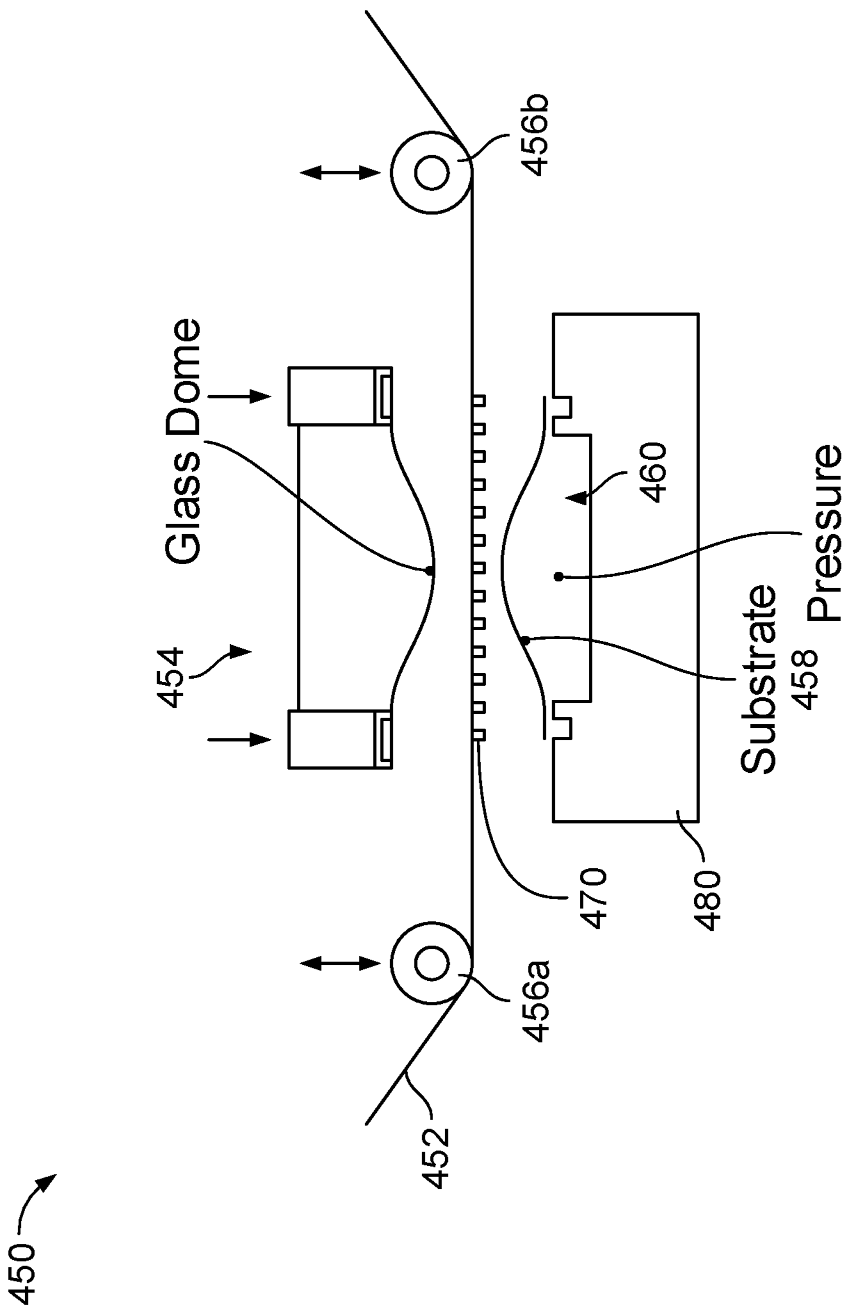
FIG. 4B shows a schematic diagram of an example of glass dome template backing plate with substrate pressure dome.

FIG. 4B shows a schematic diagram of an example 450 of glass dome template backing plate with substrate pressure dome. A web 452 is drawn along two z-rollers 456*a*, 456*b* that can be moved up and down vertically. A substrate 458 that is matched in mechanical bending properties of the glass dome 454 can be held by a vacuum chuck 460 on a stage 480 in an annular vacuum region along an edge. The center of the vacuum chuck 460 can have deep recess so as not to touch any critical features or transfer any debris. After alignment of the substrate 458 and the template 470, the glass dome 454 can push downward pressing the template 470 into the substrate 458, first making small circular contact in the center and growing to the edges of the substrate 458 as a full contact is achieved. Curing and separation can occur and the web 452 can be peeled off the substrate 458 in a typical manner around the z-roller 456*a*.

Examples of Locating Reference Marks and Imprinting Alignment

Another critical technical challenge of imprinting on both sides of a substrate is to accurately locate a reference mark on a template and a reference mark on a back side of the substrate.

Figure 5A:
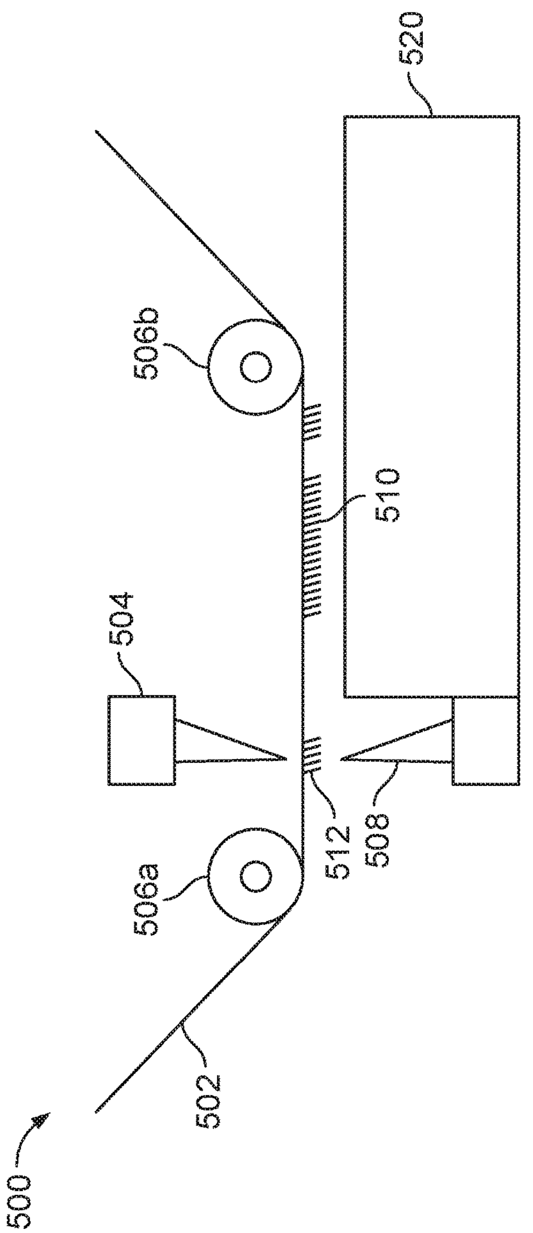
FIGS. 5A-5B show schematic diagrams of examples of locating reference marks on templates.
Figure 5B:
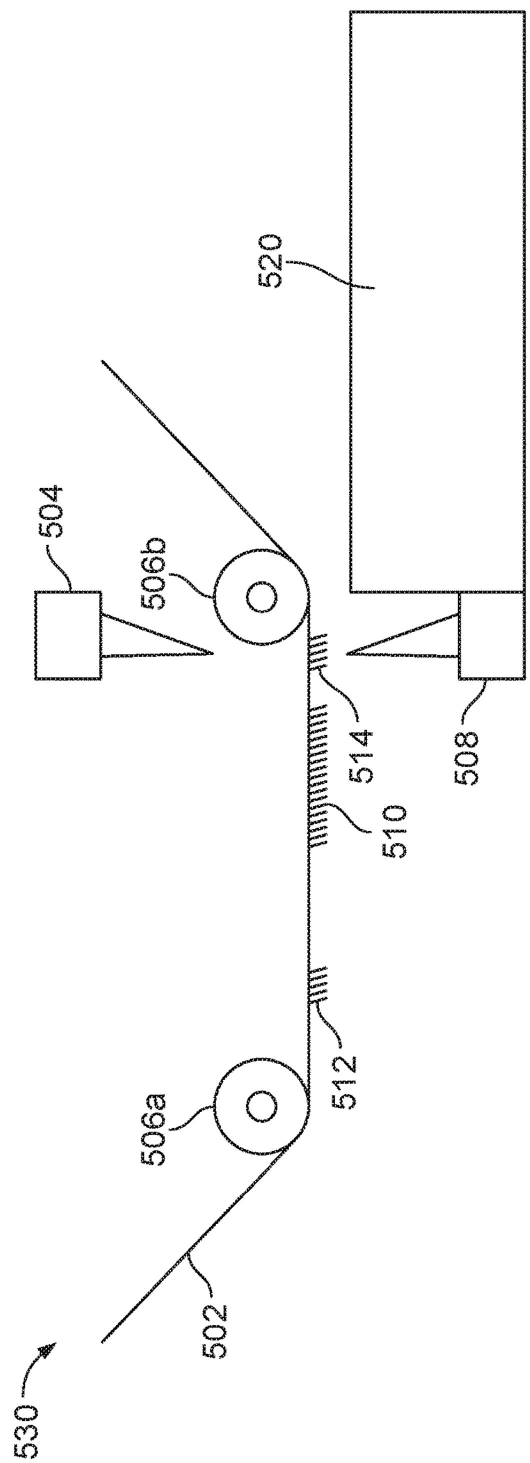

FIGS. 5A-5B show schematic diagrams of examples 500, 530 of locating reference marks on templates. A web 502 is drawn along two z-rollers 506*a*, 506*b*. As FIG. 5A shows, a reference mark 512, e.g., a diffraction pattern, on a template 510 is located with a laser light from a laser 504 from an opposite side of the web 502 when a protection layer is removed. A laser sensor 508 is positioned on a movable stage 520 and configured to detect the laser light 504 through the web 502. If the reference mark 512 on the template 510 is moved between the laser 504 and the laser sensor 508, the laser light is diffracted or blocked by the reference mark 512, and consequently an intensity of the laser light detected by the laser sensor 508 will be changed. Based on the change of the detected laser light intensity, a location of the reference mark 512 can be determined.

In some cases, as FIG. 5B shows, the laser 504 can also be used to detect a reference mark 514 on an edge of the template 510 when the template 510 is mounted to an edge of a vacuum chuck and looked up. The vacuum chuck can be an x-stage air-bearing vacuum chuck, e.g., the air/vacuum bar vacuum chuck 354 of FIG. 3B. A camera system can also be used to locate the reference mark 512 or 514 from the top of the template 510 or mounted facing the vacuum chuck.

Figure 5C:
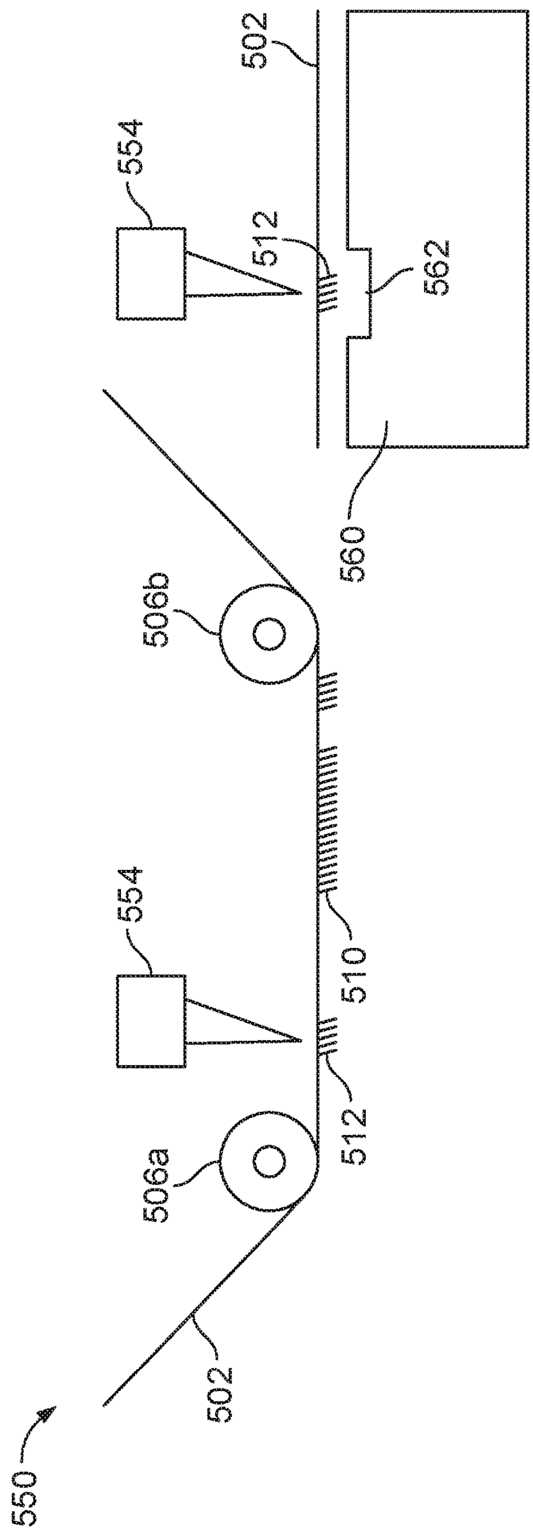
FIGS. 5C-5D show schematic diagrams of examples of locating reference marks on substrates.
Figure 5D:
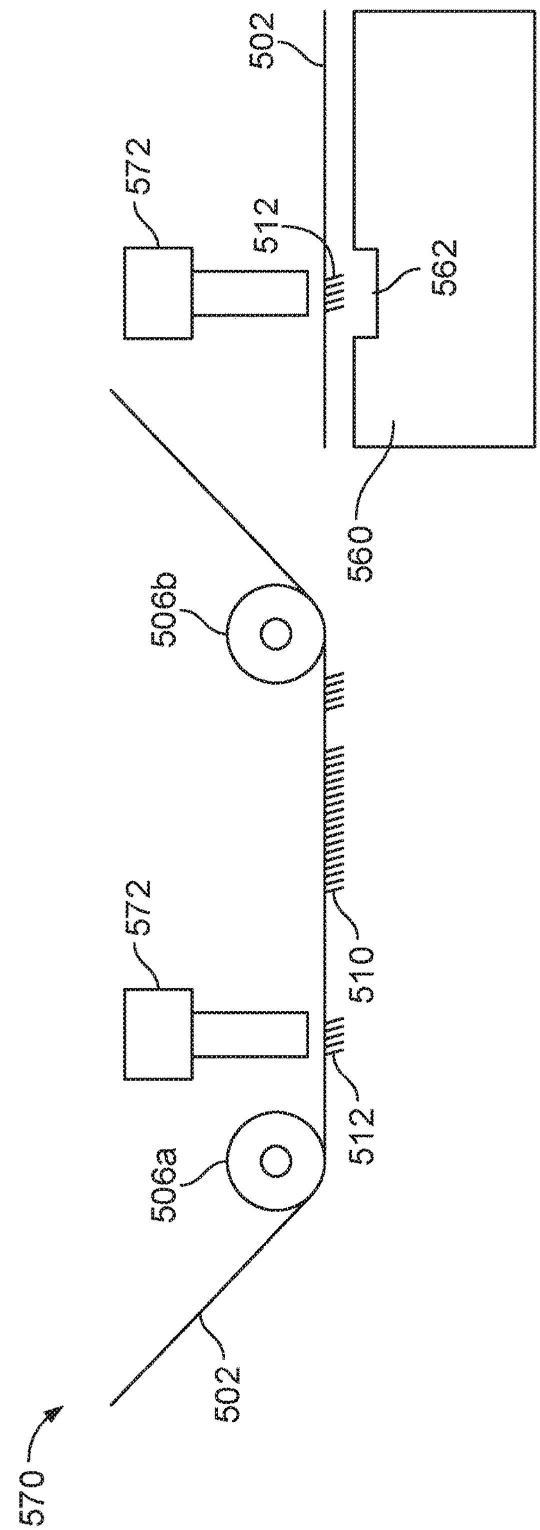

FIGS. 5C-5D show schematic diagrams of examples 550, 570 of locating reference marks on substrates. A separate laser 554 (FIG. 5C) or a camera system 572 (FIG. 5D) can find a reference mark 562 on a substrate 560 after the substrate 560 is acquired, e.g., by a vacuum chuck stage. This camera system 572 or the laser 554 can be pointed downward and fixed to check the substrate 560. The substrate 560 can be moved in x and y by the vacuum chuck stage to find a center of the reference mark 562.

If a camera system is used to look down at a reference mark 512 or 514 on the template 510, and a downward looking camera 572 is used to find the reference mark 562 on the substrate 560, it may be possible to place separate reference target on the vacuum chuck stage that is visible and measurable by both the cameras. Knowing a position of the x-y stage of this reference marks in both cameras can enable a simple way to initially align both vision systems.

Figure 5E:
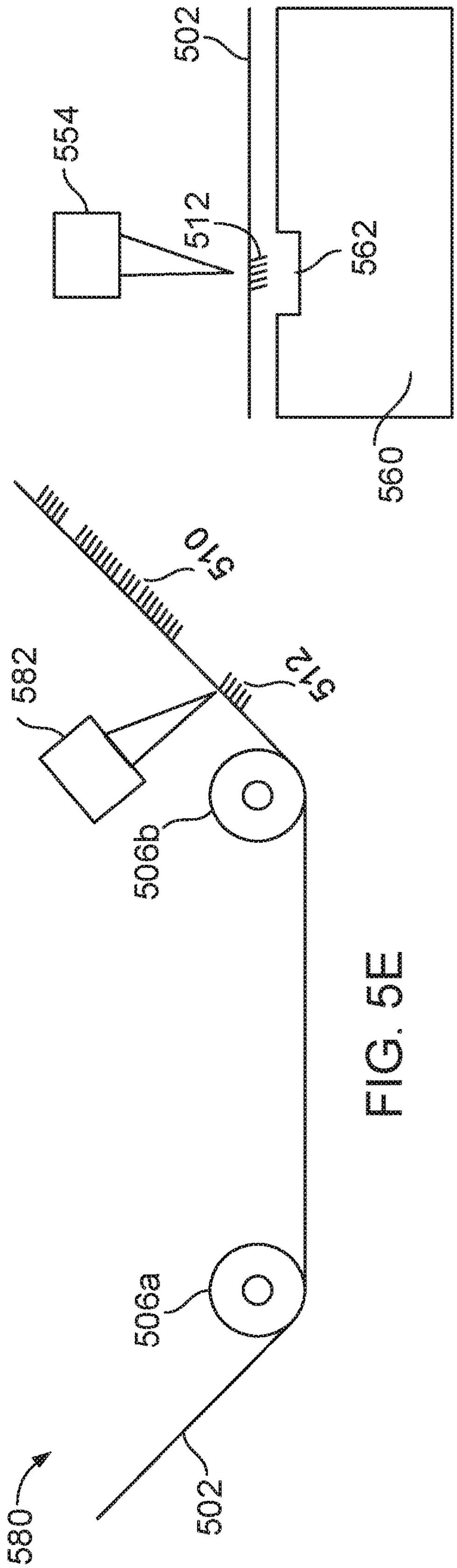
FIGS. 5E-5F show schematic diagrams of examples of locating reference marks on templates.
Figure 5F:
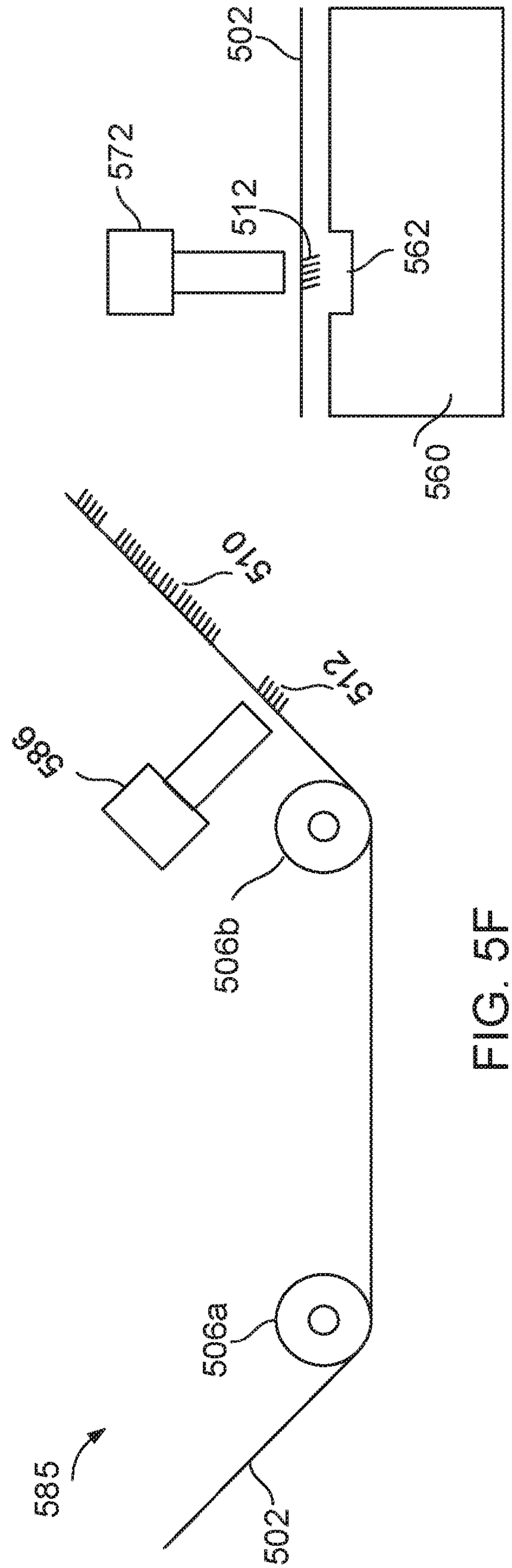

FIGS. 5E-5F show schematic diagrams of examples 580, 585 of locating reference marks on templates. Before the template 510 is moved for imprinting, the template 510 is positioned before the z-roller 506*b* with an angle relative to a horizontal direction. A laser 582 (FIG. 5E) or a camera system 586 (FIG. 5F) can be arranged before (or upstream) the z-roller 506*b* and aligned with the template 510 with a similar angle relative to the horizontal direction. A first-side imprint can be formed on a first side of the substrate 560, e.g., by aligning with a reference mark on the substrate 560. The angled laser 582 or the angled camera system 586 can locate a fiducial reference mark 512 on the template 510 when the web 502 does not need to move and before a second-side imprint to be formed on a second, opposite side of the substrate 560 starts. The fiducial reference mark 512 can be aligned with the reference mark 562 on the substrate 560 for the second-side imprint, e.g., using the laser 554 or the camera system 572 shown in FIGS. 5C and 5D. In this way, an imprecise template move of the flexible template 510, e.g., CRT, can be eliminated to thereby increase the alignment accuracy (overlay) of the second-side imprint relative to the first-side imprint formed on the first side of the substrate 560.

Figure 5G:
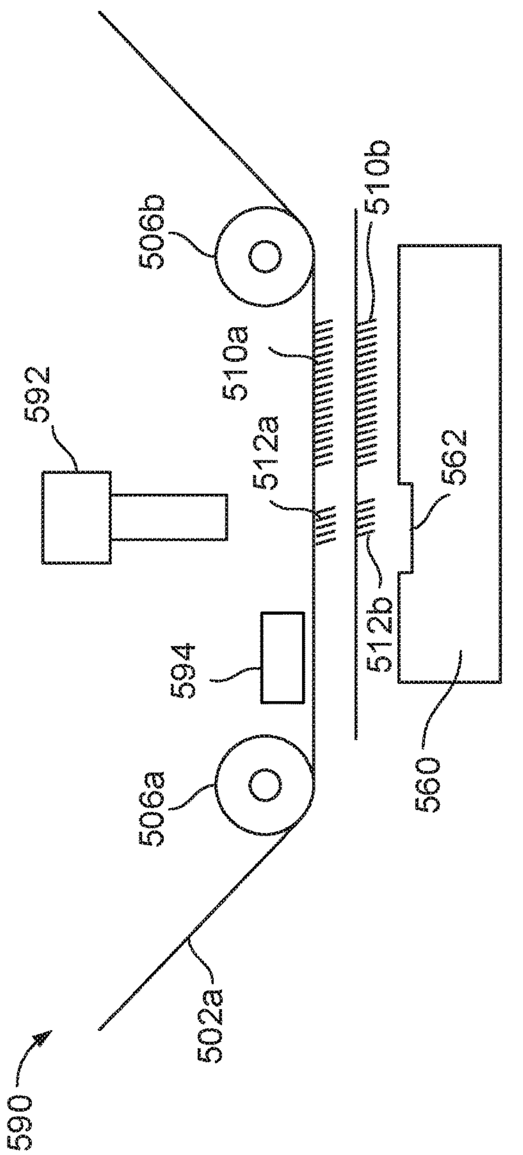
FIGS. 5G-5H show schematic diagrams of an example of side-to-side imprinting alignment with a vacuum chuck.
Figure 5H:
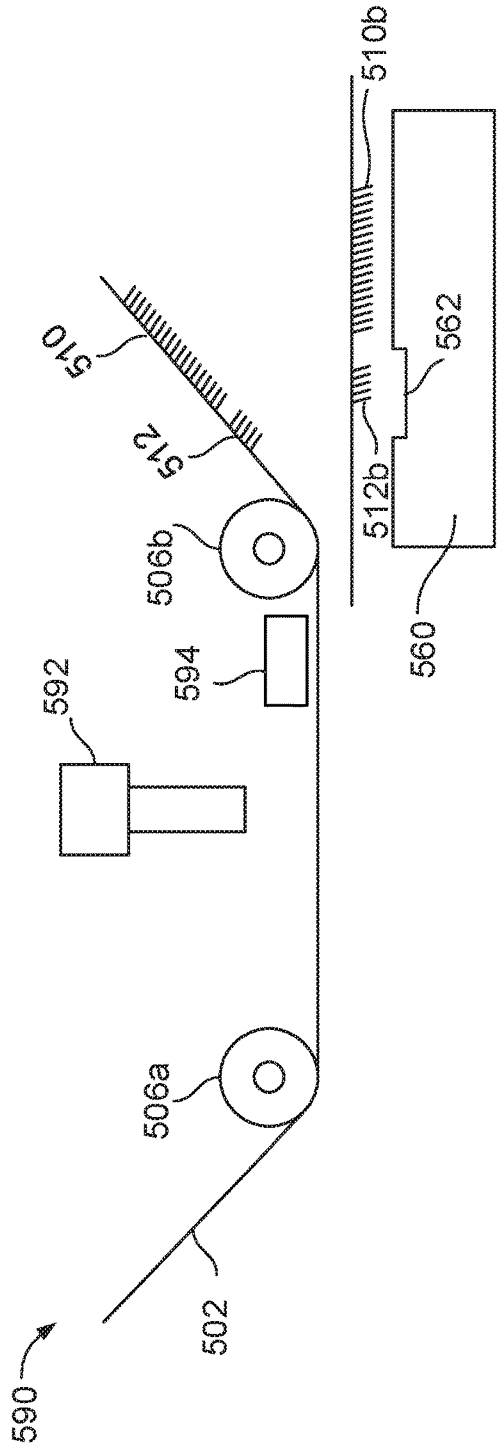

FIGS. 5G-5H show schematic diagrams of an example 590 of side-to-side imprinting alignment with vacuum chuck. A first imprint template 510*a* on a first web 502*a* can be under tension to remove sag, then a set of cameras, e.g., including a camera 592, can be used to locate a first fiducial mark 512*a* on the first imprint template 510*a*, optionally a second fiducial mark 512*b* on a second imprint template 510*b* of a second web 502*b*, and a fiducial mark 562 on a side of a substrate 560 in the same view. A stage holding the substrate 560 can bring the fiducial marks 512*a*, 512*b* and 562 into alignment. After the alignment, a vacuum chuck 594 above the first web 502*a* can grab the first imprint template 510*a* from above, as illustrated in FIG. 5G. The vacuum chuck 594 can be connected to a precision moving mechanism that can move the first imprint template 510*a* to an imprint-start position that is in synchronization with an imprint-start position of the substrate 560, as illustrated in FIG. 5H. This can eliminate an imprecise movement of the first imprint template 510*a* and allow for side-to-side imprint alignment, e.g., a first imprint to be formed from the first imprint template 510*a* on a first side of the substrate 560 to be aligned with a second imprint to be formed from the second imprinted template 510*b* on a second, opposite side of the substrate 560.

Example Squeegee Rollers

FIG. 6A shows a schematic diagram of an example 600 of using a squeegee roller during imprinting. A web 602 is drawn along two z-rollers 606*a*, 606*b*. After the web 602 is stopped and reference marks of a template 610 and a substrate 616 (not shown) by a vision system 612 are located, an additional roller 608 (called a squeegee roller) is configured to be lowered, e.g., along Z direction, into a back of the web 602 and push the template 610 into a resist 618 along the substrate 616 on a stage 620. The squeegee roller 608 can be able to traverse between the z-rollers 606*a*, 606*b* forcing out air as the roller 608 moves back and forth along X direction and can help to fill details of the template 610. The squeegee roller 608 can move out of the way, the resist 618 can be cured by a UV light 614, and the template 610 can be separated from the substrate 616 at the z-roller 606*a*.

FIG. 6B shows a schematic diagram of another example 650 of using a squeegee roller. A web 652 is drawn along two z-rollers 656*a*, 656*b*. After the web 652 is locked at the t-roller 656*b*, a camera can locate reference marks (or patterns) on a template 660, and a squeegee roller 658 can be parked near the locked z-roller 656*b*. The non-locked z-roller 656*a* can be raised up out of the way slightly along Z direction while an adjacent drive roller, that is, the squeegee roller 658, can maintain tension and be pulled in some portion of the web 652 along X direction as a web path is shortened. In some cases, a z-axis vacuum chuck can be on a substrate 666 to raise the substrate 666 until the substrate 666 touches the squeegee roller 658 and the locked z-roller 656*b*. The squeegee roller 658 can move away from the locked z-roller 656*b* while pushing the template 660 into a resist 668 on the substrate 666 and forcing out the air. The squeegee roller 658 can stop after the template 660 is completely in contact with the substrate 666 and the resist 668 is cured. After curing, the web 652 and the substrate 666 can advance together and the template separation can occur at the z-roller 656*a*.

Example Theta Adjustment and Web Angle Measurement

A unique method of correcting for angular misalignment in a theta-z direction in small amounts is to move one of z-rollers relative to each other along its axis. FIG. 7A shows a schematic diagram of an example 700 of implementing this method. A web 702 can move with z-rollers 706*a*, 706*b* due to high friction, wrap angle, and/or tension. In some cases, an air bearing bushing can be used instead of a roller bearing that allows for low friction in the rotating and axial directions. A thrusting actuator (not shown) can push on one end of the z-roller shaft and a spring can push on the other end to remove backlash. This alignment could cause small waves in the web 702 if the web 702 was displaced too much, however, it might work well enough for small angles. Adjusting the position in this manner can eliminate a need for large, massive, expensive rotational stages either mounted to an x-stage or rotating part or all of the web path and its supporting rollers as a single unit.

Web angle change is a large component to web alignment error when making a double-side imprinting. FIG. 7B shows a schematic diagram of an example method 750 of measuring a web angle for correcting feed-forward imprinting alignment. The method 750 can directly measure the web angle, e.g., immediately before each imprinting, and the substrate can be repositioned, e.g., by a stage under the substrate chuck, based on the measured web angle prior to starting the imprinting. For example, as illustrated in FIG. 7B, two non-contact sensors 710*a*, 710*b* can be positioned upstream the z-roller 706*b* on an edge of the web 702 and be used in conjunction to measure an exact angle of the web 702. The sensors 710*a*, 710*b* are stationary and do not move with the web 702.

Examples of Double-Sided Imprinting

I. One Step Double Side Imprint; Substrate Nip Feeding

FIG. 8 shows a schematic diagram of an example system 800 of making double-sided imprints on a substrate. The system 800 is configured to use two webs 802*a*, 802*b* with one above and one below. The web 802*a* is drawn along two z-rollers 804*a* and 804*b*, and the web 802*b* is drawn along two z-rollers 804*c* and 804*d*. The webs 802*a*, 802*b* include respective templates 806*a*, 806*b*. The top and bottom templates 806*a*, 806*b* can be located with a vision system, and precision adjustment axis can be distributed among top and bottom web supports such that the webs 802*a*, 802*b* can be brought into alignment with each other.

In some cases, as FIG. 8 shows, a substrate 810 is coated with resist 808*a*, and the template 806*b* is coated with resist 808*b* under the bottom side of the substrate 810 before the template 806*b* rolls into an imprinting zone, e.g., along X direction. In some cases, the substrate 810 can be coated with resist on both top and bottom sides before being rolled into the imprinting zone. A loading robot can be configured to hold the substrate 810 on edges and feeding the substrate 810 into nips between the rollers 804*b*, 804*d* as the webs 802*a*, 802*b* advance while the top and bottom z-rollers 804*b*, 804*d* force the resists 808*a*, 808*b* into details of the templates 806*a*, 806*b* and remove air. Once the substrate 810 is in complete contact with the templates 806*a*, 806*b*, the webs 802*a*, 802*b* and the robot can stop and a UV light can cure the resists 808*a*, 808*b*. In some implementations, the webs 802*a*, 802*b* and the robot are reversed and the templates 806*a*, 806*b* are separated from the substrate 810. In some implementations, the webs 802*a*, 802*b* are advanced and pulled away from the rollers 804*a*, 804*c* to separate from the substrate 810. The substrate 810 can be held by another robot on the left side of the rollers 804*a*, 804*c*. This process can improve imprinting throughput, although it may not accurately position the imprints.

II. One Step Double Side Imprint with Double Glass Dome

FIG. 9 shows a schematic diagram of another example system 900 of forming imprints on both sides of a substrate 950 at once. The system 900 is configured to combine double imprinting method described in FIG. 8 with each side imprinting using a separate glass dome as described in FIG. 2. A web 902 is drawn along two z-rollers 906*a* and 906*b*, and a web 952 is drawn along two z-rollers 956*a* and 956*b*. The webs 902, 952 include respective templates 920, 970. The system 900 can have the double template rolls 920, 970 top and bottom, e.g., separated by a few millimeters. The system 900 includes two pressurized glass domes 904 and 954 top and bottom, vision alignment systems 912, 962 and precision adjustment axis (not shown) distributed among the system components for a proper relative alignment of the top and bottom templates 920, 970 along Z direction. The system 900 is also configured to dispense resist 930 on the top and bottom surfaces of a substrate 950 or on the template 920 and/or the template 970 itself.

The sequence of imprinting can be as follows: the webs 902 and 952 are advanced such that a new top template 920 and a new bottom template 970 are brought together into an imprinting zone. The vision systems 912 and 962 locate reference marks on the templates 920, 970, and the various adjustment axis align the top and bottom templates 920, 970. The glass pressure domes 904 and 954 are brought into contact with the webs 902, 952 on the top and bottom sides. There can be a fine adjustment axis of the glass dome 904 or 954 configured to make a small correction for optimum template alignment after the glass dome 904 Or 954 is in contact with the web 902 or 952. Resist 930 is applied to the top and bottom surfaces of the substrate 950. A robot, e.g., with a special low profile end-effector, can present the substrate 950 between the top and bottom templates 920, 970 by grabbing the substrate 950 on the edges. The top and bottom glass domes 904 and 954 can come together evenly such that z position of the substrate 950 is determined by the positions of the pressure domes 904 and 954 as the pressure domes came together. When the domes 904, 954 are fully flattened and the templates 920, 970 have filled completely, the resist 930 is cured by a UV lamp 914. Then the pressure domes 904, 954 are retracted from the top and bottom webs 902, 952. The webs 902, 952 and the robot can reverse together and the templates 920 and 970 are peeled off the substrate 950 at the z-rollers 906*a*, 956*a*.

The technologies described above can address a challenge for double-side imprinting that is, to successfully embody all of the process requirements into one tool architecture. The technologies can facilitate UV curing and allow for alignment, even force application, UV resist flow, nano-feature formation, and template and feature separation.

III. Substrate on a Roll

It is desirable to use a suitable low cost substrate material with optical properties and flexible enough to be wound on a roll, which can allow significant manufacturing cost reductions in high volume. Most of the imprinting methods described above might be adaptable to use substrates supplied in a roll form, particularly the double glass dome imprinting process as described in FIG. 9. The handling of the substrate can be simpler than an edge gripping method.

FIG. 10 shows a schematic diagram of an example system 1000 that uses a low-cost, flexible substrate 1030 in a roll format with double glass dome imprinting. The double glass dome printing arrangement of the system 1000 is similar to the system 900 of FIG. 9. A first web 1002 is drawn from roller 1008*a* along two z-rollers 1006*a* and 1006*b* to roller 1008*b*. The web 1002 can be rotated back from roller 1008*b* to roller 1008*a*. The web 1002 includes a first template 1010 that includes imprinting features to be imprinted on a top side of the substrate 1030. A second web 1052 is drawn from roller 1058*a* along two z-rollers 1056*a* and 1056*b* to roller 1058*b*. The web 1052 can be rotated back from roller 1058*b* to roller 1058*a*. The second web 1052 includes a second template 1060 that includes imprinting features to be imprinted on a bottom side of the substrate 1030. The system 1000 can include two pressurized glass domes 1004 and 1054 top and bottom, vision alignment systems 1012, 1062 and a precision adjustment axis (not shown) distributed amongst the system components for a proper relative alignment of the top and bottom templates 1010, 1060 along Z direction. The system 1000 can be configured to dispense resist, e.g., a UV curable resist, on the top and bottom surfaces of the substrate 1030 or on the template 1010 and/or the template 1060 itself.

The substrate 1030 is drawn from roller 1032 to roller 1034. In some cases, the substrate 1030 is a blank substrate rolled up on roller 1032, as illustrated in FIG. 10. In some cases, a roll of blank substrate is protected by a layer of film that is rolled-up together with the blank substrate to be the substrate 1030. As the substrate 1030 enters the imprinting region of the system 1000, the protective cover film can be removed. The templates 1010 and 1060 can be brought into contact with the substrate 1030 with the pressurized domes 1004 and 1054, respectively. Air can be pushed out of the way until the templates 1010 and 1060 are in full contact with the substrate 1030, and a UV light 1014 can then cure the resist when the webs 1002, 1052 are stationary. Thus, the blank substrate 1030 becomes a substrate 1040 having both sides imprinted with corresponding features of the templates 1010 and 1060. The domes 1004 and 1054 can be retracted, e.g., by vacuum chucks, from the backs of the templates 1010 and 1060, and separation of the templates 1010, 1060 and the substrate 1040 would occur as the webs 1002, 1052 are advanced where a path of the substrate 1030 path diverges from the paths of the templates 1010, 1060. At this point the imprinted features are fully formed on the substrate 1040.

In some implementations, as FIG. 10 illustrates, the substrate 1040 is wound with a first layer of protection film 1070 on the back side and a second layer of protection film (not shown) on the front side into a substrate 1042 rolled onto roller 1034. The first layer of protection film 1070 can be drawn from roller 1072*a* through a z-roller 1072*b* onto the back side of the substrate 1040. The second layer of protection film can be drawn from another roller (not shown) through another z-roller (not shown) onto the front side of the substrate 1040. A squeegee roller 1036, e.g., the squeegee roller 608 of FIG. 6A, can be used to press the protective films on the substrate 1040. In some cases, another process can be applied to the imprinted substrate 1040 before winding the protective films or the substrate 1042 with imprinted features on both sides can be cut from the roll.

This technology described above allows single-sided patterning of substrates as well as patterning on substrates that have tight front side-to-back side alignment to be done by keeping them in a roll format to simplify material handling. By suppling low-cost substrates in a roll format, this technology can be economical to imprint patterns on both sides of the substrates and keep the substrates in this format until individual parts need to be singulated.

Example Tools for Aligned-Double-Sided Imprints

Nanofabrication equipment typically forms features one side at a time. If a single sided process is used to create features on both sides, it may essentially take over 2× time and 2× equipment but still have an alignment step to align a substrate feature to a template feature. Moreover, the imprinted features after forming are fragile and susceptible to handling damage. These types of substrates are typically handled with backside contact, but in the case with features on both sides, touching the backside of the substrate may damage these features.

Figure 11A:
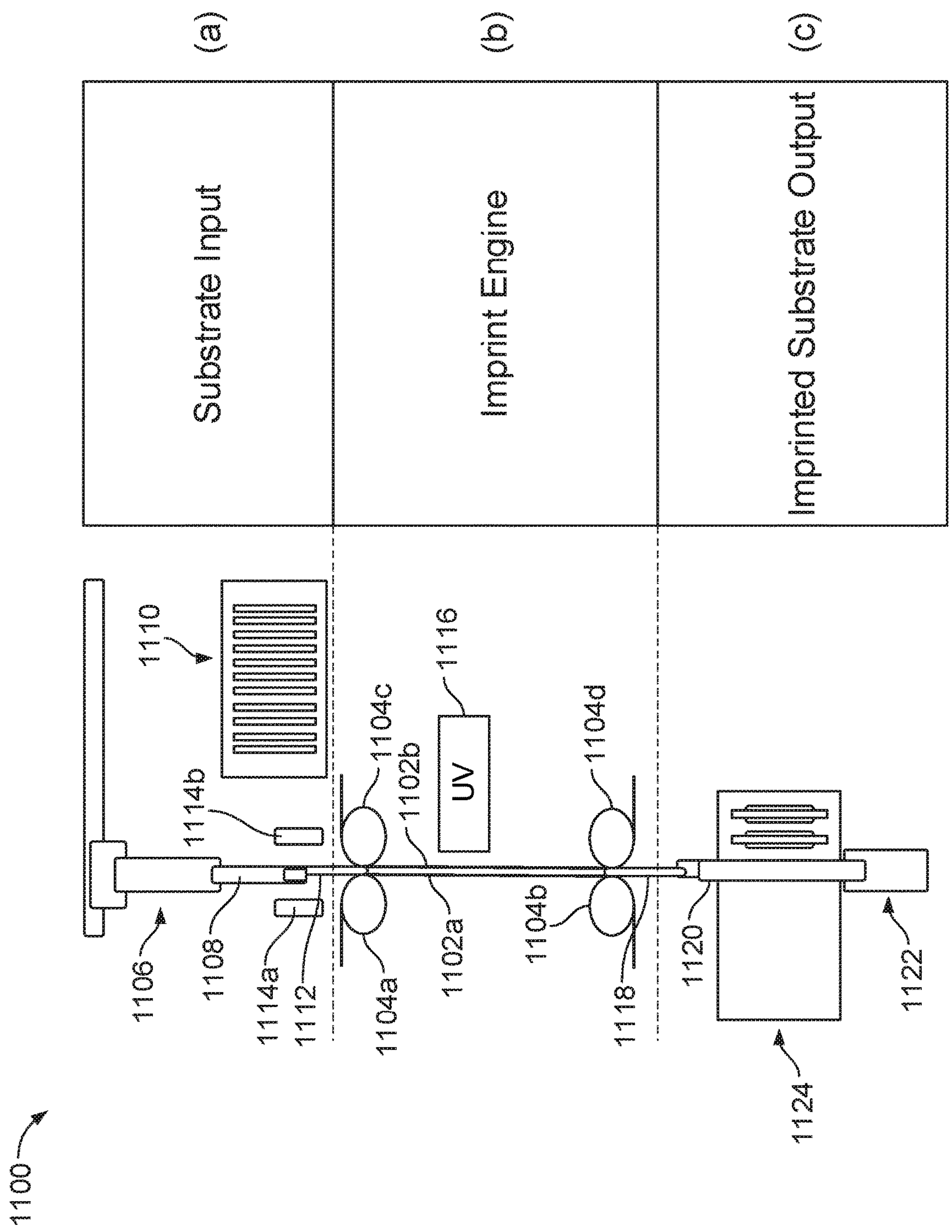
FIG. 11A shows a schematic diagram of an example tool for double-sided imprinting.

FIG. 11A shows a schematic diagram of an example tool 1100 for aligned-double-sided imprints on substrates. This tool is configured to fabricate imprinted features on both sides of a substrate whose positions are tightly controlled with respect to each other. Front side and back side templates can be pre-aligned to each other optically before imprinting and features on both of the sides can be created simultaneously. This tool is also configured to handle the substrate without damage of the features imprinted on both sides of the substrate.

In some implementations, the imprinting tool 1100 includes three zones: (a) substrate input; (b) imprint engine; and (c) imprinted substrate output. Two webs 1102*a*, 1102*b* are drawn through z-rollers 1104*a*, 1104*c* to z-rollers 1104*b*, 1104*d*, respectively. The webs 1102*a*, 1102*b* have respective flexible templates, e.g., CRTs, that are drawn together in a region where a substrate 1112 is inserted. The substrate 1112 can be a wafer substrate and taken out from a substrate container 1110 storing a number of blank substrates. A robot 1106 is configured to take via a robot holder 1108 the substrate 1112 from the container 1110 and insert into the region between the flexible templates.

Before the substrate 1112 is inserted, reference marks on the templates of each web 1102*a*, 1102*b* can be optically aligned to one another with a camera system and actuation that allows relative positioning of the webs 1102*a*, 1102*b*. As discussed with further details below, the tool 1100 of FIG. 11A can include a clamping system for clamping the two webs 1102*a* and 1102*b*. After the reference marks are aligned, the webs 1102*a*, 1102*b* can be clamped to each other to eliminate relative motion of the templates. The webs 1102*a*, 1102*b* can be reversed to allow for the insertion of the substrate 1112, and UV curable resist from resist injection heads 1114*a*, 1114*b* can be applied to the templates and then the templates can be brought back together in alignment with the substrate and resist between them. As the substrate 1112 travels through a process zone in zone (b), a UV light source 1116 can cure the resist. After the curing, the clamping system can be unclamped to separate the webs 1102*a*, 1102*b* to allow the imprinted substrate 1118 pass through, as illustrated in FIG. 12H below. The fully imprinted substrate 1118 from the substrate 1112 can then exit and be taken by another robot holder 1120 of another robot 1122 and stored into an imprinted substrate container 1124. The imprinted substrates 1118 in the container 1124 can be stored in soft cushions and separated from each other.

Figure 11B:
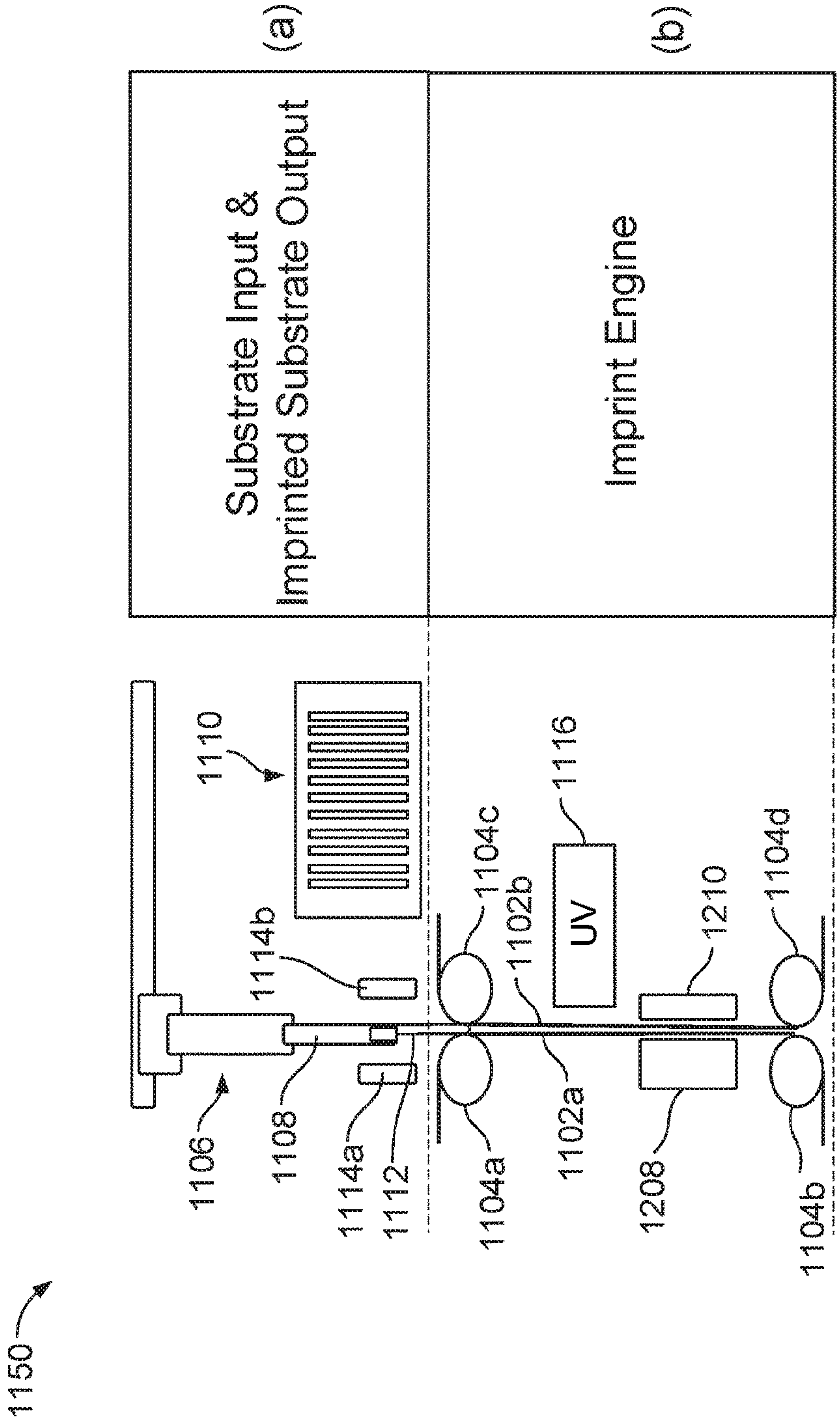
FIG. 11B shows a schematic diagram of another example tool for double-sided imprinting.

FIG. 11B shows a schematic diagram of an example tool 1150 for aligned-double-sided imprints on substrates. Compared to the tool 1100 of FIG. 11A, the tool 1150 does not include the unloading automation having the robot 1122 and the container 1124 in zone (c). Instead, the imprinted substrate 1118 can be reversed back to zone (a) and stored in the container 1110. In this way, the tool 1150 can eliminate the unloading automation for the imprinted substrate 1118 and combine the unloading automation with the substrate loading automation. Similar to the tool 1100, the tool 1150 can also include a clamping system having a vacuum chuck 1208 for the web 1102*a* and a clamp 1210 for the web 1102*b*. After the reference marks on the web 1102*a* are aligned with the reference marks on the web 1102*b*, the webs 1102*a*, 1102*b* can be clamped together by the clamping system to each other to eliminate relative motion of the templates.

In an example processing sequence, the substrate 1112 is lowered into a top between the two templates on the webs 1102*a* and 1102*b* for double-side imprinting. After the imprinting is completed and fully cured with the UV light source 1116, the z-rollers 1104*a* and 1104*c* can be reversely rotated, such that the fully imprinted substrate 1118 is retrieved from the top by the same robot handler 1108 and the robot 1106. In this way, the vacuum chuck 1208 and the clamp 1210 do not need to be unclamped to allow the imprinted substrate 1118 exit from the bottom and can keep the templates aligned. Thus, the configuration of the tool 1150 (and the processing sequence) can allow the template alignment to be maintained for each sequential substrate, which can yield a significant decrease in process time because the time consuming alignment process is only done once on each set of templates.

Figures 2, 12A:
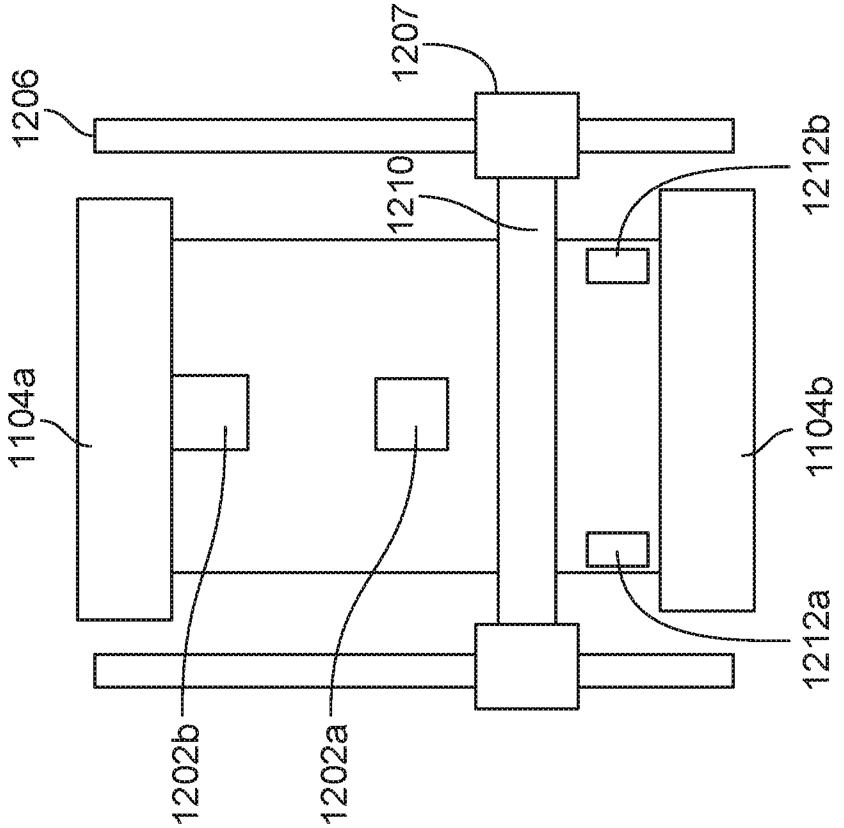
Figures 1, 12A:
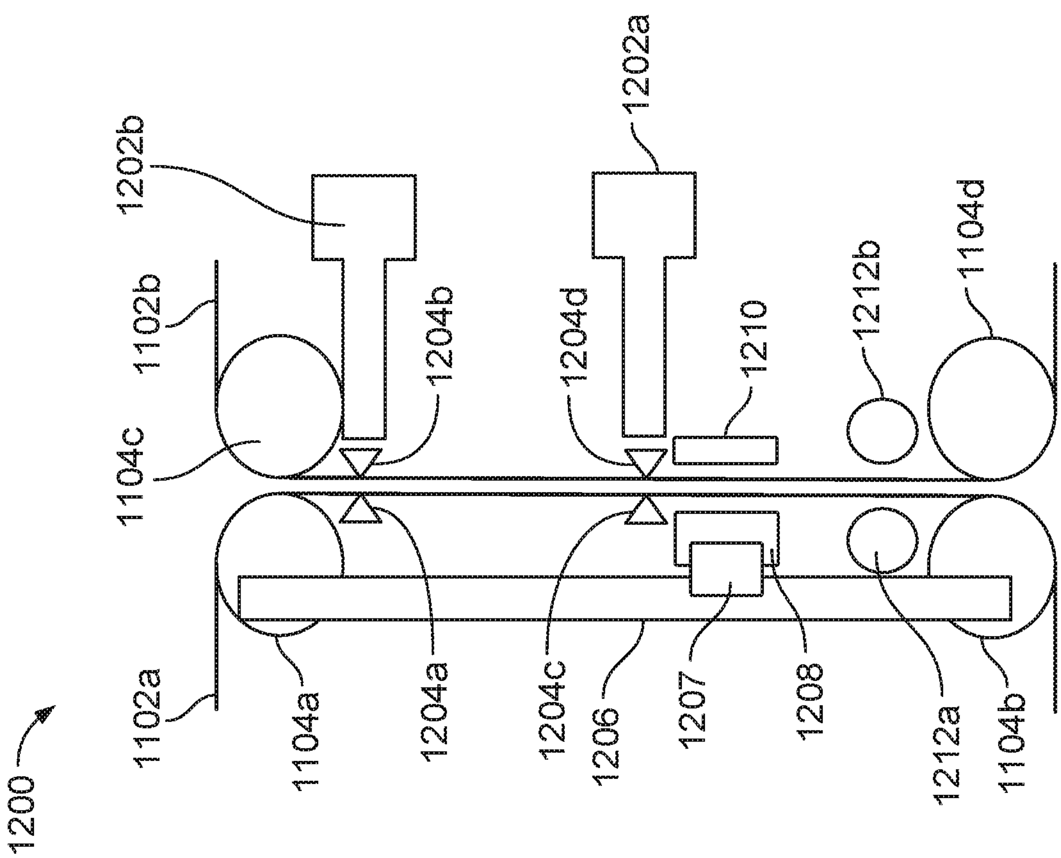
Figures 5, 12A:
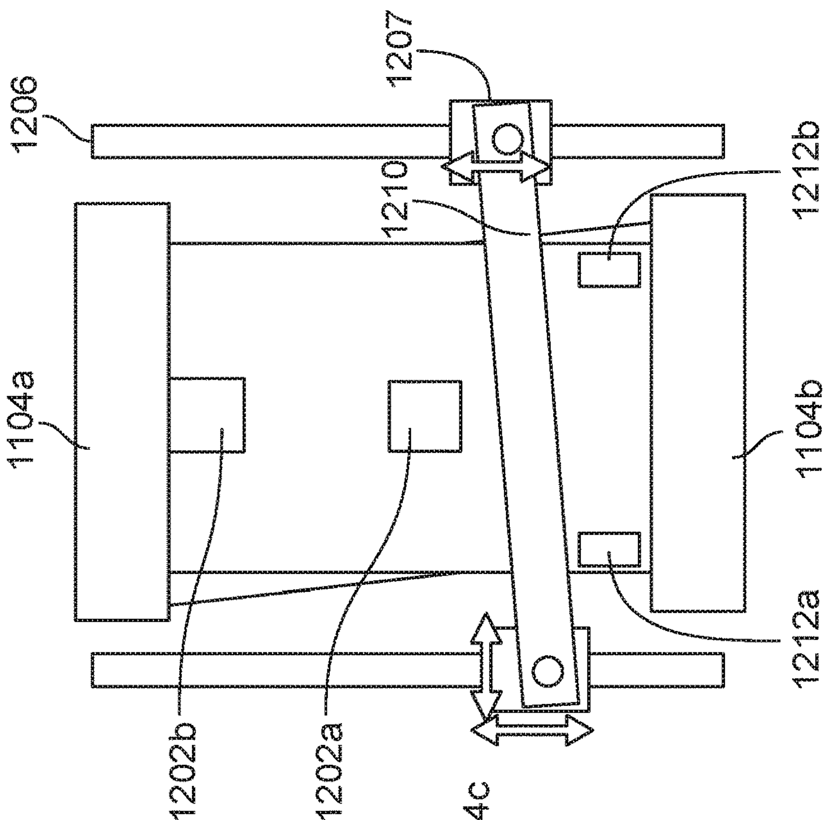
Figures 4, 12A:
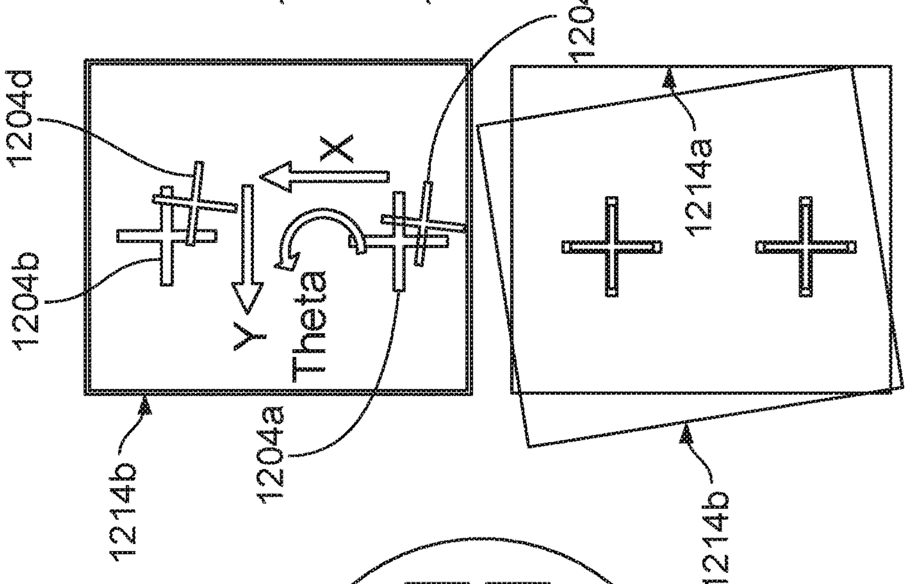
Figures 3, 12A:
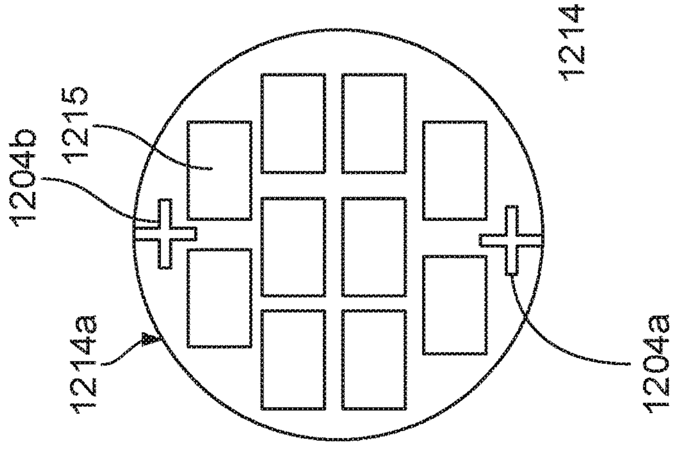
Figures 2, 12B:
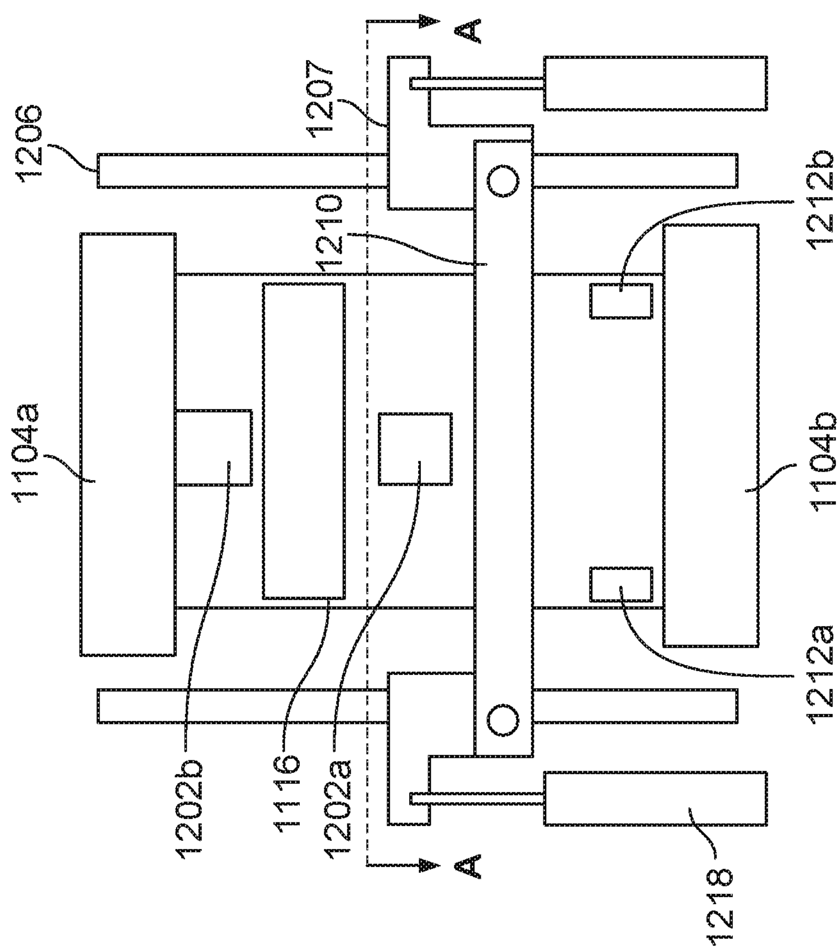
Figures 1, 12B:
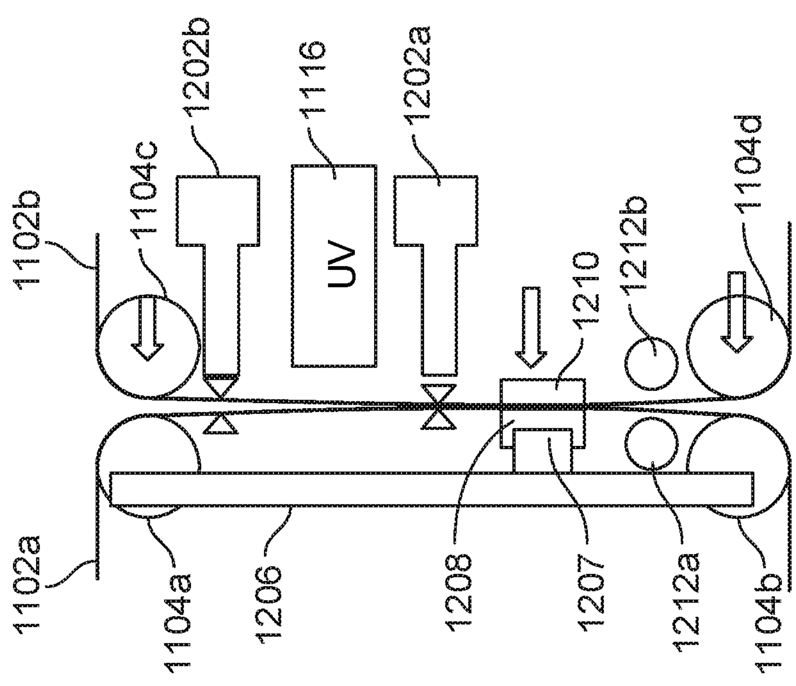
Figures 3, 12B:
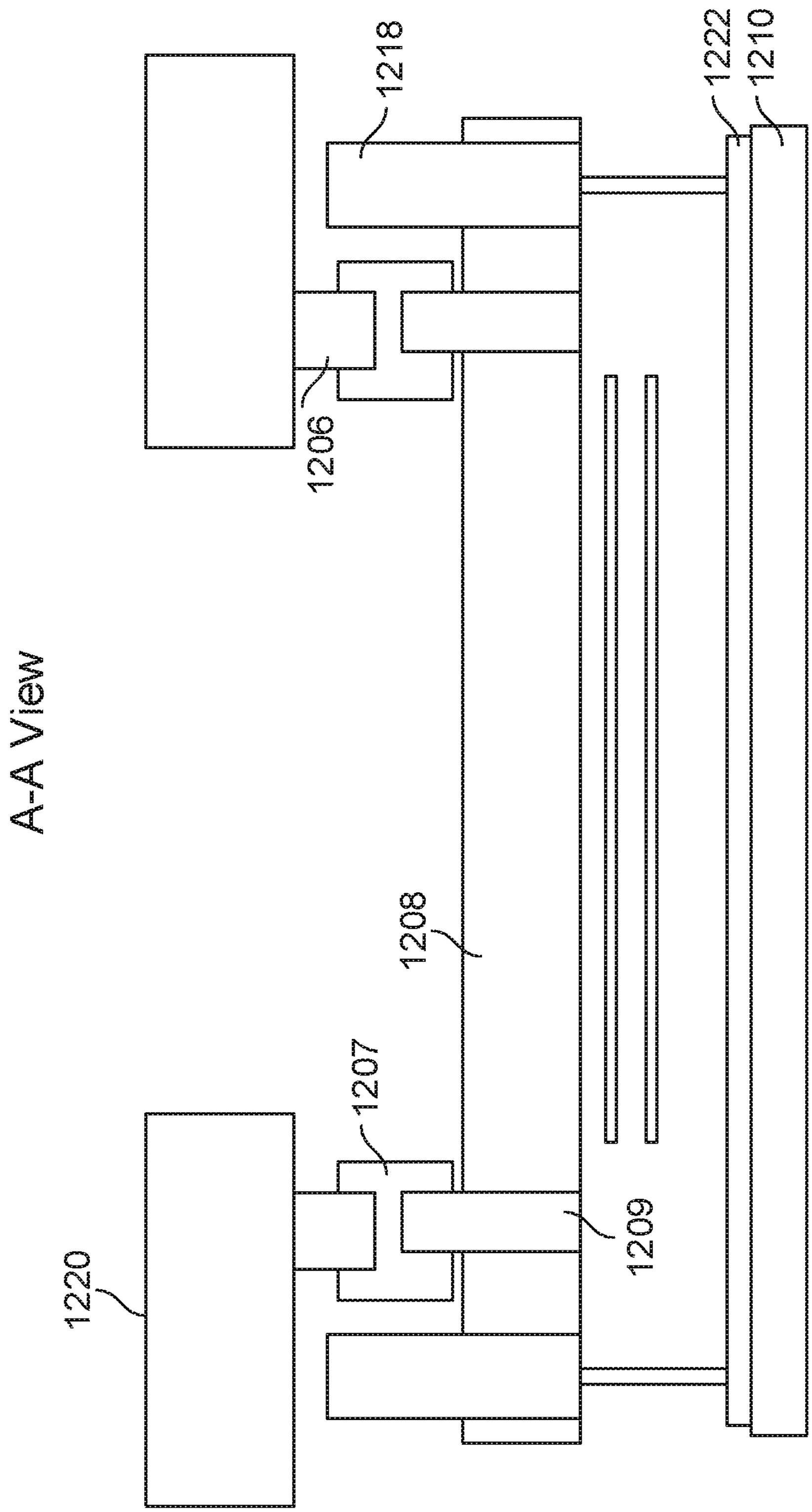
Figure 12D:
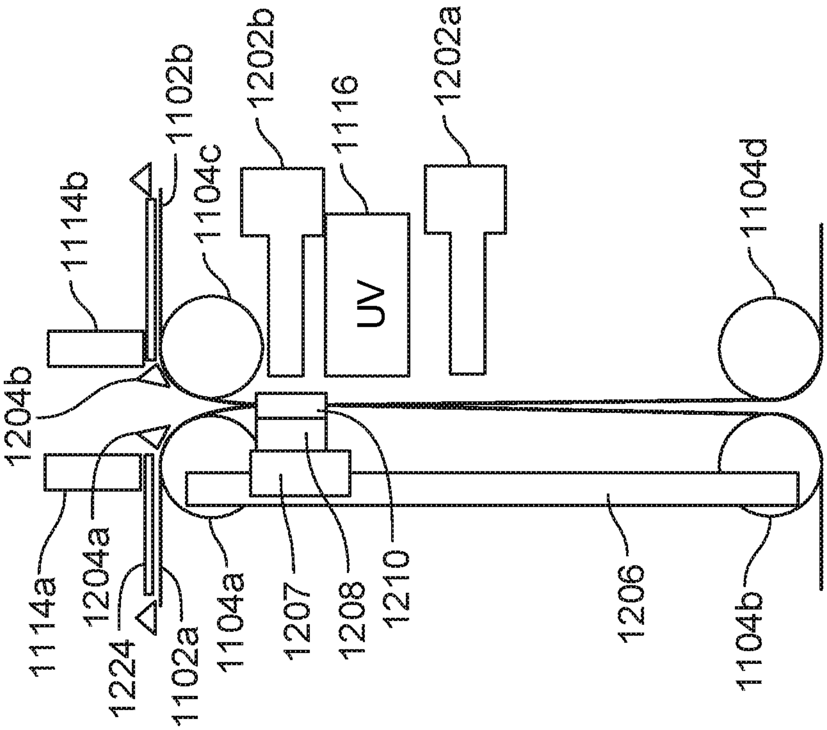
Figure 12C:
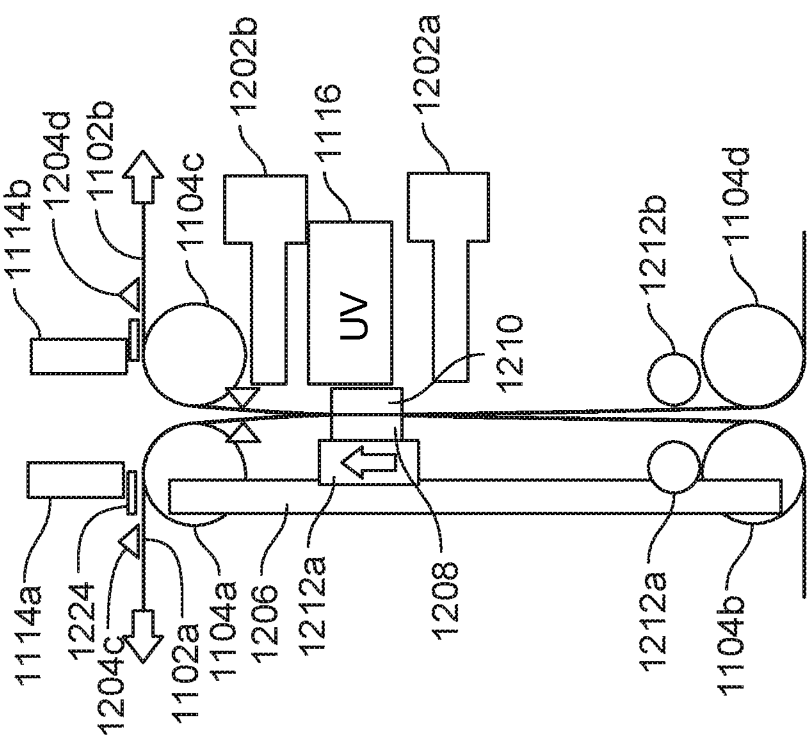
Figure 12E:
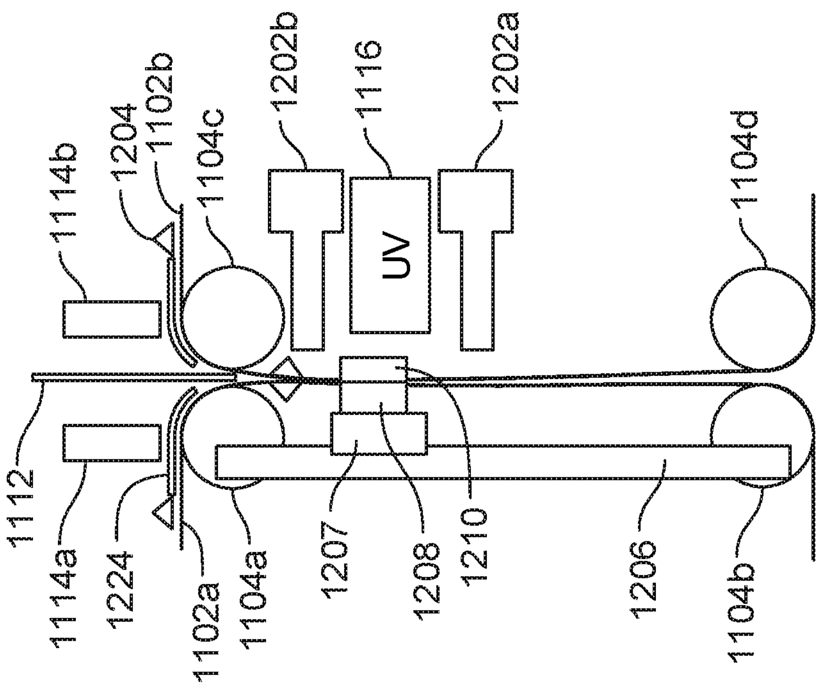
Figure 12F:
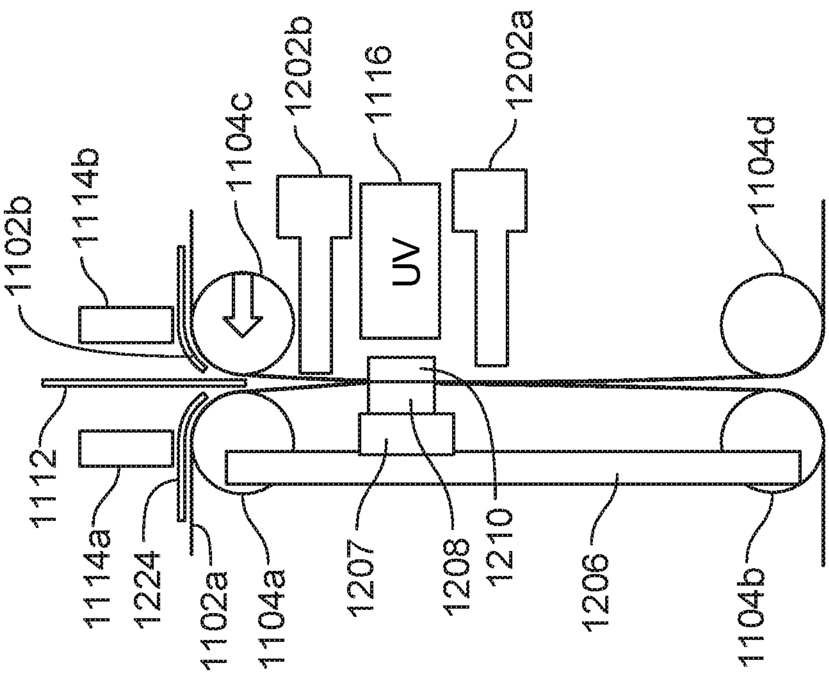
Figure 12G:
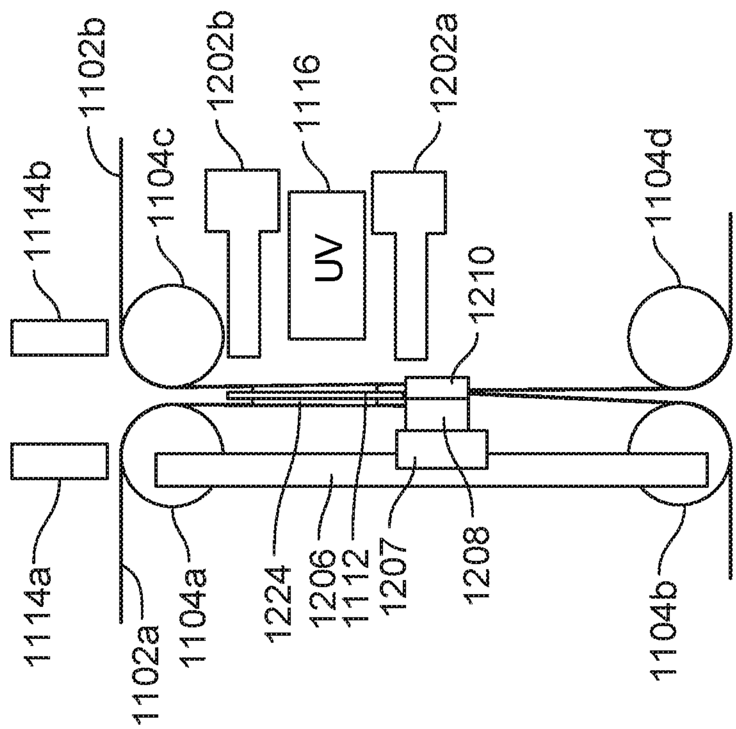
Figure 12H:
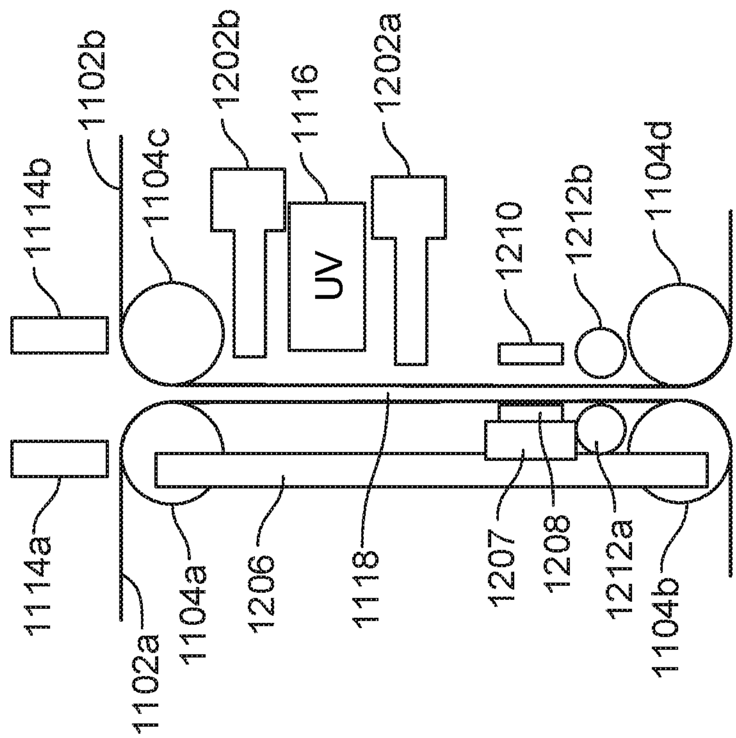
Figure 12I:
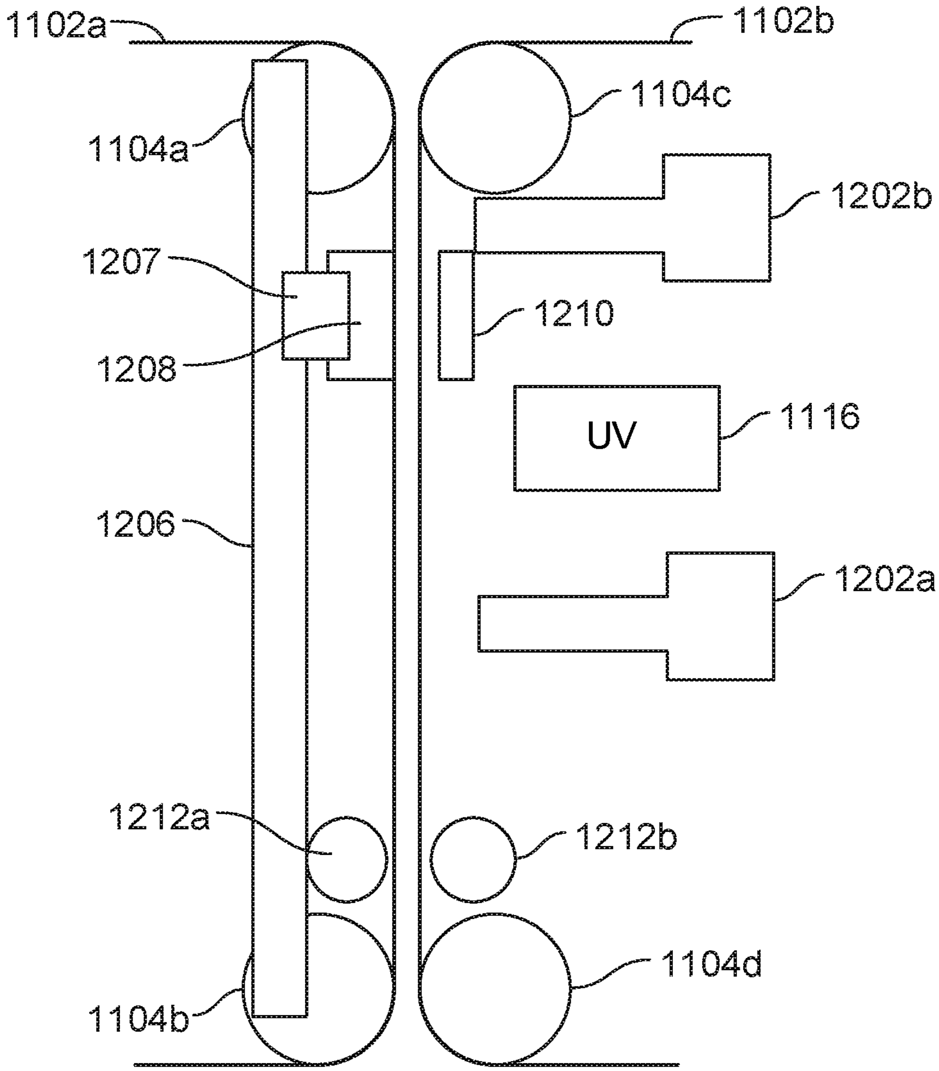

FIGS. 12A-1 to FIG. 12I show schematic diagrams of example operational procedures of the imprinting tool 1100 of FIG. 11A. For illustration only, the operation procedures show the concept where the substrates travel in a vertical direction from top to bottom. Other configurations, e.g., the tool being inverted so that the substrates can travel from bottom to top or even horizontally, can also be implemented. It is also noted that one or more operational procedures shown in FIGS. 12A-1 to FIG. 12I can be also used for the imprinting tool 1150 of FIG. 11B.

FIGS. 12A-1 to 12A-5 show alignment of reference marks 1204*a*, 1204*b*, 1204*c*, 1204*d* on templates 1214*a*, 1214*b* of the webs 1102*a*, 1102*b*. The imprinting tool 1100 can includes a clamping system, including a vacuum chuck 1208 for the web 1102*a* and a clamp 1210 for the web 1102*b*. The vacuum chuck 1208 can be the vacuum chuck 308 or 310 of FIG. 3A. The vacuum chuck 1208 is positioned on linear guides 1207 along a linear axis (or rail) 1206. The imprinting tool 1100 can also include a pair of nip rollers 1212*a*, 1212*b* that are retractable and can be moved out of the way of the webs 1102*a*, 1102*b* during imprinting. As discussed in FIG. 13F with further details, the nip rollers 1212*a*, 1212*b* can be moved close to each other to facilitate unloading the imprinted substrate 1118.

FIG. 12A-3 shows an example template 1214*a* on the web 1102*a*. The template 1214*a* includes multiple features 1215 arranged within an area. In a particular example, the substrate 1112 to be imprinted is a wafer, and the area can have a shape and a size similar to those of the wafer. For example, the area can have a diameter D, e.g., about 200 mm. The template 1214*a* has two reference marks (or alignment marks) 1204*a*, 1204*b*, which are designed to be aligned with leading and trailing edges of the substrate 1112 during imprinting. Similarly, the template 1214*b* on the web 1102*b* also has two reference marks 1204*c*, 1204*d*, which are also designed to be aligned with the leading and trailing edges of the substrate 1112 during imprinting. Accordingly, the reference mark 1204*a* needs to match with the reference mark 1204*c*, and the reference mark 1204*b* needs to match with the reference mark 1204*d*, so that features on the templates 1214*a*, 1214*b* can be aligned with the substrate 1112 and imprinted to double sides of the substrate 1112.

A first alignment camera 1202*a* can be used to align the reference marks 1204*a*, 1204*c* on a first end of the templates 1214*a*, 1214*b*. A second alignment camera 1202*b* can be used to align the reference marks 1204*b*, 1204*d* on a second end of the templates 1214*a*, 1214*b*. An upper diagram of FIG. 12A-4 shows misalignments between the templates 1214*a*, 1214*b*, where the reference marks 1204*a* and 1204*c* do not match with each other and the reference marks 1204*b* and 1204*d* do not match with each other. The templates 1214*a*, 1214*b* can be adjusted in x, y, and/or theta directions until the reference marks on the templates 1214*a*, 1214*b* overlap with each other, e.g., 1204*a* with 1204*c*, 1204*b* with 1204*d*, as the lower diagram of FIG. 12A-4 shows. In some cases, the theta adjustment for the templates 1214*b*, 1214*b* can be implemented by adjusting at least one of the z-rollers relative to each other along its axis, as illustrated in FIG. 7. In some cases, the vacuum chuck 1208 first chucks on the web 1102*a* and adjusts the position of the web 1102*a* in x, y, and/or theta directions. FIG. 12A-2 shows a bottom view of FIG. 12A-1 before adjustment, while FIG. 12A-5 shows a bottom view of FIG. 12A-1 with theta adjustment, where the clamp 1210 is also rotated and the linear guides 1207 move along the linear axis 1206 up on one end of the clamp 1210 and down on the other end of the clamp 1210.

The templates 1214*a*, 1214*b*, e.g., CRTs, can be adjusted in X, Y, theta directions. As illustrated in FIG. 12A-4, X direction shows the CRT advance direction, and Y direction is across the width of the CRT. The camera system, 1202*a* & 1202*b* can see or view the CRT references marks 1204*a*, 1204*b*, 1204*c*, 1204*d* and use the reference marks as feedback for relative positioning. The relative position of the webs 1102*a*, 1102*b* in the X direction, can be controlled by advancing one of the webs on one side relative to the other of the webs with the web drive rollers, or can be moved through the vacuum chuck 1208 with the linear guides or actuators 1207. The air turn bars 1104*a*-1104*d* allow the webs to slide in the X, Y, theta directions with minimal fiction, thus allowing an accurate relative correction to place the reference marks in alignment. The roller assemblies 1300, as illustrated in FIG. 13A, can move in the Y direction to provide the relative motion. Also, a linear actuator 1207 can be placed into the vacuum chuck 1208 to control the webs in the Y direction. The theta-direction adjustment can be accomplished by a differential motion of the linear actuators 1207 that communicate the motion through the vacuum chuck 1208.

After the reference marks 1204*a*, 1204*b* on the web 1102*a* are aligned with the reference marks 1204*c*, 1204*d* on the web 1102*b*, the webs 1102*a*, 1102*b* can be clamped by the clamping system, e.g., the vacuum chuck 1208 and the clamp 1210, to each other to eliminate relative motion of the templates 1214*a*, 1214*b*. The clamping system can be positioned downstream of the leading reference marks 1204*a*, 1204*c*. FIGS. 12B-1 to 12B-3 show schematic diagrams of configurations for clamping the webs 1102*a*, 1102*b*.

FIG. 12B-3 is a section view of FIG. 12B-2, which shows a clamping configuration. The vacuum chuck 1208 is supported by a pair of clamping actuators (and guides) 1218 for counter balance, which are further supported by a clamp bar 1210 with a rubber pad 1222 on top. The linear guides 1207 are connected to the vacuum chuck 1208 on one end via connectors 1209 and connected on the other end to the linear rail 1206 that is further connected to a machine frame 1220. The clamping configuration is configured such that the clamped webs 1102*a*, 1102*b* cannot have relative motion at or near the clamp 1210. Differential forces can be minimized or eliminated, such that the templates 1214*a*, 1214*b* (e.g., CRTs) can have a good alignment in a region large enough to encompass the substrate. The vertical linear rail 1206 is configured to pull and guide the templates 1214*a*, 1214*b* along a precise path at a constant velocity.

FIGS. 12C-12D show schematic diagrams of an example of dispensing UV resist 1224 onto the templates 1214*a*, 1214*b*. The webs 1102*a*, 1120*b* are moved upwards reversely to expose the templates 1214*a*, 1214*b* to the resist injection heads 1114*a*, 1114*b*. The clamping system including the vacuum chuck 1208 and the clamp 1210 is moved together with the webs 1102*a*, 1102*b*. When the reference marks 1204*c*, 1204*d* reversely pass the resist injection heads 1114*a*, 1114*b*, the resist injection heads 1114*a*, 1114*b* can start to dispense the UV resist 1224 onto the templates 1214*a*, 1214*b*. When the reference marks 1204*a*, 1204*b* arrive the resist injection heads 1114*a*, 1114*b*, the dispense of UV resist 1224 on the templates 1214*a*, 1214*b* completes and the reverse movement also completes. During the movement, tensions are matched in both templates 1214*a*, 1214*b*.

After the dispense of UV resist 1224 completes, the webs 1102*a*, 1120*b* are advanced downwards. At a certain point, as shown in FIG. 12E, a substrate 1112 is inserted into a gap between the templates 1214*a*, 1214*b*. The gap is closed when the substrate 1112 and the UV resist 1224 are all moved downwards between the webs 1102*a*, 1102*b*, as illustrated in FIG. 12F. The clamping system is also moved download together with the clamped webs 1102*a*, 1102*b*.

As the substrate 1112 and the templates 1214*a*, 1214*b* with the UV resist 1224 travel through the process zone (b), as shown in FIG. 12G, the UV source 1116 cures the UV resist 1224 onto the substrate 1112 to become a fully imprinted substrate 1118 with features on both sides. As illustrated in FIG. 12H, the fully imprinted substrate 1118 is pulled down to exit the process zone (b), and the vacuum chuck 1208 and the clamp 1210 are unclamped to separate the webs 1102*a*, 1102*b*. The imprinted substrate 1118 is then moved out and can be taken by the robot holder 1120 of the robot 1122 and stored into the imprinted substrate container 1124.

Then the tool 1100 can be reset for imprinting a next substrate 1112, as illustrated in FIG. 12I. The reset step can include separating the nip rollers 1212*a*, 1212*b*, retracing the linear guides 1207, tension of the webs 1102*a*, 1102*b*, advancing the webs 1102*a*, 1102*b*, finding reference marks on the templates 1214*a*, 1214*b*, spreading air-turns, transferring the imprinted substrate 1118 (e.g., into the container 1124), and preparing a blank substrate 1112.

This imprinting tool 1100 adopts a vertical configuration, where the resist injection heads can dispense the UV resist in a symmetric and horizontal orientation. It also provides symmetric forces gravity, spreading and separation, and particle isolation imprinting chamber, and allows feeding of ultra-thin substrates easier and more reliable.

FIGS. 13A-13F show schematic diagrams of example feature configurations of the tool 1100 of FIGS. 11A to 12I for double-sided imprinting. It is also noted that one or more feature configurations shown in FIG. 13A to FIG. 13E can be also used for the imprinting tool 1150 of FIG. 11B.

FIG. 13A shows a schematic diagram of an example configuration 1300 for web path. The web 1102*a* can be supplied from a supply roller 1302*a* and advanced via driver rollers 1304*a*, 1306*a*, the z-rollers 1104*a*, 1104*b*, and driver rollers 1308*a*, 1310*a*, to roller 1312*a* in a clockwise direction, while the rollers 1306*a* and 1308*a* rotate in a counter-clockwise direction. In some cases, the web 1102*a* from the supply roller 1302*a* includes protection film. The driver roller 1304*a* can rotate in the clockwise direction and the roller 1306*a* can rotate in the counter-clockwise direction to take off the protection film from the web 1102*a* so that the template 1214*a* on the web 1102*a* is exposed. Similarly, the web 1102*b* can be supplied from a supply roller 1302*b* and advanced via driver rollers 1304*b*, 1306*b*, the z-rollers 1104*c*, 1104*d*, and driver rollers 1308*b*, 1310*b*, to roller 1312*b* in a counter-clockwise direction, while the rollers 1306*b* and 1308*b* rotate in a clockwise direction. In some cases, the web 1102*b* from the supply roller 1302*b* includes protection film. The driver roller 1304*b* can rotate in the counter-clockwise direction and the roller 1306*b* can rotate in the clockwise direction to take off the protection film from the web 1102*b* so that the template 1214*b* on the web 1102*b* is exposed. In some cases, the driver roller 1306*b* is a separate nip roller and driven by a driver roller 1306*b*'.

In some implementations, the configuration 1300 includes tension sensors 1314*a*, 1314*b* coupled to the z-roller 1104*b*, 1104*d* and configured to measure the tensions of the webs 1102*a*, 1102*b*, respectively.

In some implementations, the z-rollers 1104*a*, 1104*b*, 1104*c*, 1104*d* are rollers with low friction. In some implementations, the z-rollers 1104*a*, 1104*b*, 1104*c*, 1104*d* are air-turn rollers. As illustrated in FIG. 13B, the air-turn roller 1104*a* can float the web 1102*a* via air 1315 and does not put lateral or angular constraint on the web 1104*a*. In some examples, the air-turn roller 1104*a* includes a central shaft 1320 and a cover 1318 made of porous material that is supported by the central shaft 1320. There is an empty space between the central shaft 1320 and the cover 1318. Air pressure 1315 can be pressed onto the space through an inlet 1316 and escapes from the cover 1318 to support the cover 1318, such that a plenum of air 1315 is created between an original position of the cover 1318 and a current position of the cover 1318. The air-turn roller provides several advantages: 1) if a typical z-roller is used, a small amount of misalignment or theta correction can cause lateral stresses and displace the top-to-bottom pattern alignment; 2) there is low risk of particle transfer between the z-roller and the web; 3) because of template floatation around air turn, large particles may affect less imprint area; 4) a skewed web may not track straight over a roller; and 5) the air turn may not resist the motion of the linear axis 1206. FIG. 13C shows an implementation of FIG. 12A-5 with the z-rollers 1104*a*, 1104*b* being air-turn rollers.

Figure 13D:
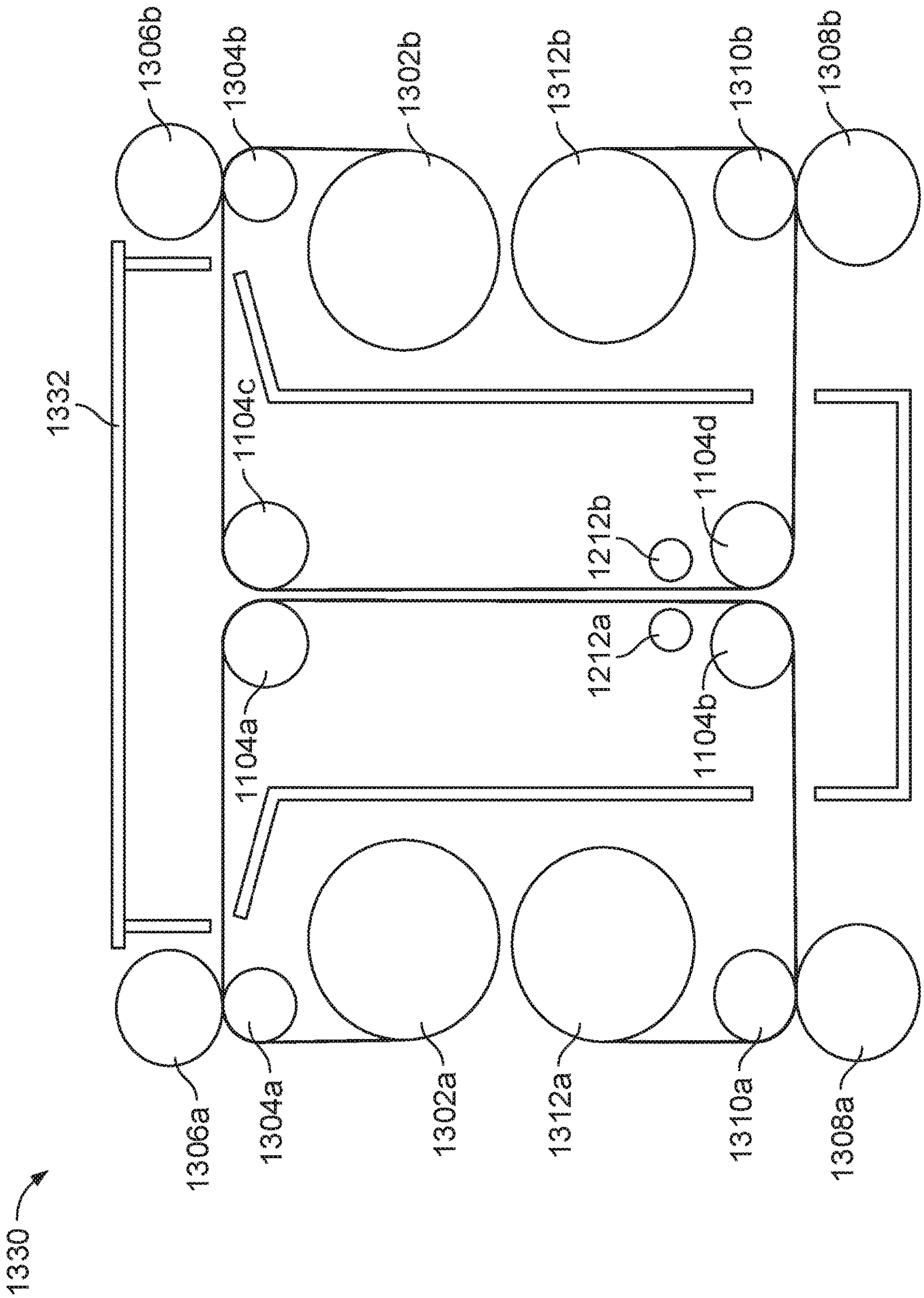
Figure 14:
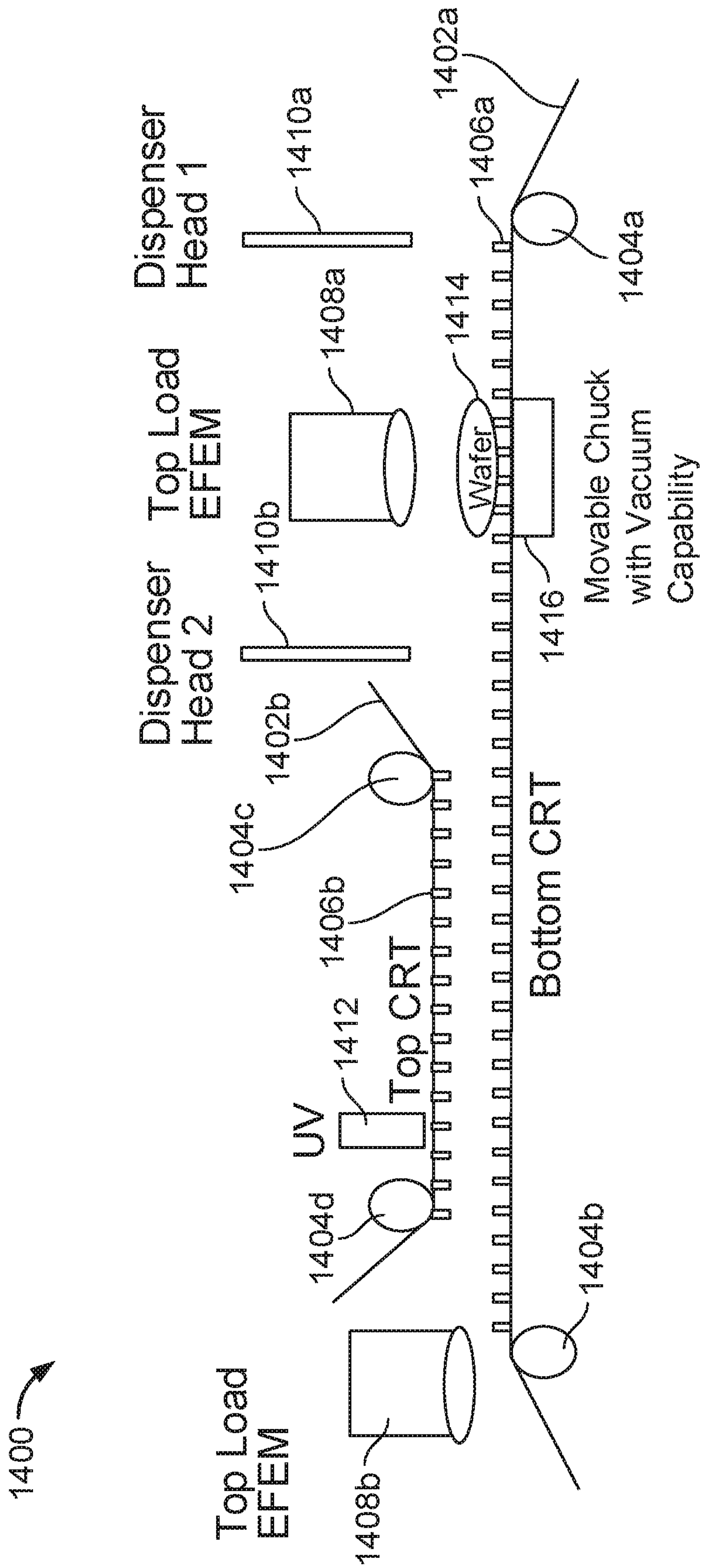
FIG. 14 shows a schematic diagram of another example tool for double-sided imprinting.

FIG. 13D shows a schematic diagram of an example configuration 1330 for imprinting process. The tool 1100 includes a chamber 1332 configured to isolate the imprint engine process zone, e.g., zone (b) of FIG. 11A, from external environment. The chamber 1332 can be controlled to have a constant temperature, e.g., 25° C., and/or a level of cleanness for imprinting.

Figure 13E:
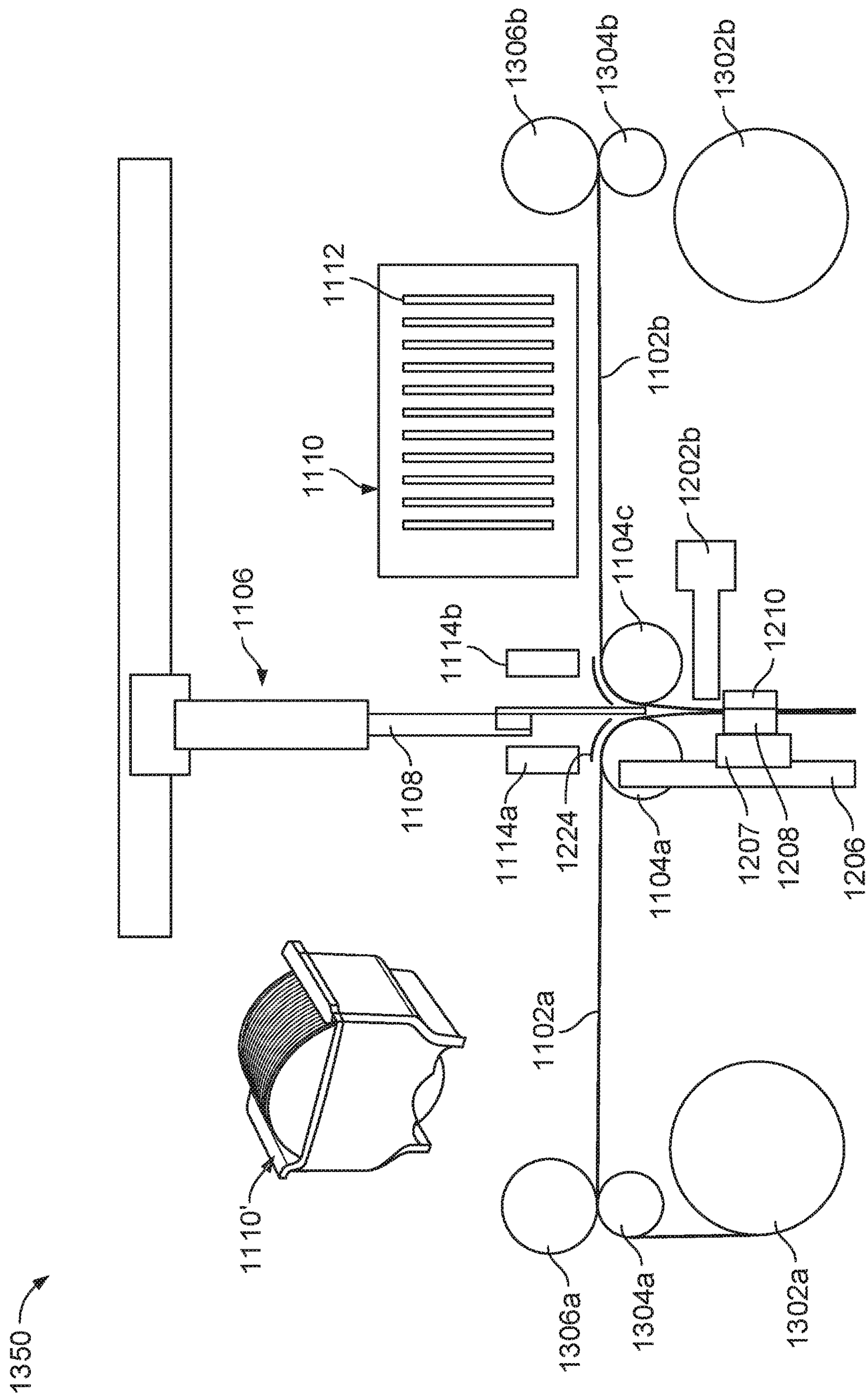

FIG. 13E shows a schematic diagram of an example substrate loading configuration 1350. The web 1102*a* can be pulled back, e.g., moved reversely, by rotating the rollers 1302*a*, 1304*a*, 1306*a*, 1104*a*, 1104*b* in a counter-clockwise direction to wrap onto the roller 1306*a*. Similarly, the web 1102*b* can be pulled back, e.g., moved reversely, by rotating rollers 1302*b*, 1304*b*, 1306*b* and the rollers 1104*c*, 1104*d* in a clockwise direction to wrap onto the roller 1306*b*. The robot 1106 is configured to take via the robot holder 1108 a blank substrate 1112 from the container 1110 and insert into the region between the flexible templates. The substrate 1112 can be a wafer substrate, and the container 1110 can be a wafer container 1110'.

Figure 13F:
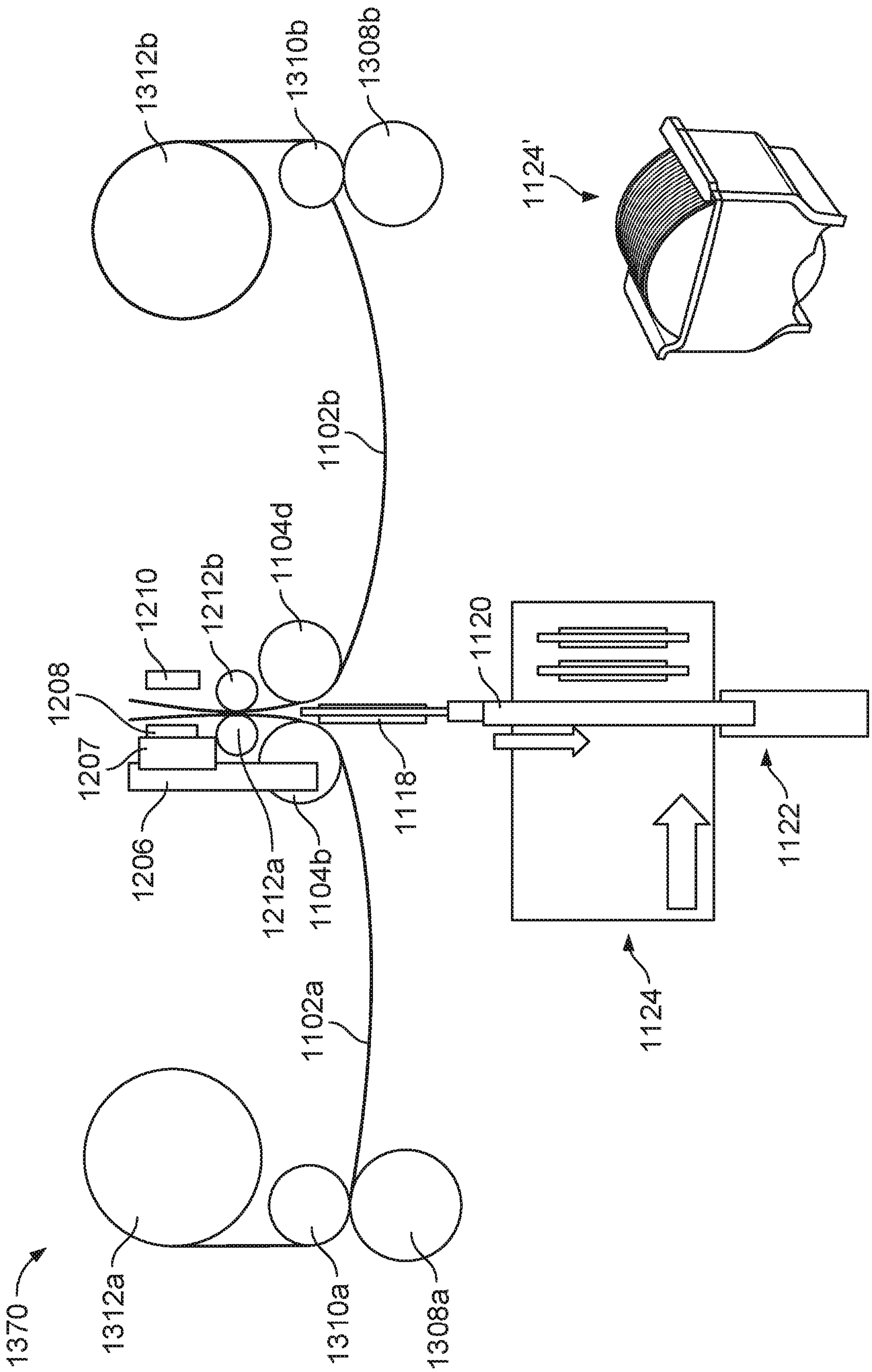

FIG. 13F shows a schematic diagram of an example substrate unloading configuration 1370. By rotating rollers 1104*b*, 1308*a*, 1310*a*, 1312*a*, the web 1102*a* can be pulled downwards, e.g., advanced, in a clockwise direction to wrap onto the roller 1312*a*. Similarly, the web 1102*b* can be pulled downwards, e.g., advanced, in a counter-clockwise direction to wrap onto roller 1312*b* by rotating the rollers 1104*d*, 1308*b*, 1310*b*, 1312*b*. When the webs 1102*a*, 1102*b* are pulled downwards, the clamping system releases and the webs 1102a, 1102b are separated. After the fully imprinted substrate 1118 passes a position of the nip rollers 1212a, 1212b, the nip rollers 1212a, 1212b can be close to each other to hold tightly the webs 1102a, 1102b. The fully imprinted substrate 1118 can then exit and be taken by the robot holder 1120 of the robot 1122 and stored into an imprinted substrate container 1124. The substrate 1112 can be a wafer substrate, and the container 1124 can be a wafer container 1124' for storing double-sided imprinted substrates 1118.

Note that substrates of different shapes and sizes can be imprinted through this double sided process equipment, besides the round substrates indicated in the figures. Higher part throughput can be achieved when larger substrates are run that can be cut up into more pieces. Also, the width of the CRT is flexible and a wider web can imprint larger substrates, leading to higher part throughput.

Example Scheme for Simultaneous Double-Sided Imprints

FIG. 14 shows a schematic diagram of another example tool 1400 for double-sided imprinting on a substrate, e.g., a wafer substrate. For illustration only, the substrate travels in a horizontal direction from right to left. Other configurations, e.g., the tool being inverted so that the substrates can travel from left to right or even vertically, can also be implemented.

A bottom web 1402a is drawn along two z-rollers 1404a, 1404b. The web 1402a includes a template 1406a, e.g., CRT. The template 1406a can include grating features, as illustrated in FIG. 14. The template 1406a is configured to have pre-pattered through holes such that a vacuum chuck 1416 under the template 1406a can gently hold with vacuum a substrate 1414, e.g., a wafer, when the substrate 1414 is released by a top load Equipment Front End Module (EFEM) 1408a. The vacuum chuck 1416 can be moveable together with the template 1406a. The top load EFEM 1408a can be positioned between a pair of dispenser head 1410a, 1410b, so that the first dispenser head 1410a can dispense resist on the grating features of the template 1406a before the substrate 1414 is placed on the template 1406a and the second dispenser head 1410b can dispense resist on the substrate 1414 after the substrate 1414 is held on the template 1406a by the vacuum chuck 1416.

Another top web 1402b is drawn along two z-rollers 1404c, 1404d. The web 1402b includes a template 1406b (e.g., CRT) that can include features, e.g., grating features or other features. A UV light source 1412 can be positioned above the template 1406b. The second dispenser head 1410b can be arranged before the z-roller 1404c so that, when the substrate 1414 is moved under the template 1406b, the second dispenser head 1410b already dispenses the resist on top of the substrate 1414. The tool 1400 also includes another top load EFEM 1408b positioned adjacent to the z-roller 1404b. As discussed in further details below, the top load EFEM 1408b is configured to take the substrate 1414 with imprints from the template 1406a.

FIGS. 15A to 15H show schematic diagrams of example procedures of using the tool of FIG. 14 for double-sided imprinting.

Figure 15A:
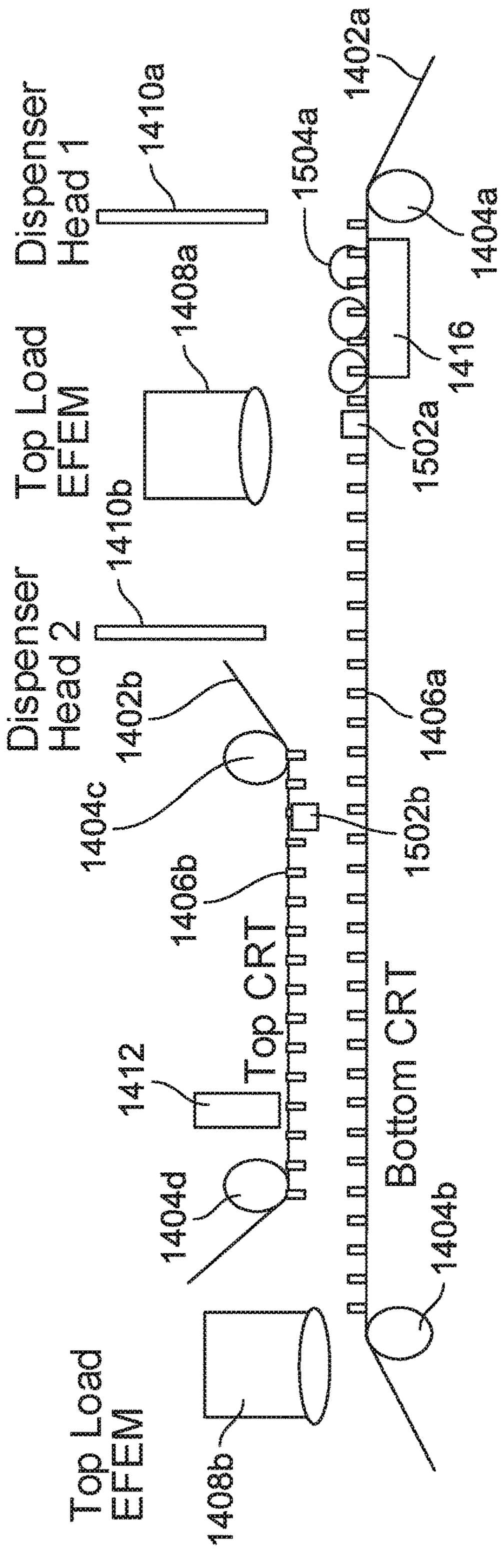
FIGS. 15A to 15H show schematic diagrams of example procedures of using the tool of FIG. 14 for double-sided imprinting.
Figure 15B:
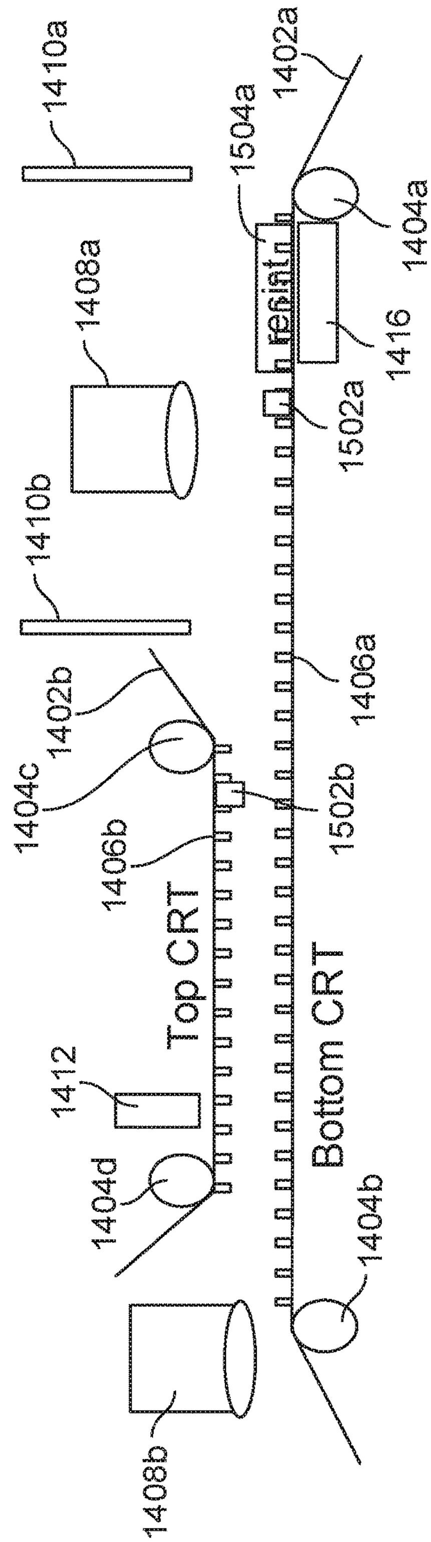

FIG. 15A shows a schematic diagram of dispensing resist 1504a on the bottom template 1406a. The first dispenser head 1410a can start to dispense the resist 1504a after an alignment mark 1502a passed the first dispenser head 1410a, so that the resist 1504a is dropped onto features of the template 1406a after the alignment mark 1502a, e.g., right to the alignment mark 1502a. After a certain amount of resist 1504a is dropped onto the features of the template 1406a, the web 1402a can stop moving and wait for a period of time until the resist 1504a spreads, as shown in FIG. 15B, on the features of the template 1406a. In some examples, the template 1406a includes a grating feature configured to enable the resist drop spread nicely, e.g., uniformly, to push air out of the way, such that the resist 1504a fills in details within the template 1406a. A grating period of the grating features can be tens of nanometer (nm) to tens of micrometer (μm).

Figure 15C:
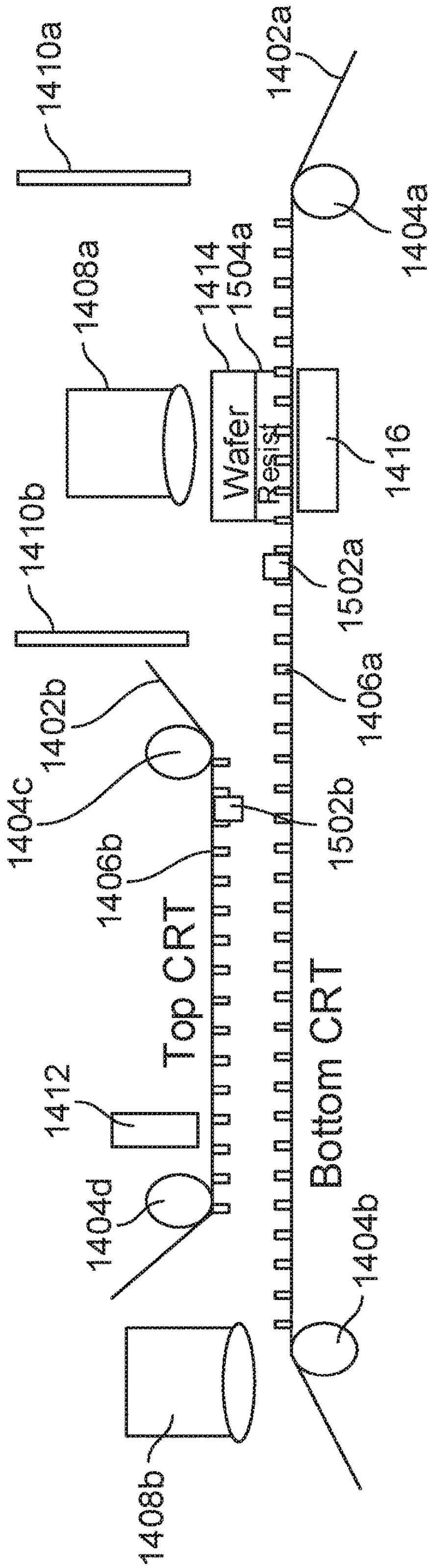

After the resist 1504a spreads on the features of the template 1406a, the web 1402a can be moved again. When the resist 1504a moves underneath the top load EFEM 1408a, the web 1402a can stop, and the substrate 1414 can be loaded by the top load EFEM 1408a onto the resist 1504a and held by the vacuum chuck 1416, as shown in FIG. 15C. Thus, a bottom surface of the substrate 1414 contacts with the resist 1504a.

Figure 15D:
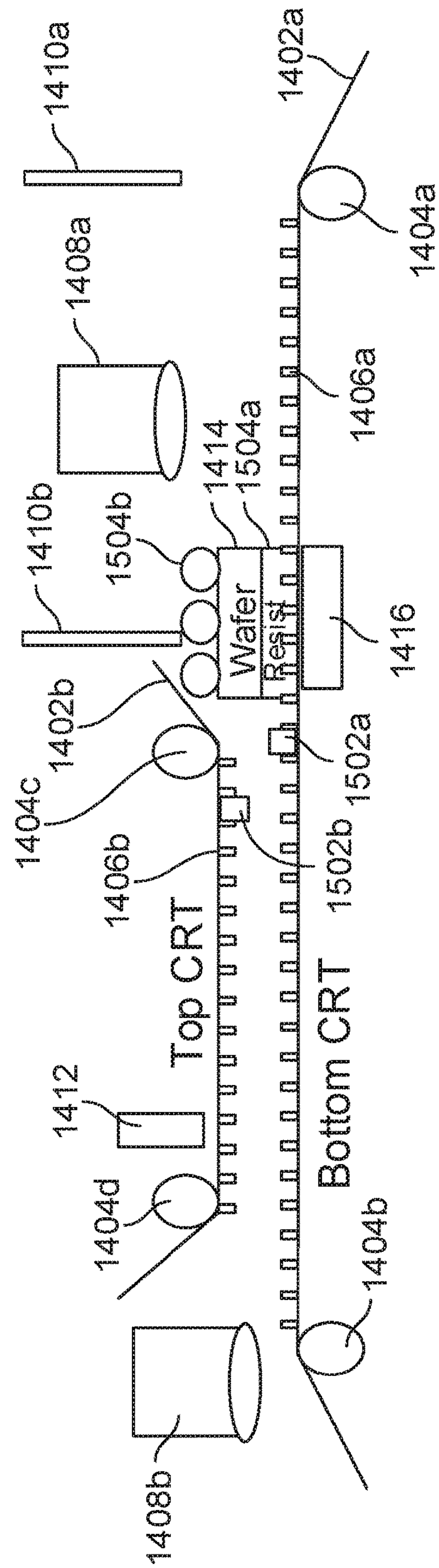

Then the web 1402a can be moved again. When the substrate 1414 arrives under the second dispenser head 1410b, the second dispenser head 1410b starts to dispense resist 1504b onto a top surface of the substrate 1414, as shown in FIG. 15D. In some cases, the web 1402a can stop to wait until the resist 1504b spreads on the top surface of the substrate 1414. In some cases, the web 1402a continues to be moved while the resist 1504b spreads on the top surface of the substrate 1414. The tool 1400 can be configured such that a distance between the second dispense head 1410b and the z-roller 1404c is long enough for the resist 1540b to spread nicely on the top surface of the substrate 1414.

Figure 15E:
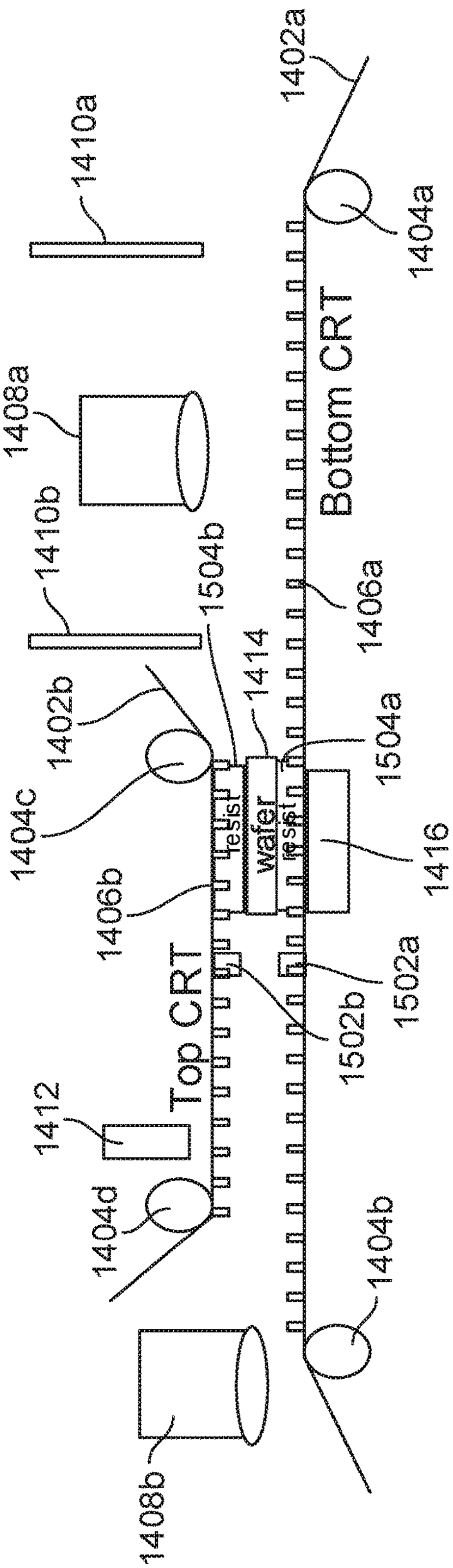

When the substrate 1414 with the resist 1504a on the bottom surface and the resist 1504b on the top surface is moved under the template 1406b, features on the template 1406b starts to contact the resist 1504b and the resist 1504b fills in the features on the template 1406b. Also when the alignment mark 1502a is moved to be aligned with another alignment mark 1502b on the template 1406b, e.g., via a camera system, the top web 1402b can start to be moved at a rate same as the bottom web 1402a, Also a distance between the top template 1406b and the bottom template 1406a can be configured or controlled to enable the resist 1504b fills into the features of the template 1406a but the features do not contact with the top surface of the substrate 1414. FIG. 15E shows a schematic diagram of the substrate 1414 with double side imprinting, e.g., the top resist 1504b in contact with the top template 1406b and the bottom resist 1504a in contact with the bottom template 1406a.

When the substrate 1414 with the top resist 1504b and the bottom resist 1504a and the templates 1406b and 1406a are moved under the UV light source 1412, the UV light source 1412 can be turned on to cure the resists 1504a and 1504b, so that features on the templates 1406a and 1406b can be imprinted onto resists on the top and bottom surfaces of the substrate 1414. The substrate 1414 with imprinted resists is noted as an imprinted substrate 1414'.

Figure 15F:
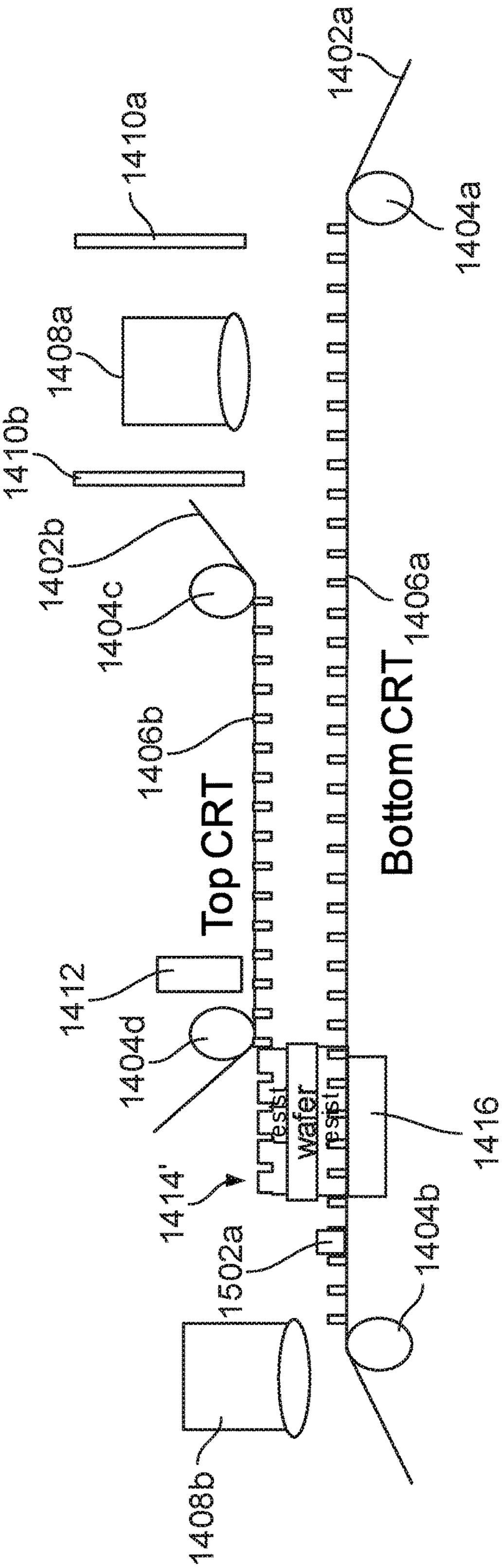

After the resists 1504a, 1504b are cured onto the substrate 1414, the top web 1402b is pulled upwards around the z-roller 1404d so that the template 1406b is separated from the imprinted substrate 1414', as illustrated in FIG. 15F. To achieve this, the z-roller 1404b can be positioned with a distance from the z-roller 1404d.

Figure 15G:
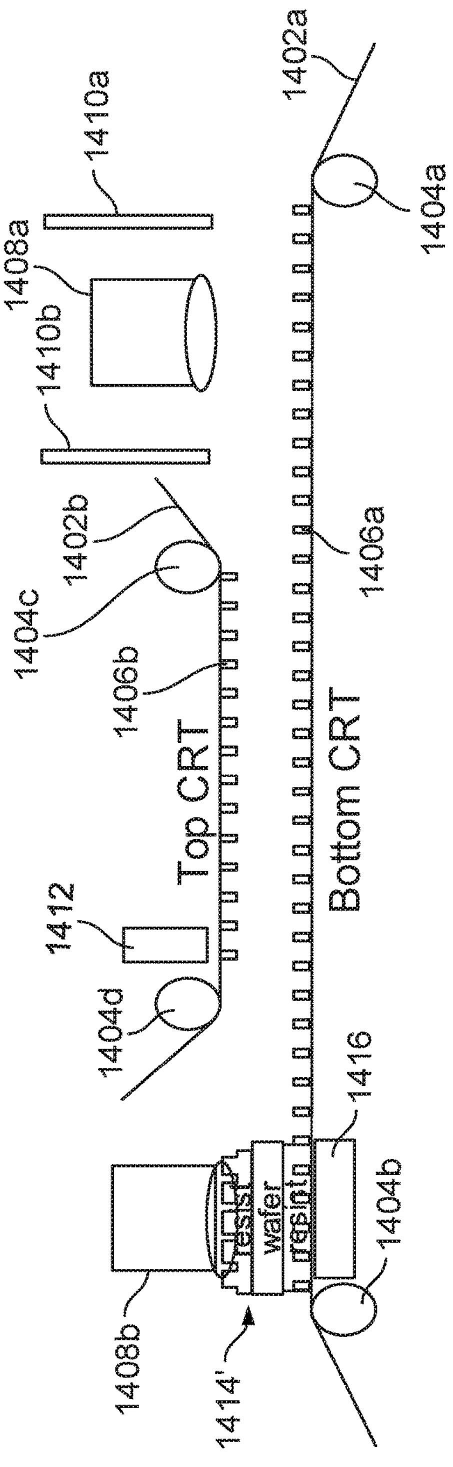
Figure 15H:
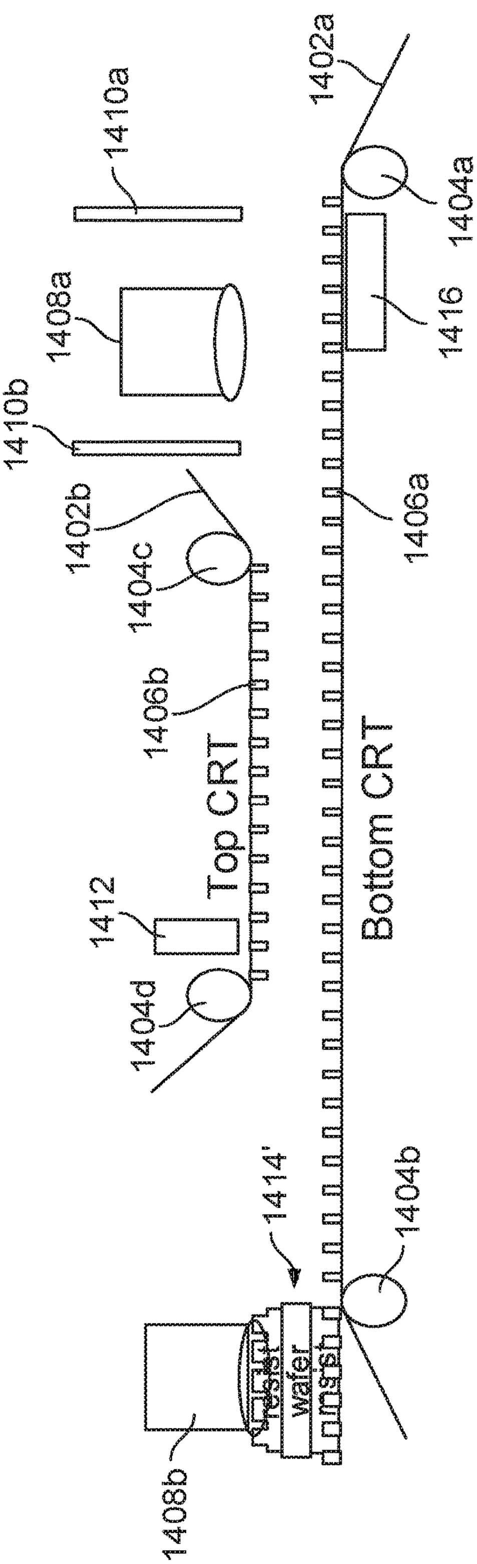

The web 1402a is further moved until under the top load EFEM 1408b. The vacuum chuck 1416 can release the substrate 1414', and the top load EFEM 1408b can take the imprinted substrate 1414', as shown in FIG. 15G. The top load EFEM 1408*b* holding the imprinted substrate 1414' can move forward, e.g., to the left of the z-roller 1404*b*, so that the imprinted substrate 1414' is separated from the bottom template 1406*a*, as illustrated in FIG. 15H.

Using the tool 1400 for double-sided imprinting as described above can provide several advantages. First, no substrate registration is needed. Second, alignment is implemented with a top template to a bottom template to eliminate imprint related difficulty. Third, the bottom template can have pre-patterned through holes to enable gentle vacuum hold of the substrate and to guarantee the substrate being held during separation from the top template. Fourth, the tool can enable gentle separation scheme with low separation force, which can avoid high separation force to cause substrate lost or separation failure at both top and bottom imprints. Fifth, the bottom template has grating features which are configured to allow resist spread on the bottom template to eliminate filling concern of bottom imprints.

Example Double-Sided Imprinting Processes

Figure 16:
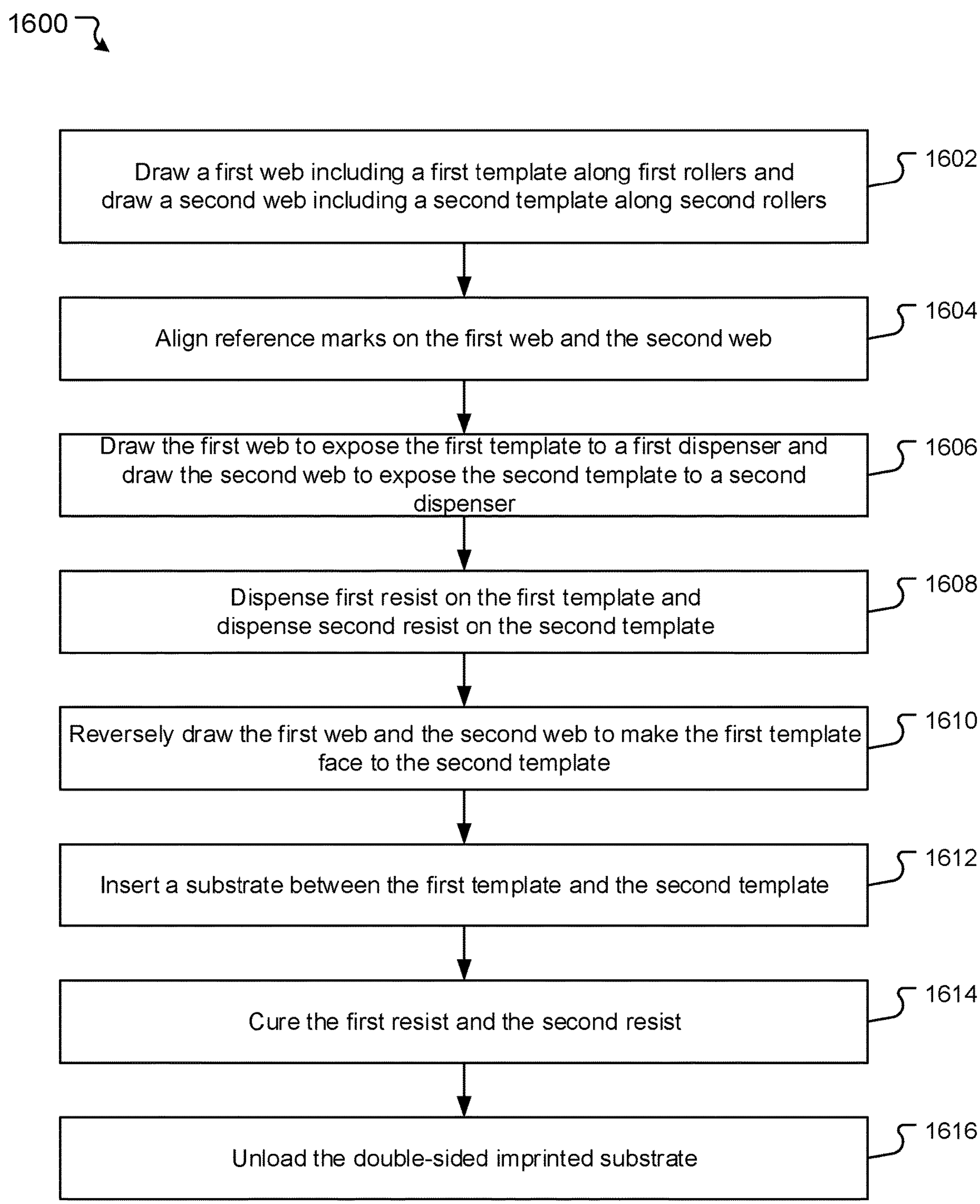
FIG. 16 is a flow diagram of an example process of fabricating double-sided imprints on a substrate.

FIG. 16 is a flow diagram of an example process 1600 of fabricating double-sided imprints on a substrate. The process 1600 can be performed by the devices, systems and/or tools describe above, e.g., the imprinting tool 1100 of FIGS. 11-13F.

A first web is drawn along first rollers and a second web is drawn along second rollers (1602). The first web includes a first template that includes a first imprinting feature, e.g., a grating feature. The second web includes a second template that includes a second imprinting feature, e.g., a grating feature.

In some implementations, the first rollers include two first z-rollers arranged in a vertical direction, and the second rollers include two second z-rollers arranged in the vertical direction. The first z-rollers can be positioned opposite to the second z-rollers with a distance. The first web can be drawn along the first z-rollers in a counter-clockwise direction, and the second web can be drawn along the second z-rollers in a clockwise direction.

In some examples, the first rollers include at least one air turn roller configured to float the first web by air pressure. The air turn roller can be the roller 1104*a* of FIGS. 13A-13B. The second rollers can also include at least one air turn roller configured to float the second web by air pressure. In some examples, the first rollers include at least one air turn roller configured to chuck the first web by vacuum, e.g., the air bearing turn bar 354 of FIG. 3B.

Reference marks on the first web and the second web are aligned (1604). A camera system (e.g., the alignment cameras 1202*a*, 1202*b* of FIG. 12A-1) or a laser system (e.g., the laser 504 and the sensor 508 of FIG. 5A) can be used to locate (or detect) the reference marks on the first web and the second web for alignment. An alignment system can be used to align the reference marks on the first web and the second web, such that the first template and the second template are aligned with each other, for example, the first imprinting feature is aligned with the second imprinting feature.

In some examples, aligning the reference marks on the first web and the second web includes aligning a first reference mark on the first web with a second reference mark on the second web and aligning a third reference mark on the first web with a fourth reference mark on the second web. The first reference mark and the third reference mark can define a range where the substrate is configured to be imprinted with the first template. The second reference mark and the fourth reference mark can define a range where the substrate is configured to be imprinted with the second template.

In some implementations, aligning the reference marks on the first web and the second web includes moving a z-roller of the first rollers in at least one of x, y, or theta direction, as discussed above in FIGS. 12A-1 to 12A-5.

In some implementations, after the aligning, the first web and the second web are clamped at a location adjacent to the reference marks, such that the clamped first web and second web are moved with the first template and the second template aligned with each other. For example, as illustrated in FIG. 12B-1, the clamping location is downstream the first reference mark.

The first web and the second web can be clamped together by a clamping system. The clamping system can include a chuck and a clamp. The chuck can be a vacuum chuck, e.g., the vacuum chuck 1208 of FIG. 12A-1 and configured to chuck onto the first web with vacuum. The clamp can be the clamp 1210 of FIG. 12A-1. The chuck can be actuated to chuck with the clamp so that the chuck is onto the first web and the clamp is onto the second web.

In some cases, the chuck is configured to be moveable along a rail parallel to an axis defined by the first rollers, and the chuck and the clamp are moved together with the first web and the second web after the clamping. As illustrated in FIG. 12B-3, the chuck can be positioned on a pair of guides, and each of the guides is movable on a respective rail connected to a frame. Aligning the reference marks on the first web and the second web can include adjusting relative positions of the guides on the respective rails in at least one of x, y, or theta direction. A tension sensor can be coupled to one of the first rollers to measure tension of the first web. Another tension sensor can be coupled to one of the second rollers to measure tension of the second web.

In some implementations, a chamber is used to enclose at least the first template and the second template. The clamber can be the chamber 1332 of FIG. 13D. A controller can be configured to control a temperature and/or cleanness of the chamber.

The first web is drawn along the first rollers in a first direction to expose the first template to a first dispenser and the second web is drawn along the second rollers in a second direction to expose the second template to a second dispenser (1606). The first template can be drawn to be in a horizontal direction and under the first dispenser. The second template can be drawn to be in a horizontal direction and under the second dispenser.

The first dispenser dispenses first resist on the first template and the second dispenser dispenses second resist on the second template (1608). The first dispenser can dispense the first resist while the first template is passing the first dispenser. The second dispenser can dispense the second resist while the second template is passing the second dispenser.

When the first template is fully covered with the first resist and the second template is fully covered with the second resist, the first web and the second web are reversely drawn (1610), such that the first template with the first resist and the second template with the second resist face to each other. For example, the first web can be drawn upwards in a counter-clockwise direction to expose the first template for resist, and the first web can then be drawn downwards in a clockwise direction to pull the first template down. Similarly, the second web can be drawn upwards in a clockwise direction to expose the second template for resist, and the second web can then be drawn downwards in a counter-clockwise direction to pull the second template down.

A substrate is inserted between the first template with the first resist and the second template with the second resist (1612). The substrate can be a rigid substrate, e.g., a wafer substrate like a silicon wafer. A robot can be controlled to grip an edge of the substrate to feed the substrate into a gap between the first template and the second template. In some implementations, the first rollers and the second rollers are arranged such that, after the inserting, the substrate is moved together with the first template and the second template, and the first resist is pressed, e.g., by one of the first rollers, onto the first side of the substrate and filled into the first imprinting feature on the first template and the second resist is pressed, e.g., by one of the second rollers, onto the second side of the substrate and filled into the second imprinting feature on the second template.

In some implementations, a first squeegee roller is moved onto the first web to push the first template into the first resist, such that the first resist fills into the first imprinting feature on the first template, and a second squeegee roller is moved onto the second web to push the second template into the second resist, such that the second resist fills into the second imprinting feature on the second template. The first squeegee roller and the second squeegee roller can be positioned opposite to each other during moving together the first squeegee and the second squeegee. The first squeegee roller or the second squeegee roller can be the squeegee roller 608 of FIG. 6A.

When the substrate and the first template, the second template enter into an imprinting zone, a light source, e.g., a UV light source, can illuminate to cure the first resist and the second resist (1614), such that the cured first resist has a first imprinted feature corresponding to the first imprinting feature on the first template on a first side of the substrate and the cured second resist has a second imprinted feature corresponding to the second imprinting feature on the second template on a second side of the substrate. In such a way, the substrate is imprinted with double-sided imprinted features.

In some implementations, after the curing, the first web and the second web are unclamped, such that the substrate with the cured first resist and second resist is capable of passing through a gap between the first web and the second web.

The double-imprinted substrate is unloaded (1616). The substrate can be unloaded by another robot and stored in a container, e.g., the container 1124 of FIG. 11A.

Figure 17:
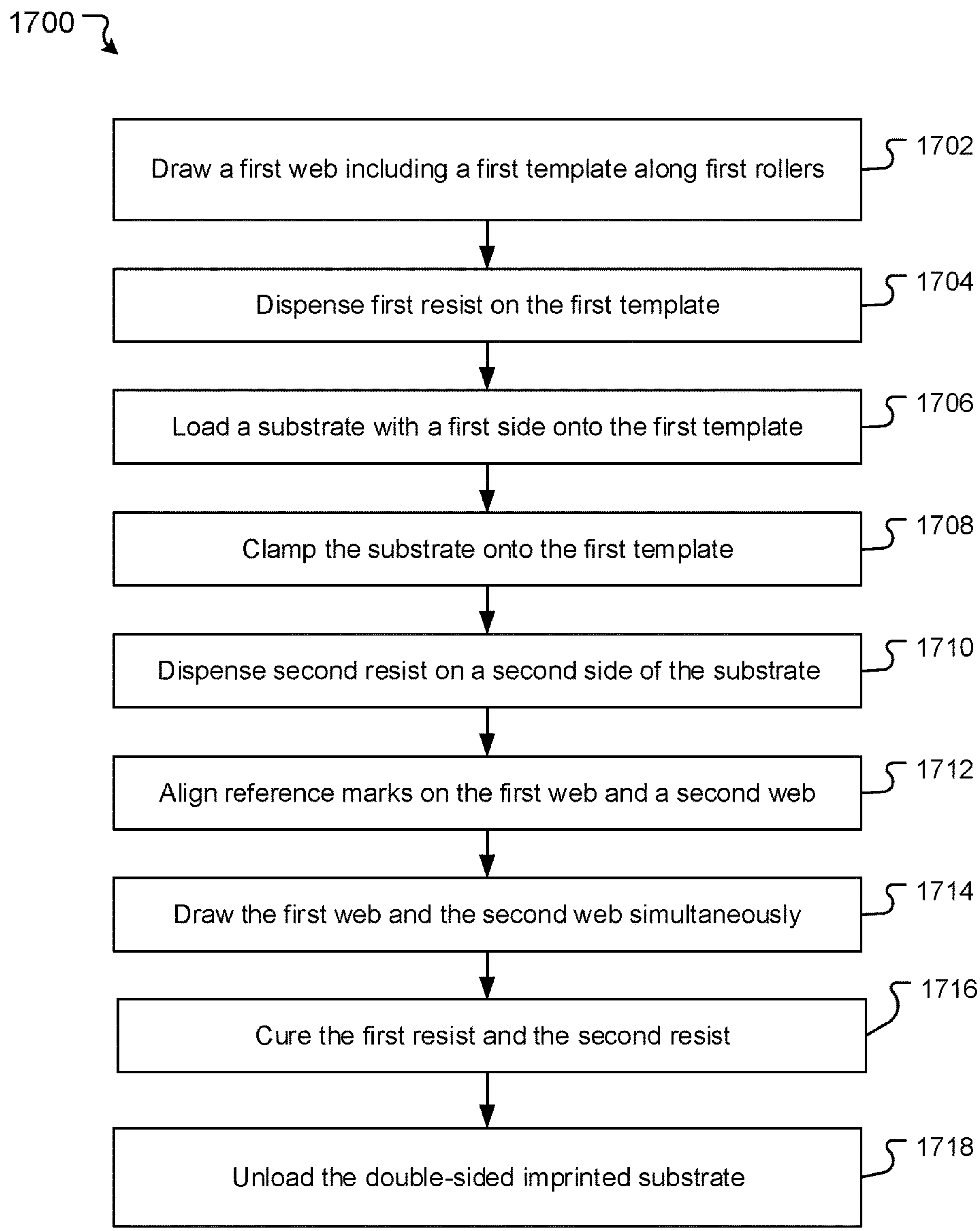
FIG. 17 is a flow diagram of another example process of fabricating double-sided imprints on a substrate.

FIG. 17 is a flow diagram of another example process 1700 of fabricating double-sided imprints on a substrate. The process 1700 can be performed by the devices, systems, and/or tools described above, e.g., the imprinting tool 1400 of FIGS. 14 to 15H.

A first web is drawn along first rollers (1702). The first web includes a first template that has a first imprinting feature, e.g., a grating feature. The first rollers can include two z-rollers arranged in a horizontal direction and can be drawn from right to left. In some implementations, the first rollers include at least one air turn roller configured to float the first web by air pressure. The first rollers can include at least one air turn roller configured to chuck the first web by vacuum.

First resist is dispensed on the first template (1704). A first dispenser can start to dispense the first resist on the first template when a beginning of the first template is moved under the first dispenser and end when an end of the first template leaves the first dispenser. After the first resist is dispensed on the first template, the tool can wait for a period of time until the first resist spreads into the first imprinting feature of the first template. In some implementations, the first imprinting feature includes a grating feature, and the grating feature is configured such that the first resist uniformly fills into the grating feature. Other imprinting features can be also used and configured to spread the first resist uniformly.

A substrate is loaded onto the first template (1706). A first side of the substrate, e.g., a bottom side, is in contact with the first resist on the first template. Particularly, the first side of the substrate is loaded opposite to the first imprinting feature of the first template. The substrate can be a rigid substrate, e.g., a silicon wafer. A holder, e.g., the top load EFEM 1408*a* of FIG. 14, can be used to hold and release the substrate onto the first template. The holder can be arranged next to the first dispenser along the moving direction of the first web.

The substrate is clamped onto the first template (1708), such that the substrate is movable together with the first template. A chuck, e.g., the vacuum chuck 1416 of FIG. 14, can be used to chuck the substrate onto the first template. In some implementations, the first template includes one or more pre-pattered through holes, and the substrate can be held with vacuum by the vacuum chuck through the one or more pre-patterned through holes. The vacuum chuck is movable and can be moved together with the first web and the substrate after the clamping.

Second resist is dispensed on a second side of the substrate (1710), e.g., a top side of the substrate. A second dispenser can be arranged next to the holder and start to dispense the second resist on the substrate when the substrate is moved under the second dispenser.

A second web is drawn along second rollers. The second web includes a second template that has a second imprinting feature to be imprinted onto the substrate. The second rollers can include two second z-rollers arranged in the horizontal direction. As illustrated in FIG. 14, the two first z-rollers define a first moving range for the first web and the two second z-rollers define a second moving range for the second web. The first moving range is larger than the second moving range and encloses the second moving range. The first rollers and the second rollers can be arranged to define a gap between the first web and the second web. The gap has a vertical distance.

Reference marks on the first web and the second web are aligned (1712). As illustrated in FIG. 15D, a first reference mark on the first web can be arranged ahead of the first imprinting feature along a direction of drawing the first web, e.g., left to a position where the substrate is clamped. A second reference mark on the second web can be also arranged ahead of the second imprinting feature along the direction, e.g., left to a position where the second imprinting feature is to be imprinted onto the second side of the substrate.

For the alignment, the second web can be static and wait for the first reference mark on the first web to move close to the second reference mark. A vision system can be used to locate the second reference mark and/or the first reference mark. When the first reference mark is moved to match with the second reference mark, the first template is aligned with the second template, e.g., the first imprinting feature is aligned with the second imprinting feature.

After the alignment, the first web and the second web are drawn simultaneously (1714) at a same rate. In some implementations, the second reference mark is arranged adjacent to one of the second z-roller. When the first reference mark on the first web is moved to match with the second reference mark, the second web starts to be drawn along the second z-rollers, and the second template starts to be pressed, e.g., by the one of the second z-rollers, into the second resist on the second side of the substrate. The vertical distance of the gap between the first web and the second web can be configured so that the second template is pressed into the second resist and the second resist fills into the second imprinting feature of the second template.

In some implementations, the vertical distance of the gap is high so that the second resist is not contact with the second template when the substrate is moved into the gap. When the first reference mark on the first web and the second reference mark on the second web are aligned, the second z-rollers together with the second web can be moved vertically downwards so that the second template is pressed into the second resist on the second side of the substrate.

In some implementations, a squeegee roller, e.g., the squeegee roller 608 of FIG. 6A, is moved on the second web between the two second z-rollers to push the second template into the second resist, such that the second resist fills into the second imprinting feature. In some cases, the first resist can be also pressed into the first imprinting feature by the squeegee roller.

The first resist and the second resist are cured (1716). A light source, e.g., a UV light source, can be positioned between the two second z-rollers and cure the first resist and the second resist when the substrate is between the first template and the second template and the first resist and the second resist are both pressed into the first imprinting feature and the second imprinting feature, respectively. Thus, the cured first resist can have a first imprinted feature corresponding to the first imprinting feature on the first side of the substrate and the cured second resist can have a second imprinted feature corresponding to the second imprinting feature on the second side of the substrate.

The double-sided imprinted substrate is unloaded (1718). In some implementations, after the curing, the second web is drawn and pulled upwards along one of the second z-rollers to separate from the substrate, then a holder, e.g., the top load EFEM 1408*b* of FIG. 14, is used to take the substrate while the vacuum chuck under the first template is releasing the substrate.

Figure 18:
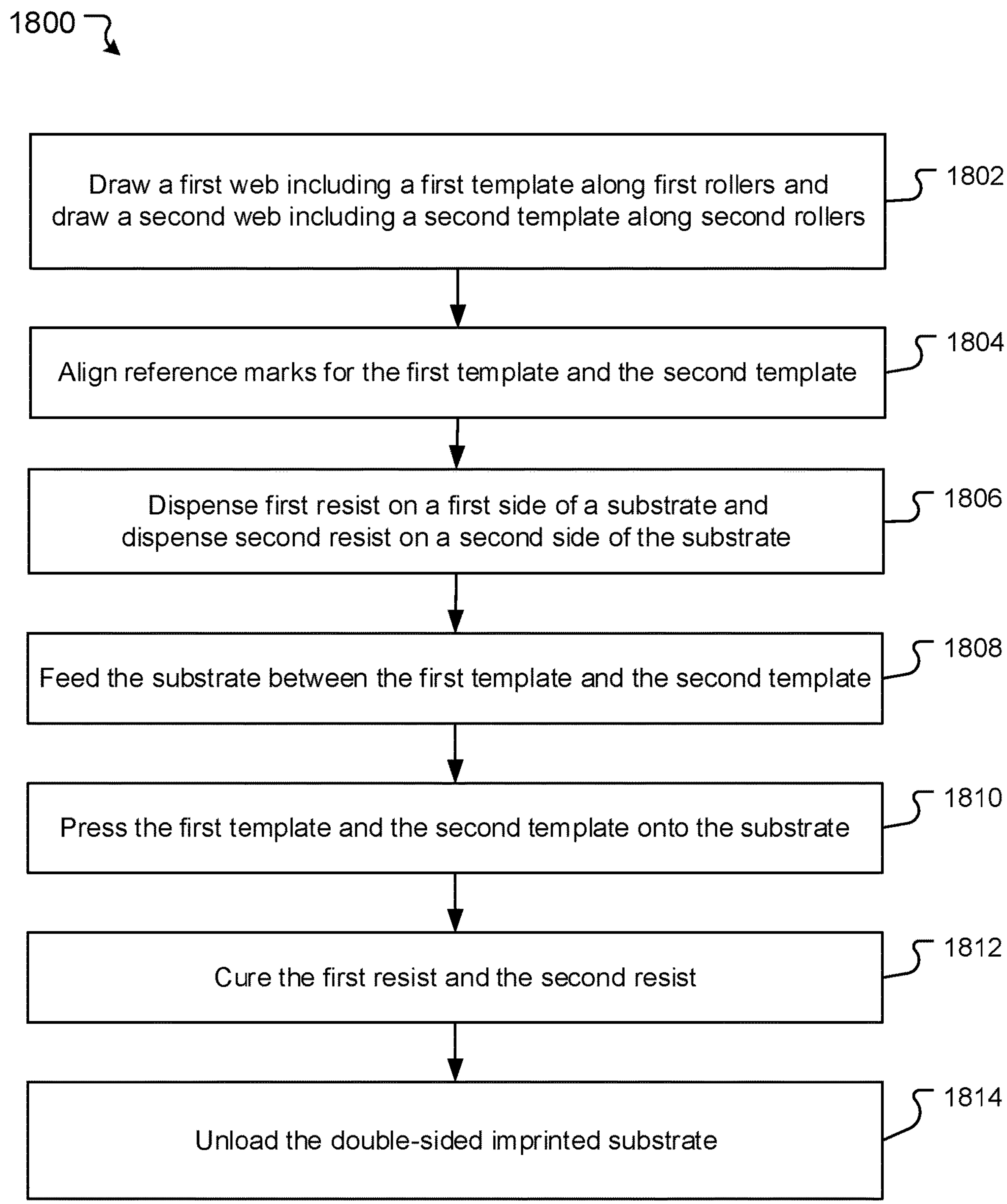
FIG. 18 is a flow diagram of a third example process of fabricating double-sided imprints on a substrate.

FIG. 18 is a flow diagram of a third example process 1800 of fabricating double-sided imprints on a substrate. The process 1800 can be performed by the devices, systems, and/or tools described above, e.g., the imprinting tool 900 of FIG. 9 or the imprinting tool 1000 of FIG. 10.

A first web is drawn along first rollers and a second web is drawn along second rollers (1802). The first web includes a first template that has a first imprinting feature to be imprinted on one side of the substrate, and the second web includes a second template that has a second imprinting feature to be imprinted on the other side of the substrate. The first template and the second template are brought together into an imprinting zone.

Reference marks for the first template and the second template are aligned (1804). A camera system or a laser system can be used to detect the reference marks on the first web and the second web for alignment of the first template and the second template. For example, by aligning a first reference mark on the first web with a second reference mark on the second web, the first imprinting feature on the first template can be aligned with the second imprinting feature on the second template.

First resist is dispensed on a first side of the substrate and second resist is dispersed on a second side of the substrate (1806). The first resist and the second resist can be held on the sides of the substrate by surface tension.

The substrate is fed into the imprinting zone and between the first template and the second template (1808). In some cases, the substrate is rigid, e.g., a silicon wafer, and the substrate can be provided by gripping an edge of the substrate using a holder. In some cases, as illustrated in FIG. 10, the substrate is flexible, and the substrate can be provided by pulling from a roll of blank substrates along a roller.

In some implementations, the first rollers include two first z-rollers arranged in a horizontal direction and the second rollers include two second z-rollers arranged in the horizontal direction. The first rollers and/or the second rollers can be moved vertically to increase or decrease a vertical distance between the first web and the second web.

The first template and the second template are pressed onto the substrate (1810), such that the first resist fills into the first imprinting feature of the first template on the first side of the substrate and the second resist fills into the second imprinting feature of the second template on the second side of the substrate.

In some implementations, a first press dome is applied to the first template, e.g., from the back of the first template. The first press dome can be a glass dome, e.g., the glass dome 204 of FIG. 2 or 454 of FIG. 4B. The first press dome can be an annular ring vacuum chuck, e.g., the vacuum chuck 104 of FIG. 1. In some implementations, the second web is supported by a planar support, e.g., the stage 130 of FIG. 1, or the stage assembly 230 of FIG. 2. In some implementations, a second press home is applied to the second template, e.g., from the back of the second web. The second press dome can be a glass dome, e.g., the glass dome 204 of FIG. 2 or 454 of FIG. 4B. The second press dome can be an annular ring vacuum chuck, e.g., the vacuum chuck 104 of FIG. 1.

In some implementations, after the alignment of reference marks, the first press dome and the second press dome are brought into contact with the first web and the second web. There can be a fine adjustment axis of the first press dome or the second press dome configured to make a small correction for optimum template alignment after the first press dome or the second press dome is in contact with the first web or the second web. The first and second press domes can come together evenly such that z position of the substrate is determined by the positions of the first and second press domes as the first and second press domes came together. When the first and second press domes are fully flattened, the first and second templates can be filled with the first resist and the second resist completely.

In some implementations, pressing the first template and the second template onto the substrate includes moving a first squeegee roller onto the first web to push the first template into the first resist, such that the first resist fills into the first imprinting feature on the first template, and/or moving a second squeegee roller onto the second web to push the second template into the second resist, such that the second resist fills into the second imprinting feature on the second template. The first squeegee roller and the second squeegee roller can be positioned opposite to each other during moving the first squeegee and the second squeegee together.

The first resist and the second resist are cured (1812), e.g., by a UV light source. The cured first resist can have a first imprinted feature corresponding to the first imprinting feature on the first side of the substrate, and the cured second resist can have a second imprinted feature corresponding to the second imprinting feature on the second side of the substrate.

The double-sided imprinted substrate is unloaded (1814). For example, the first web can be pulled away from one of the first rollers to separate the first template from the substrate. The second web can be pulled away from one of the second rollers to separate the second template from the substrate. In some implementations, the first press dome and/or the second press dome is first retracted from the first web and/or the second web.

In some implementations, after the substrate is separated from the first template, a first protective film is applied onto the cured first resist on the first side of the substrate. After the substrate is separated from the second template, a second protective film can be applied onto the cured second resist on the second side of the substrate. The double-sided imprinted substrate, particularly with the first and/or second protective films, can be rolled into a roll over a roller.

Figure 19:
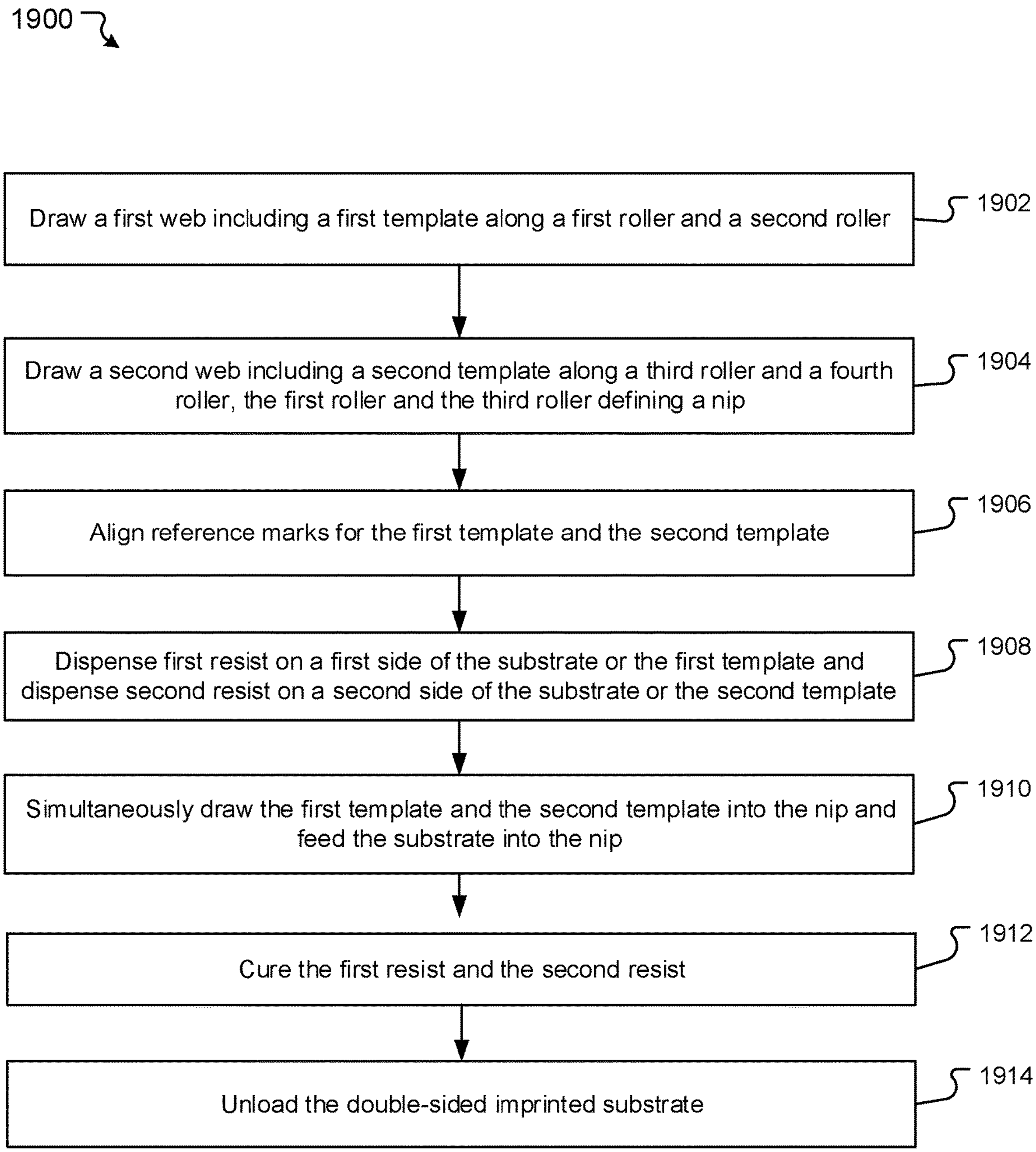
FIG. 19 is a flow diagram of a fourth example process of fabricating double-sided imprints on a substrate.

FIG. 19 is a flow diagram of a fourth example process 1900 of fabricating double-sided imprints on a substrate. The process 1900 can be performed by the devices, systems, and/or tools described above, e.g., the imprinting tool 800 of FIG. 8.

A first web is drawn along a first roller and a second roller (1902). The first web includes a first template having a first imprinting feature. The first roller and the second roller can be positioned in a first direction, e.g., a horizontal direction or a vertical direction.

A second web is drawn along a third roller and a fourth roller (1904). The second web includes a second template having a second imprinting feature. The third roller and the fourth roller can be positioned in a second direction same as the first direction, e.g., a horizontal direction or a vertical direction. The first roller and the third roller are positioned opposite to each other and define a nip. Note that step 1902 and step 1904 can be executed at the same time.

Reference marks for the first template and the second template are aligned (1906), such that the first template is aligned with the second template. As noted above, a camera system or a laser system can be used to locate the reference marks on the first web and the second web for the alignment. Additionally, an alignment system can be used to align the reference marks for the first template and the second template. For example, precision adjustment axis can be distributed among web supports for the first web and the second web such that the first template and the second template can be brought into alignment with each other.

First resist is dispersed on a first side of the substrate or the first template and second resist is dispensed on a second side of the substrate or the second template (1908). In some cases, the first resist and the second resist can be dispersed on both sides of the substrate. In some cases, the first resist is deposited on the first side of the substrate, and the second resist is deposited on the second template, as illustrated in FIG. 8.

The first template and the second template are simultaneously drawn into the nip and the substrate is fed into the nip at the same time (1910). The first imprinting feature faces the first side of the substrate and the second imprinting feature faces the second side of the substrate, and the first resist can be pressed by the first roller into the first imprinting feature on the first side of the substrate and the second resist can be pressed by the third roller into the second imprinting feature on the second side of the substrate. The substrate can be fed into the nip by using a holder griping an edge of the substrate. The substrate can be a rigid substrate, e.g., a wafer.

Once the substrate is in complete contact with the first template and the second template, the first web, the second web, and the substrate can stop moving. The first resist and the second resist are cured (1912), e.g., by a UV light, such that the cured first resist has a first imprinted feature corresponding to the first imprinting feature on the first side of the substrate and the cured second resist has a second imprinted feature corresponding to the second imprinting feature on the second side of the substrate.

The double-sided imprinted substrate is unloaded (1914). In some implementations, step 1914 can be similar to step 1814 of FIG. 18. The first web can be pulled away from the second roller and the second web can be pulled away from the fourth roller, such that the substrate is separated from the first template and the second template. The substrate can be gripped by another holder. In some implementations, the first web is reversely drawn to be pulled away from the first roller and the second web is reversely drawn to be pulled away from the third roller. The substrate is retracted back by the same holder for feeding. In such a way, the substrate can be separated from the first template and the second template.

A number of implementations have been described. Nevertheless, it will be understood that various modifications may be made without departing from the spirit and scope of the techniques and devices described herein. Features shown in each of the implementations may be used independently or in combination with one another. Additional features and variations may be included in the implementations as well. Accordingly, other implementations are within the scope of the following claims.

What is claimed is:

1. A double-sided imprinting method comprising:

drawing a first web along first rollers and drawing a second web along second rollers, the first web comprising a first template and the second web comprising a second template;

aligning reference marks on the first web and the second web, such that the first template and the second template are aligned with each other;

drawing the first web along the first rollers in a first direction to expose the first template to a first dispenser and drawing the second web along the second rollers in a second direction to expose the second template to a second dispenser;

dispensing a first resist on the first template by the first dispenser and dispensing a second resist on the second template by the second dispenser;

drawing the first web along the first rollers in a direction reverse to the first direction and drawing the second web along the second rollers in a direction reverse to the second direction, such that the first template with the first resist and the second template with the second resist face to each other;

inserting a substrate between the first template with the first resist and the second template with the second resist;

curing the first resist and the second resist, such that the cured first resist has a first imprinted feature associated with the first template on a first side of the substrate and the cured second resist has a second imprinted feature associated with the second template on a second side of the substrate; and unloading the substrate with the first imprinted feature on the first side and the second imprinted feature on the second side.

2. The method of claim 1, further comprising:

after the aligning, clamping the first web and the second web at a location adjacent to the reference marks, such that the clamped first web and second web are moved with the first template and the second template aligned with each other; and after the curing, unclamping the first web and the second web, such that the substrate with the cured first resist and second resist is capable of passing through a gap between the first web and the second web.

3. The method of claim 2, wherein clamping the first web and the second web comprises:

actuating a chuck with a clamp, such that the chuck is chucked onto the first web and the clamp is clamped onto the second web.

4. The method of claim 3, wherein the chuck comprises a vacuum chuck configured to chuck onto the first web with vacuum.

5. The method of claim 3, wherein the chuck is moveable, and wherein the chuck and the clamp are moved together with the first web and the second web after the clamping.

6. The method of claim 5, wherein the chuck is positioned on a pair of guides, and each guide of the pair of guides is movable on a respective rail connected to a frame.

7. The method of claim 6, wherein aligning the reference marks on the first web and the second web comprises adjusting relative positions of the pair of guides on the respective rails in at least one of an x, y, or theta direction.

8. The method of claim 1, wherein the first rollers and the second rollers are arranged such that, after the inserting, the substrate is moved together with the first template and the second template, and the first resist is pressed onto the first side of the substrate and filled into a first imprinting feature on the first template and the second resist is pressed onto the second side of the substrate and filled into a second imprinting feature on the second template, and wherein the first imprinted feature on the first side of the substrate corresponds to the first imprinting feature on the first template, and the second imprinted feature on the second side of the substrate corresponds to the second imprinting feature on the second template.

9. The method of claim 1, further comprising:

moving a first squeegee roller on the first web to push the first template into the first resist, such that the first resist fills into a first imprinting feature on the first template; and moving a second squeegee roller on the second web to push the second template into the second resist, such that the second resist fills into a second imprinting feature on the second template, wherein the first imprinted feature on the first side of the substrate corresponds to the first imprinting feature on the first template, and the second imprinted feature on the second side of the substrate corresponds to the second imprinting feature on the second template.

10. The method of claim 9, wherein the first squeegee roller and the second squeegee roller are positioned opposite to each other when the first squeegee and the second squeegee are moved together.

11. The method of claim 1, wherein aligning reference marks on the first web and the second web comprises aligning a first one of the reference marks on the first web with a second one of the reference marks on the second web and aligning a third one of the reference marks on the first web with a fourth one of the reference marks on the second web.

12. The method of claim 11, further comprising:

after the reference marks on the first web and the second web are aligned, imprinting the substrate with a range of the first template defined by the first one of the reference marks and the third one of the reference marks.

13. The method of claim 1, wherein aligning the reference marks on the first web and the second web comprises moving a z-roller of the first rollers in at least one of x, y, or theta direction.

14. The method of claim 1, wherein aligning the reference marks on the first web and the second web comprises locating the reference marks by using at least one of a camera system or a laser system.

15. The method of claim 1, wherein the first rollers comprise at least one air turn roller floating the first web with air pressure.

16. The method of claim 1, wherein the first rollers comprise at least one air turn roller chucking the first web with vacuum.

17. The method of claim 1, wherein the first direction is a counter-clockwise direction, and the second direction is a clockwise direction.

18. The method of claim 1, wherein the first rollers comprise two first z-rollers arranged in a vertical direction, and the second rollers comprise two second z-rollers arranged in the vertical direction.

19. The method of claim 18, wherein dispensing the first resist on the first template by the first dispenser comprises dispensing the first resist on the first template when the first template is in a horizontal direction, and wherein dispensing the second resist on the second template by the second dispenser comprises dispensing the second resist on the second template when the second template is in the horizontal direction.

20. The method of claim 1, wherein inserting the substrate comprises inserting the substrate by a first holder along an inserting direction, and wherein unloading the substrate comprises one of:

moving the substrate with the first and second imprinted features along a direction reverse to the inserting direction and unloading the substrate with the first and second imprinted features by the first holder, and moving the substrate with the first and second imprinted features along the inserting direction and unloading the substrate with the first and second imprinted features by a second, different holder.

21. The method of claim 1, further comprising:

measuring a first tension of the first web by a first tension sensor; and measuring a second tension of the second web by a second tension sensor.

22. The method of claim 1, further comprising:

controlling a temperature of a chamber enclosing at least the first template and the second template.

23. The method of claim 1, further comprising:

locating a first one of the reference marks on the first web using a detecting system positioned before one of the first rollers, the detecting system comprising at least a camera system or a laser system.

24. The method of claim 1, further comprising:

locating a first one of the reference marks on the first web and a reference mark on the substrate;

aligning the first one of the reference marks on the first web with the reference mark on the substrate; and then clamping the first web and moving the first web such that the first template is moved over the substrate.

25. The method of claim 1, further comprising:

measuring an angle of the first web by one or more sensors arranged on an edge of the first web; and repositioning the substrate based on the measured angle of the first web.

* * * * *